US008592132B2

(12) United States Patent
Ichikawa et al.

(10) Patent No.: US 8,592,132 B2
(45) Date of Patent: *Nov. 26, 2013

(54) RESIST COMPOSITION AND METHOD FOR PRODUCING RESIST PATTERN

(75) Inventors: Koji Ichikawa, Osaka (JP); Satoshi Yamaguchi, Osaka (JP); Yuki Suzuki, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/404,238

(22) Filed: Feb. 24, 2012

(65) Prior Publication Data

US 2012/0219912 A1 Aug. 30, 2012

(30) Foreign Application Priority Data

Feb. 25, 2011 (JP) ................................ 2011-039452

(51) Int. Cl.
*G03F 7/004* (2006.01)
*G03F 7/38* (2006.01)
*G03F 7/039* (2006.01)

(52) U.S. Cl.
CPC ............ *G03F 7/0045* (2013.01); *G03F 7/0392* (2013.01); *G03F 7/38* (2013.01); *Y10S 430/108* (2013.01); *Y10S 430/111* (2013.01); *Y10S 430/122* (2013.01); *Y10S 430/123* (2013.01)
USPC ........ 430/270.1; 430/326; 430/330; 430/907; 430/910; 430/921; 430/922

(58) Field of Classification Search
CPC ........ G03F 7/0045; G03F 7/0392; G03F 7/38
USPC .............. 430/270.1, 326, 330, 905, 910, 907, 430/921, 922
See application file for complete search history.

(56) References Cited

U.S. PATENT DOCUMENTS 3,779,778 A 12/1973 Smith et al.
3,849,137 A 11/1974 Barzynski et al.
3,859,099 A * 1/1975 Petropoulos et al. ......... 430/190
4,556,737 A 12/1985 Koda et al.
4,576,902 A 3/1986 Saenger et al.
4,822,716 A 4/1989 Onishi et al.
4,857,437 A 8/1989 Banks et al.
5,017,453 A 5/1991 Onishi et al.
5,073,476 A 12/1991 Meier et al.
5,198,520 A 3/1993 Onishi et al.
5,260,410 A 11/1993 Schwalm
5,453,341 A 9/1995 Schwalm
5,663,035 A 9/1997 Masuda et al.
5,916,728 A 6/1999 Fukui et al.
5,928,818 A 7/1999 Mertesdorf et al.
6,040,112 A 3/2000 Yako et al.
6,800,422 B2 10/2004 Thackeray et al.
7,122,542 B2 10/2006 Singh et al.
7,452,879 B2 11/2008 Singh et al.
7,511,137 B2 3/2009 Li
7,560,466 B2 7/2009 Singh et al.
7,582,648 B2 9/2009 Singh et al.
7,754,714 B2 7/2010 Li et al.
7,981,589 B2 7/2011 Hasegawa et al.
7,981,989 B2 7/2011 Yan et al.
8,236,842 B2 8/2012 Yoshida et al.
2002/0058201 A1 5/2002 Miyaji et al.
2005/0113398 A1 5/2005 Argade et al.
2005/0192301 A1 9/2005 Li (Continued)

FOREIGN PATENT DOCUMENTS

DE 39 14 407 A1 10/1990
EP 0 126 712 A1 11/1984

(Continued)

OTHER PUBLICATIONS

Luis et al., "Non Concerted Pathways in the Generation of Dehydroarenes by Thermal Decomposition of Diaryliodonium Carboxylates," Tetrahedron, vol. 45, No. 19, 1989, pp. 6281-6296.
U.S. Notice of Allowance dated Dec. 26, 2012 for U.S. Appl. No. 13/404,871.
U.S. Notice of Allowance dated Dec. 28, 2012 for U.S. Appl. No. 13/404,054.
U.S. Notice of Allowance dated Jan. 7, 2013 for U.S. Appl. No. 13/404,123.
U.S. Office Action dated Dec. 20, 2012 for U.S. Appl. No. 13/404,049.

(Continued)

*Primary Examiner* — John Chu
(74) *Attorney, Agent, or Firm* — Birch, Stewart, Kolasch & Birch, LLP

(57) ABSTRACT

A resist composition includes (A1) a resin having a structural unit represented by the formula (I), (A2) a resin being insoluble or poorly soluble in alkali aqueous solution, but becoming soluble in an alkali aqueous solution by the action of an acid and (B) an acid generator having an acid-labile group.

(I)

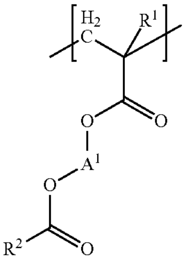

wherein $R^1$ represents a hydrogen atom or a methyl group; $A^1$ represents a $C_1$ to $C_6$ alkanediyl group; $R^2$ represents a $C_1$ to $C_{10}$ hydrocarbon group having a fluorine atom.

8 Claims, No Drawings

(56) References Cited

U.S. PATENT DOCUMENTS

| | | | |
|---|---|---|---|
| 2005/0209224 A1 | 9/2005 | Singh et al. | |
| 2005/0234049 A1 | 10/2005 | Singh et al. | |
| 2006/0035891 A1 | 2/2006 | Li et al. | |
| 2006/0167249 A1 | 7/2006 | Argade et al. | |
| 2006/0194982 A1 | 8/2006 | Harada et al. | |
| 2006/0199100 A1 | 9/2006 | Kanda | |
| 2007/0167439 A1 | 7/2007 | Singh et al. | |
| 2007/0179140 A1 | 8/2007 | Argade et al. | |
| 2007/0225495 A1 | 9/2007 | Singh et al. | |
| 2007/0231741 A1 | 10/2007 | Nishi et al. | |
| 2007/0299060 A1 | 12/2007 | Li et al. | |
| 2008/0009484 A1 | 1/2008 | Argade et al. | |
| 2008/0009494 A1 | 1/2008 | Li et al. | |
| 2008/0021020 A1 | 1/2008 | Argade et al. | |
| 2008/0027045 A1 | 1/2008 | Argade et al. | |
| 2008/0051412 A1 | 2/2008 | Argade et al. | |
| 2008/0193874 A1 | 8/2008 | Takata et al. | |
| 2008/0312438 A1 | 12/2008 | Singh et al. | |
| 2009/0137589 A1 | 5/2009 | Argade et al. | |
| 2009/0176981 A1 | 7/2009 | Argade et al. | |
| 2009/0202945 A1 | 8/2009 | Nakagawa et al. | |
| 2009/0318687 A1 | 12/2009 | Singh et al. | |
| 2010/0081088 A1 | 4/2010 | Kawaue et al. | |
| 2010/0136480 A1 | 6/2010 | Motoike et al. | |
| 2010/0203446 A1 | 8/2010 | Ichikawa et al. | |
| 2011/0039208 A1* | 2/2011 | Hata et al. | 430/285.1 |
| 2011/0053082 A1 | 3/2011 | Ichikawa et al. | |
| 2011/0171576 A1 | 7/2011 | Yamaguchi et al. | |
| 2011/0201823 A1 | 8/2011 | Yoshida et al. | |
| 2011/0266534 A1 | 11/2011 | Yan et al. | |
| 2011/0318688 A1 | 12/2011 | Hiraoka et al. | |
| 2012/0028188 A1 | 2/2012 | Ichikawa et al. | |
| 2012/0052443 A1* | 3/2012 | Masuyama et al. | 430/281.1 |
| 2012/0070778 A1 | 3/2012 | Ichikawa et al. | |
| 2012/0148954 A1 | 6/2012 | Fukumoro et al. | |
| 2012/0219899 A1 | 8/2012 | Ichikawa | |
| 2012/0219907 A1 | 8/2012 | Ichikawa et al. | |
| 2012/0219909 A1 | 8/2012 | Ichikawa et al. | |
| 2012/0237875 A1 | 9/2012 | Asano et al. | |
| 2012/0258405 A1 | 10/2012 | Ichikawa et al. | |
| 2012/0264059 A1 | 10/2012 | Ichikawa et al. | |

FOREIGN PATENT DOCUMENTS

| | | | |
|---|---|---|---|
| JP | 55-164824 | A | 12/1980 |
| JP | 62-69263 | A | 3/1987 |
| JP | 62-153853 | A | 7/1987 |
| JP | 63-26653 | A | 2/1988 |
| JP | 63-146029 | A | 6/1988 |
| JP | 63-146038 | A | 6/1988 |
| JP | 63-163452 | A | 7/1988 |
| JP | 11-52575 | A | 2/1999 |
| JP | 2002-131917 | A | 5/2002 |
| JP | 2002-226436 | A | 8/2002 |
| JP | 2006-257078 | A | 9/2006 |
| JP | 2006-276851 | A | 10/2006 |
| JP | 2007-119696 | A | 5/2007 |
| JP | 2007-514775 | A | 6/2007 |
| JP | 2009-19146 | A | 1/2009 |
| JP | 2009-86358 | A | 4/2009 |
| JP | 2010-152341 | A | 7/2010 |
| JP | 2010-197413 | A | 9/2010 |
| JP | 2010-204646 | A | 9/2010 |
| JP | 2012-8553 | A | 1/2012 |
| WO | WO 2007/116664 | A1 | 10/2007 |
| WO | WO 2011/024953 | A1 | 3/2011 |
| WO | WO 2011/034176 | A1 | 3/2011 |

OTHER PUBLICATIONS

U.S. Office Action dated Mar. 25, 2013 for U.S. Appl. No. 13/404,064.

U.S. Office Action dated May 9, 2013 for U.S. Appl. No. 13/405,068.

U.S. Office Action dated Nov. 28, 2012 for U.S. Appl. No. 13/404,140.

* cited by examiner

RESIST COMPOSITION AND METHOD FOR PRODUCING RESIST PATTERN

CROSS-REFERENCE TO RELATED APPLICATIONS

This application claims priority to Japanese Application No. 2011-39452 filed on Feb. 25, 2011. The entire disclosures of Japanese Application No. 2011-39452 is incorporated hereinto by reference.

BACKGROUND OF THE INVENTION

1. Field of the Invention

The present invention relates to a resist composition and a method for producing resist pattern.

2. Background Information

A resist composition which contains a resin having a polymer obtained by polymerizing a compound represented by the formula (u-A) and a compound represented by the formula (u-B), and a polymer obtained by polymerizing a compound represented by the formula (u-B), a compound represented by the formula (u-C) and a compound represented by the formula (u-D); an acid generator; and a solvent, is described in Patent document of JP-2010-197413A.

(u-A)

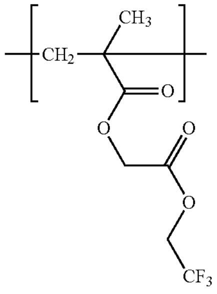

(u-B)

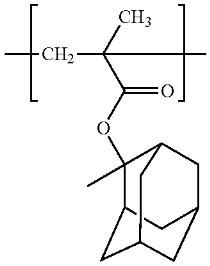

(u-C)

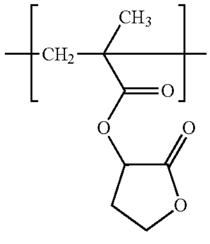

-continued (u-D)

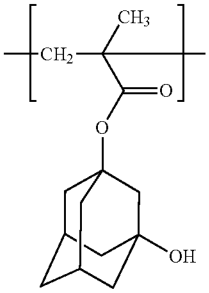

However, with the conventional resist composition, the pattern line edge roughness (LER) and resolution to be provided from the resist composition may be not always satisfied with, and number of the defect of the resist pattern to be produced from the resist composition may quite increase.

SUMMARY OF THE INVENTION

The present invention provides following inventions of <1> to <9>.

<1> A resist composition having;

(A1) a resin having a structural unit represented by the formula (I), (A2) a resin being insoluble or poorly soluble in alkali aqueous solution, but becoming soluble in an alkali aqueous solution by the action of an acid and (B) an acid generator having an acid-labile group;

(I)

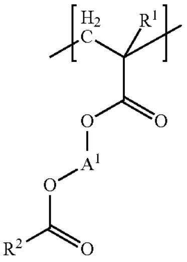

wherein $R^1$ represents a hydrogen atom or a methyl group;

$A^1$ represents a $C_1$ to $C_6$ alkanediyl group;

$R^2$ represents a $C_1$ to $C_{10}$ hydrocarbon group having a fluorine atom.

<2> The resist composition according to <1>, wherein the acid generator (B) is an acid generator represented by the formula (II-0);

(II-0)

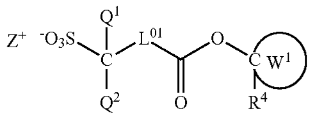

wherein $Q^1$ and $Q^2$ independently represent a fluorine atom or a $C_1$ to $C_6$ perfluoroalkyl group;

$L^{01}$ represents a single bond or a $C_1$ to $C_{20}$ divalent hydrocarbon group, and one or more $—CH_2—$ contained in the divalent hydrocarbon group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

<3> The resist composition according to <1>, wherein the acid generator (B) is an acid generator represented by the formula (II);

(II)

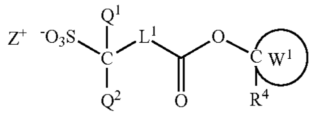

wherein $Q^1$ and $Q^2$ independently represent a fluorine atom or a $C_1$ to $C_6$ perfluoroalkyl group;

$L^1$ represents a single bond or an optionally substituted $C_1$ to $C_{10}$ alkanediyl group, and one or more $—CH_2—$ contained in the alkanediyl group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

<4> The resist composition according to any one of <1> to <3>, wherein $R^2$ in the formula (I) is a $C_1$ to $C_6$ fluorinated alkyl group.

<5> The resist composition according to any one of <1> to <4>, wherein A1 in the formula (I) is a $C_2$ to $C_4$ alkanediyl group.

<6> The resist composition according to <3>, wherein $L^1$ in the formula (II) is a single bond or $*—CO—O-L^{11}$, wherein $L^{11}$ represents a $C_1$ to $C_6$ alkanediyl group, * represents a bond to $—CQ^1Q^2$-.

<7> The resist composition according to any one of <1> to <6>, which further comprises a solvent.

<8> A method for producing resist pattern comprising steps of;

(1) applying the resist composition any one of <1> to <7> onto a substrate;

(2) drying the applied composition to form a composition layer;

(3) exposing the composition layer;

(4) heating the exposed composition layer, and (5) developing the heated composition layer.

<9> The resist composition according to any one of <1> to <7>, wherein $A^1$ in the formula (I) is an ethylene group.

DETAILED DESCRIPTION OF THE PREFERRED EMBODIMENTS

"(Meth)acrylic monomer" means at least one monomer having a structure of "$CH_2═CH—CO—$" or "$CH_2═C(CH_3)—CO—$", as well as "(meth)acrylate" and "(meth) acrylic acid" mean "at least one acrylate or methacrylate" and "at least one acrylic acid or methacrylic acid," respectively.

<Resist Composition>

The resist composition of the present invention contains;

(A) a resin (hereinafter may be referred to as "resin (A)"), and (B) an acid generator having an acid-labile group (hereinafter may be referred to as "acid generator (B)").

Further, the present resist composition preferably contains a solvent (hereinafter may be referred to as "solvent (E)") and/or an additive such as a basic compound (hereinafter may be referred to as "basic compound (C)") which is known as a quencher in this technical field, as needed.

<Resin (A)>

The resin (A) includes;

(A1) a resin having a structural unit represented by the formula (I), and (A2) a resin being insoluble or poorly soluble in alkali aqueous solution, but becoming soluble in an alkali aqueous solution by the action of an acid.

Also, the resin (A) may contain a structural unit other than the resin (A1) and resin (A2).

<Resin (A1)>

The resin (A1) has a structural unit represented by the formula (I) (hereinafter may be referred to as "structural unit (I)").

(I)

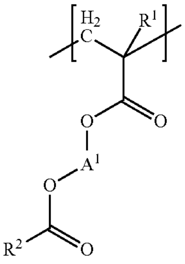

wherein $R^1$ represents a hydrogen atom or a methyl group;

$A^1$ represents a $C_1$ to $C_6$ alkanediyl group;

$R^2$ represents a $C_1$ to $C_{10}$ hydrocarbon group having a fluorine atom.

In the formula (I), examples of the alkanediyl group of $A^1$ include a chain alkanediyl group such as methylene, ethylene, propane-1,3-diyl, propane-1,2-diyl, butane-1,4-diyl, pentane-1,5-diyl, hexane-1,6-diyl; a branched alkanediyl group such as 1-methylpropane-1,3-diyl, 2-methylpropane-1,3-diyl, 2-methylpropane-1,2-diyl, 1-methylbutane-1,4-diyl, 2-methylbutane-1,4-diyl groups.

The hydrocarbon group $R^2$ may be any of an aliphatic hydrocarbon group, an aromatic hydrocarbon group and a combination of two or more such groups. The aliphatic hydrocarbon group may be any of a chain and cyclic aliphatic hydrocarbon group, and a combination of two or more such groups. The aliphatic hydrocarbon group is preferably an alkyl group and an alicyclic group.

Examples of the alkyl group include methyl, ethyl, n-propyl, iso-propyl, n-butyl, sec-butyl, tert-butyl, n-pentyl, iso-pentyl, tert-pentyl, neo-pentyl, hexyl, octyl and 2-ethylhexyl groups.

The alicyclic hydrocarbon group may be either monocyclic or polycyclic hydrocarbon group. Examples of the monocyclic alicyclic hydrocarbon group include cyclopropyl, cyclobutyl, cyclopentyl, cyclohexyl, methylcyclohexyl, dimethylcyclohexyl, cycloheptyl, cyclooctyl and cyclodecyl groups. Examples of the polycyclic alicyclic hydrocarbon group include decahydronaphtyl, adamantyl, 2-alkyladamantane-2-yl, 1-(adamantane-1-yl)alkane-1-yl, norbornyl, methylnorbornyl and isobornyl groups.

The hydrocarbon group having a fluorine atom of $R^2$ is preferably an alkyl group having a fluorine atom and an alicyclic hydrocarbon group having a fluorine atom.

Examples of the alkyl group having a fluorine atom include a fluorinated alkyl group such as difluoromethyl, trifluoromethyl, 1,1-difluoroethyl, 2,2-difluoroethyl, 1,1,1-trifluoroethyl, 2,2,2-trifluoroethyl, perfluoroethyl, 1,1,2,2-tetrafluoropropyl, 1,1,1,2,2-pentafluoropropyl, 1,1,2,2,3,3-hexafluoropropyl, perfluoroethylmethyl, 1-(trifluoromethyl)-1,2,2,2-tetratrifluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(perfluoropropyl)ethyl, 1,1,2,2,3,3,4,4-octafluoropentyl, 1,1,1,2,2,3,3,4,4-nonafluoropentyl, perfluoropentyl, 1,1,2,2,3,3,4,4,5,5-decafluoropentyl, 1,1-bis(trifluoromethyl)-2,2,3,3,3-pentafluoropropyl, 1,1,1,2,2,3,3,4,4-nonafluoropentyl, perfluoropentyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl, perfluorohexyl, perfluoroheptyl and perfluorooctyl groups.

Examples of the alicyclic haydrocarbon group having a fluorine atom include a fluorinated cycloalkyl group such as perfluoricyclohexyl and perfluoroadamanthyl groups.

$A^1$ in the formula (I) is preferably a $C_2$ to $C_4$ alkanediyl group, and more preferably an ethylene group.

$R^2$ is preferably a fluorinated alkyl group, and more preferably a $C_1$ to $C_6$ fluorinated alkyl group.

Specific examples of the structural units (I) include as follows.

(I-1)

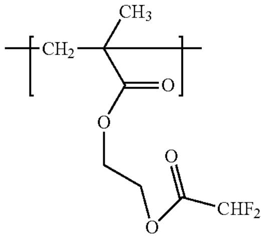

(I-2)

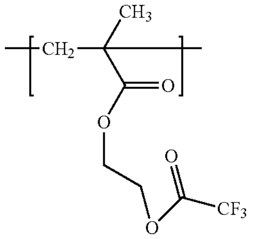

(I-3)

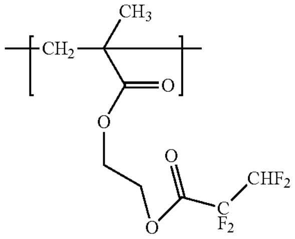

(I-4)

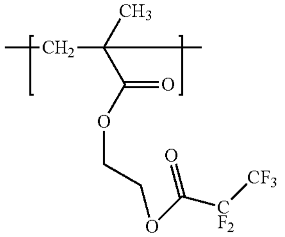

-continued (I-5)

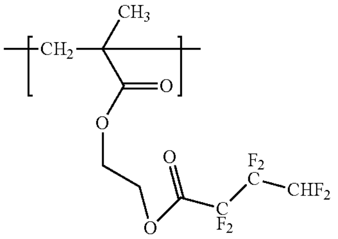

(I-6)

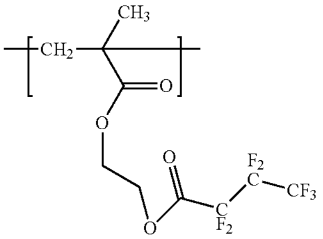

(I-7)

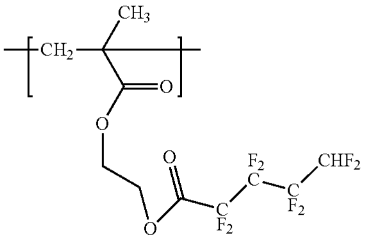

(I-8)

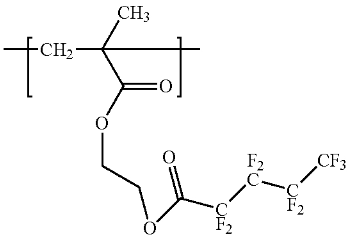

(I-9)

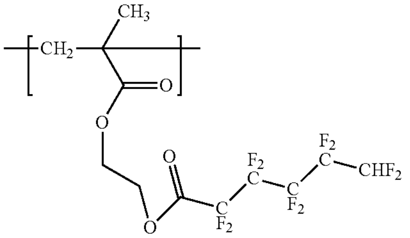

(I-10)

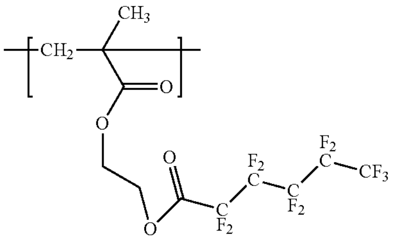

-continued (I-11)

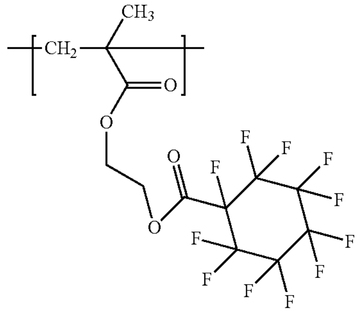

Also, examples of the structural units (I) include structural units in which a methyl group corresponding to $R^1$ in the structural units represented by the above is replaced by a hydrogen atom.

The structural unit (I) is derived from a compound represented by the formula (I'), hereinafter may be referred to as "compound (I')".

(I')

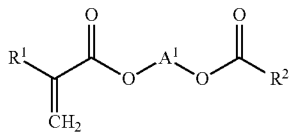

wherein $A^1$, $R^1$ and $R^2$ have the same definition of the above.

The compound (I') can be produced by a method below.

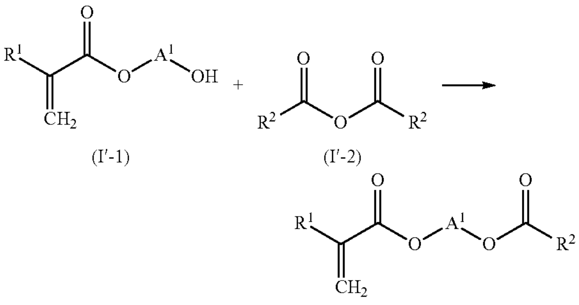

(I'-1) (I'-2) (I')

wherein $A^1$, $R^1$ and $R^2$ have the same definition of the above.

The compound (I') can be obtained by reacting a compound represented by the formula (I'-1) with a compound represented by the formula (I'-2) in presence of a basic catalyst in a solvent. Preferred examples of the basic catalyst include pyridine. Preferred examples of the solvent include tetrahydrofuran.

As the compound represented by the formula (I'-1), a marketed product may be used. The hydroxyethyl methacrylate can be used as a marketed product.

The compound represented by the formula (I'-2) can be obtained by converting corresponding carboxylic acid, depending on the kinds of $R^2$, into an anhydride. The heptafluoro butyric anhydride can be used as a marketed product.

The resin (A1) may include a structural unit other than the structural unit (I).

Examples of the structural unit other than the structural unit (I) include a structural unit derived from a monomer having an acid labile group described below (hereinafter may be referred to as "acid labile monomer (a1)"), a structural unit derived from a monomer not having an acid labile group described below (hereinafter may be referred to as "acid stable monomer"), a structural unit derived from a known monomer in this field, a structural unit represented by the formula (IIIA) described below. Among these, a structural unit represented by the formula (IIIA) is preferable.

(IIIA)

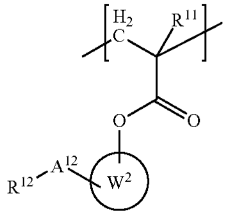

wherein $R^{11}$ represents a hydrogen atom or a methyl group;

ring $W^2$ represents a $C_6$ to $C_{10}$ hydrocarbon ring;

* $A^{12}$ represents —O—, *—CO—O— or *—O—CO—, * represents a bond to ring $W^2$;

$R^{12}$ represents a $C_1$ to $C_6$ hydrocarbon group having a fluorine atom.

The hydrocarbon ring of $W^2$ may be an alicyclic hydrocarbon ring, and preferably a saturated alicyclic hydrocarbon ring.

Examples of the saturated alicyclic hydrocarbon ring include a ring below.

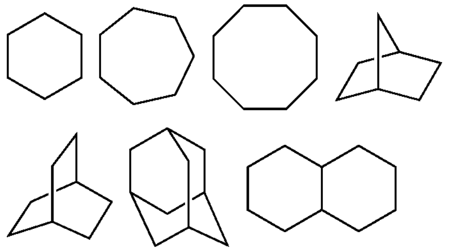

As the ring $W^2$, an adamantane ring and cyclohexane ring are preferable, and an adamantane ring is more preferable.

Examples of the $R^{12}$ include a group below.

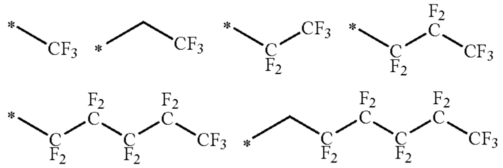

Examples of the structural unit represented by the formula (IIIA) include structural units below.

(IIIA-1)

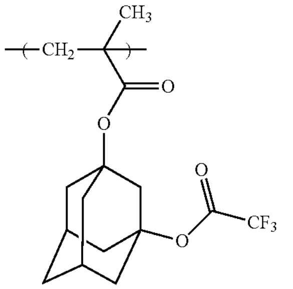

(IIIA-2)

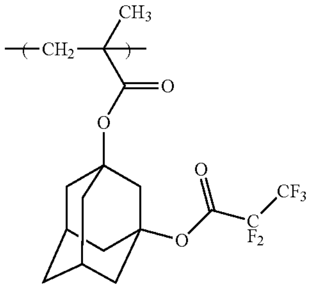

(IIIA-3)

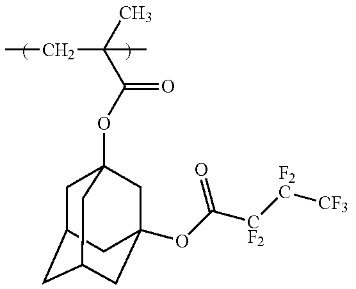

(IIIA-4)

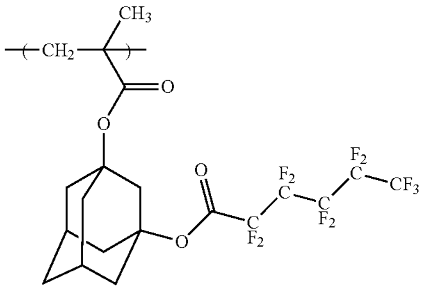

(IIIA-5)

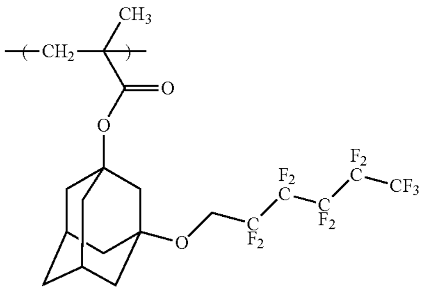

-continued (IIIA-6)

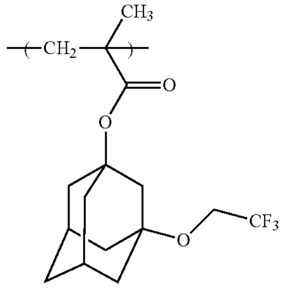

(IIIA-7)

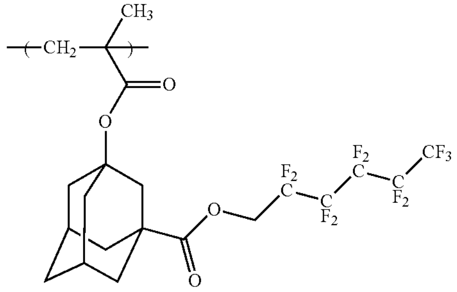

(IIIA-8)

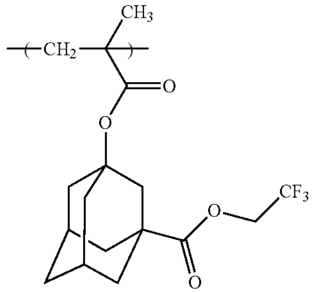

Also, examples of the structural units (IIIA) include structural units in which a methyl group corresponding to $R^{11}$ in the structural units represented by the above is replaced by a hydrogen atom.

Among these, the structural unit (IIIA-1) and the structural unit (IIIA-1) in which a methyl group corresponding to $R^{11}$ in the structural units represented by the above is replaced by a hydrogen atom are preferable.

The proportion of the structural unit (I) in the resin (A1) is generally 5 to 100 mol %, preferably 10 to 100 mol %, more preferably 50 to 100 mol %, still more preferably 80 to 100 mol %, and, in particular, preferably almost 100 mol %, with respect to the total structural units (100 mol %) constituting the resin (A1).

Within the proportion of the structural unit (I), it is possible to produce a resist pattern with excellent line edge roughness and few defects.

When the resin (A1) contains the structural unit (IIIA), the proportion thereof in the resin (A1) is generally 1 to 95 mol %, preferably 2 to 80 mol %, and more preferably 5 to 70 mol %, with respect to the total structural units (100 mol %) constituting the resin (A1).

For achieving the proportion of the structural unit (I) and/or the structural unit (IIIA) in the resin (A1) within the above range, the amount of the compound (I') and/or a monomer giving the structural unit (IIIA) to be used can be adjusted with respect to the total amount of the monomer to be used when the resin (A1) is produced (the same shall apply hereinafter for corresponding adjustment of the proportion).

The resin (A1) can be produced by a known polymerization method, for example, radical polymerization method, using at least one of the compound (I') and/or at least one of the monomer giving the structural unit (IIIA), and optionally at least one of the acid labile monomer (a1), least one of the acid stable monomer and/or at least one of a known compound.

The weight average molecular weight of the resin (A) is preferably 5,000 or more (more preferably 7,000 or more, and still more preferably 10,000 or more), and 80,000 or less (more preferably 50,000 or less, and still more preferably 30,000 or less).

The weight average molecular weight is a value determined by gel permeation chromatography using polystyrene as the standard product. The detailed condition of this analysis is described in Examples.

<Resin (A2)>

The resin (A2) is a resin having properties which is insoluble or poorly soluble in alkali aqueous solution, but becomes soluble in an alkali aqueous solution by the action of an acid. Here "a resin having properties which is insoluble or poorly soluble in alkali aqueous solution, but becomes soluble in an alkali aqueous solution by the action of an acid" means a resin that is insoluble or poorly soluble in aqueous alkali solution before contact with the acid, and becomes soluble in aqueous alkali solution after contact with an acid.

Therefore, the resin (A2) is preferably a resin having at least one of structural unit derived from an acid labile monomer (a1) described below.

Also, the resin (A2) may include a structural unit other than the structural unit having the acid labile group as long as the resin (A2) has above properties.

Examples of the structural unit other than the structural unit having the acid labile group include a structural unit derived from the acid stable monomer, the structural unit derived from a known monomer in this field, the structural units represented by the formula (I) and the formula (IIIA) described above.

The resin (A2) may be a different resin from the resin (A1), or a resin which has the structural unit represented by the formula (I) and/or the formula (IIIA) described above so long as the resin (A2) has properties which is insoluble or poorly soluble in alkali aqueous solution, but becomes soluble in an alkali aqueous solution by the action of an acid.

<Acid Labile Monomer (a1)>

The "acid labile group" means a group which has an elimination group and in which the elimination group is detached by contacting with an acid resulting in forming a hydrophilic group such as a hydroxy or carboxy group. Examples of the acid labile group include a group represented by the formula (1) and a group represented by the formula (2). Hereinafter a group represented by the formula (1) may refer to as an "acid labile group (1)", and a group represented by the formula (2) may refer to as an "acid labile group (2)".

(1)

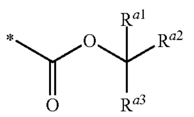

wherein $R^{a1}$ to $R^{a3}$ independently represent a $C_1$ to $C_8$ alkyl group or a $C_3$ to $C_{20}$ alicyclic hydrocarbon group, or $R^{a1}$ and $R^{a2}$ may be bonded together to form a $C_2$ to $C_{20}$ divalent hydrocarbon group, * represents a bond. In particular, the bond here represents a bonding site (the similar shall apply hereinafter for "bond").

(2)

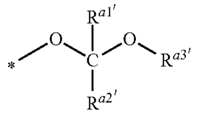

wherein $R^{a1'}$ and $R^{a2'}$ independently represent a hydrogen atom or a $C_1$ to $C_{12}$ hydrocarbon group, $R^{a3'}$ represents a $C_1$ to $C_{20}$ hydrocarbon group, or $R^{a2'}$ and $R^{a3'}$ may be bonded together to form a divalent $C_2$ to $C_{20}$ hydrocarbon group, and one or more —$CH_2$— contained in the hydrocarbon group or the divalent hydrocarbon group may be replaced by —O— or —S—, * represents a bond.

Examples of the alkyl group of $R^{a1}$ to $R^{a3}$ include methyl, ethyl, propyl, butyl, pentyl and hexyl groups.

Examples of the alicyclic hydrocarbon group of $R^{a1}$ to $R^{a3}$ include monocyclic groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo [2.2.1]hexyl), and methyl norbornyl groups as well as groups below.

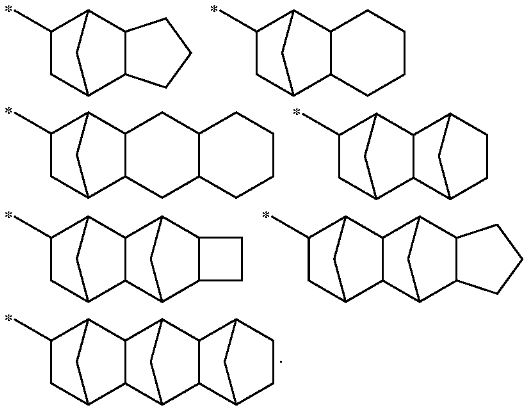

The alicyclic hydrocarbon group of $R^{a1}$ and $R^{a2}$ preferably has 3 to 16 carbon atoms.

When $R^{a1}$ and $R^{a2}$ is bonded together to form a $C_2$ to $C_{20}$ hydrocarbon group, examples of the group-C($R^{a1}$)($R^{a2}$)($R^{a3}$) include groups below. The divalent hydrocarbon group preferably has 3 to 12 carbon atoms.

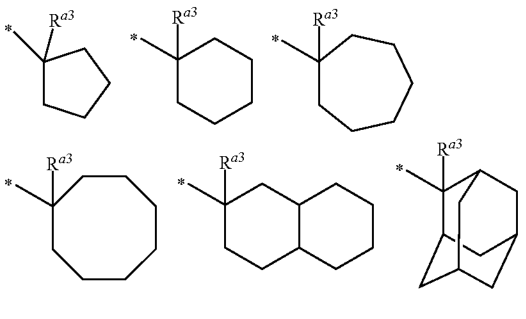

-continued

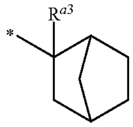

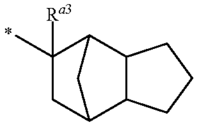

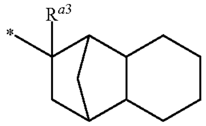

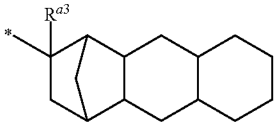

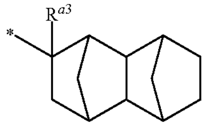

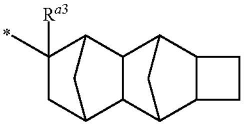

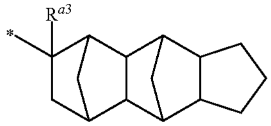

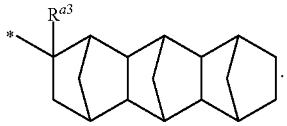

Specific examples of the acid labile group (1) include, for example, 1,1-dialkylalkoxycarbonyl group (a group in which $R^{a1}$ to $R^{a3}$ are alkyl groups, preferably tert-butoxycarbonyl group, in the formula (I)), 2-alkyladamantane-2-yloxycarbonyl group (a group in which $R^{a1}$, $R^{a2}$ and a carbon atom form adamantyl group, and $R^{a3}$ is alkyl group, in the formula (1)), and 1-(adamantine-1-yl)-1-alkylalkoxycarbonyl group (a group in which $R^{a1}$ and $R^{a2}$ are alkyl group, and $R^{a3}$ is adamantyl group, in the formula (1)).

The hydrocarbon group of $R^{a1'}$ to $R^{a3'}$ includes any of an alkyl group, an alicyclic hydrocarbon group and an aromatic hydrocarbon group.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent hydrocarbon group which is formed by bonding with $R^{a2'}$ and $R^{a3'}$ include groups in which a hydrogen atom in the hydrocarbon group of R2 of the formula (I) is removed.

At least one of $R^{a1'}$ and $R^{a2'}$ is preferably a hydrogen atom.

Specific examples of the acid labile group (2) include a group below.

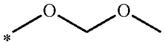

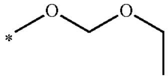

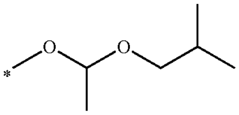

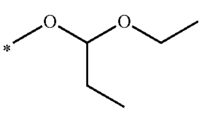

-continued

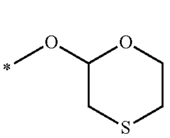

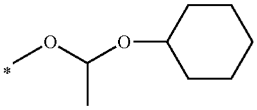

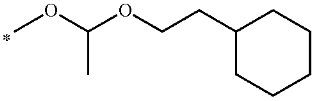

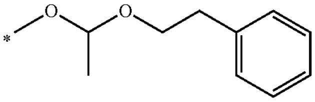

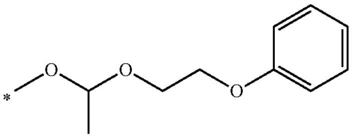

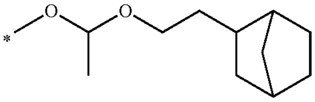

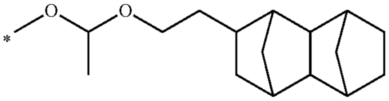

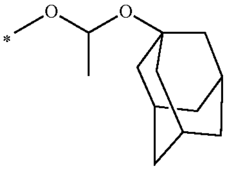

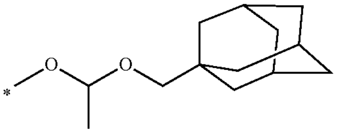

The acid labile monomer (a1) is preferably a monomer having an acid labile group and a carbon-carbon double bond, and more preferably a (meth)acrylic monomer having the acid labile group.

Among the (meth) acrylic monomer having an acid labile group, it is preferably a monomer having a $C_5$ to $C_{20}$ alicyclic hydrocarbon group. When a resin which can be obtained by polymerizing monomers having bulky structure such as the alicyclic hydrocarbon group is used, the resist composition having excellent resolution tends to be obtained during the production of a resist pattern.

Examples of the (meth)acrylic monomer having the acid labile group and a carbon-carbon double bond preferably include a monomer represented by the formula (a1-1) and a monomer represented by the formula (a1-2), below (hereinafter may be referred to as a "monomer (a1-1)" and a "monomer (a1-2)"). These may be used as a single monomer or as a combination of two or more monomers. The monomer (a1-1) induces a structural unit represented by the formula (a1-1), and the monomer (a1-2) induces a structural unit represented by the formula (a1-2) as described below (hereinafter may be referred to as the "structural unit (a1-1)" and the "structural unit (a1-2)").

(a1-1)

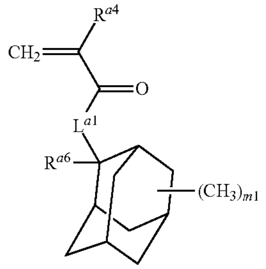

(a1-2)

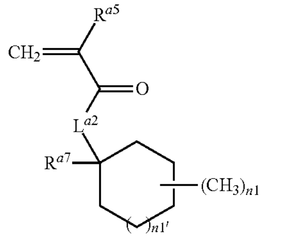

(a1-1)

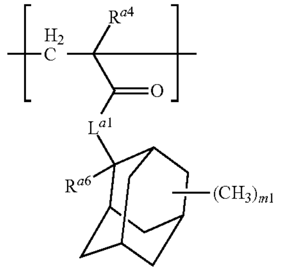

(a1-2)

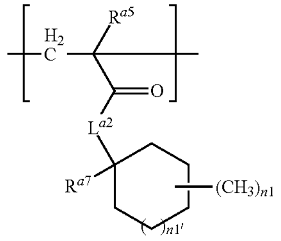

wherein $L^{a1}$ and $L^{a2}$ independently represent *—O— or *—O—$(CH_2)_{k1}$—CO—O—, k1 represents an integer of 1 to 7, * represents a bond to the carbonyl group;

$R^{a4}$ and $R^{a5}$ independently represent a hydrogen atom or a methyl group;

$R^{a6}$ and $R^{a7}$ independently represent a $C_1$ to $C_8$ alkyl group or a $C_3$ to $C_{10}$ alicyclic hydrocarbon group;

m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably *—O— or *—O—$(CH_2)_{k1'}$—CO—O— and more preferably *—O—, here k1' represents an integer of 1 to 4 and more preferably 1.

$R^{a4}$ and $R^{a5}$ are preferably a methyl group.

Examples of the alkyl group of $R^{a6}$ and $R^{a7}$ include methyl, ethyl, propyl, butyl, pentyl, hexyl and octyl groups. Among these, the alkyl group of $R^{a6}$ and $R^{a7}$ is preferably a $C_1$ to $C_6$ alkyl group, Examples of the alicyclic group of $R^{a6}$ and $R^{a7}$ include monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo [2.2.1]hexyl), and methyl norbornyl groups as well as groups below. Among these, the alicyclic group of $R^{a6}$ and $R^{a7}$ is preferably a $C_3$ to $C_8$ alicyclic hydrocarbon group, and more preferably a $C_3$ to $C_6$ alicyclic hydrocarbon group.

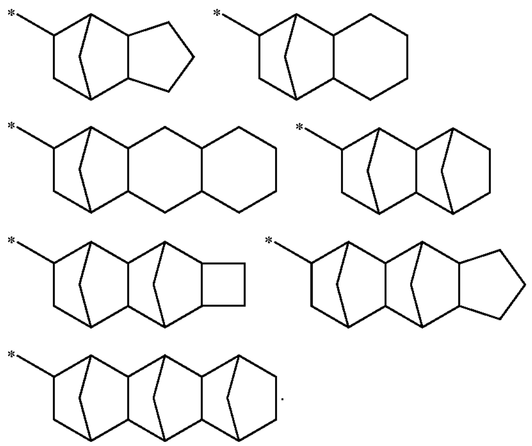

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the monomer (a1-1) include monomers described in JP 2010-204646A. Among these, the monomers are preferably monomers represented by the formula (a1-1-1) to the formula (a1-1-8), and more preferably monomers represented by the formula (a1-1-1) to the formula (a1-1-4) below.

(a1-1-1)

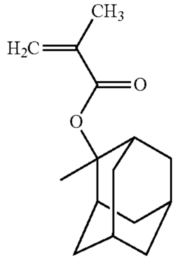

(a1-1-2)

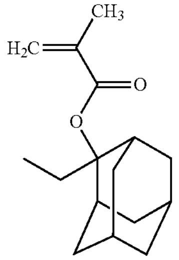

-continued (a1-1-3)

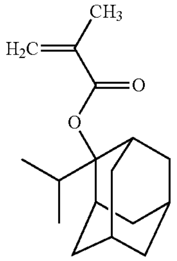

(a1-1-4)

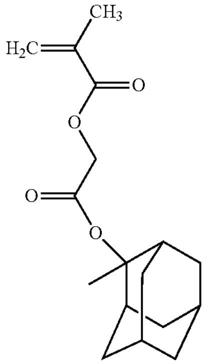

(a1-1-5)

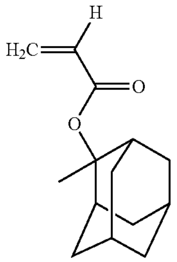

(a1-1-6)

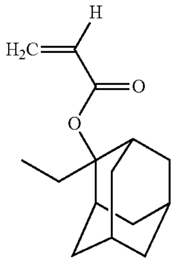

(a1-1-7)

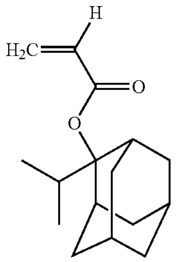

-continued (a1-1-8)

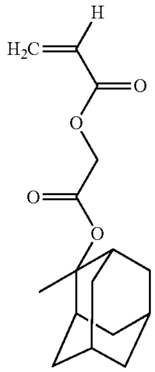

Examples of the monomer (a1-2) include 1-ethylcyclopentane-1-yl (meth)acrylate, 1-ethylcyclohexane-1-yl(meth)acrylate, 1-ethylcycloheptane-1-yl(meth)acrylate, 1-methylcyclopentane-1-yl (meth)acrylate and 1-isopropylcyclopentane-1-yl(meth)acrylate. Among these, the monomers are preferably monomers represented by the formula (a1-2-1) to the formula (a1-2-6), and more preferably monomers represented by the formula (a1-2-3) and the formula (a1-2-4), and still more preferably monomer represented by the formula (a1-2-3) below.

(a1-2-1)

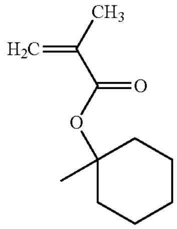

(a1-2-2)

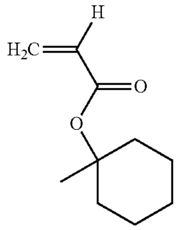

(a1-2-3)

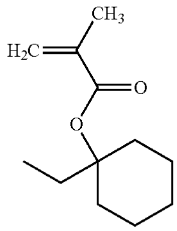

-continued (a1-2-4)

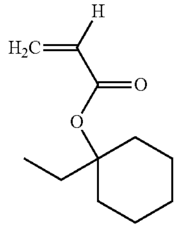

(a1-2-5)

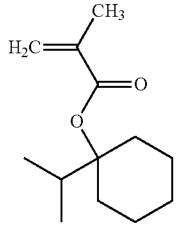

(a1-2-6)

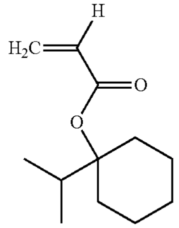

When the resin (A2) contains the structural unit derived from the monomer (a1-1) and/or the structural unit derived from the monomer (a1-2), the total proportion thereof is generally 10 to 95 mol %, preferably 15 to 90 mol %, more preferably 20 to 85 mol %, with respect to the total structural units (100 mol %) of the resin (A2).

Examples of a monomer having an acid-labile group (2) and a carbon-carbon double bond include a monomer represented by the formula (a1-5). Such monomer may be hereinafter referred to as "monomer (a1-5)". When the resin (A2) has the structural unit derived from the monomer (a1-5), a resist pattern tends to be obtained with less defects.

(a1-5)

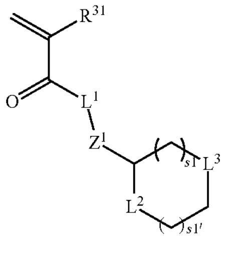

wherein $R^{31}$ represents a hydrogen atom, a halogen atom or a $C_1$ to $C_6$ alkyl group that optionally has a halogen atom;

$L^1$, $L^2$ and $L^3$ independently represent *—O—, *—S— or *—O—$(CH_2)_{k1}$—CO—O—, k1 represents an integer of 1 to 7, * represents a bond to the carbonyl group (—CO—);

s1 represents an integer of 0 to 4;

s1' represents an integer of 0 to 4;

$Z^1$ represents a single bond or a $C_1$ to $C_6$ alkanediyl group, and one or more —$CH_2$— contained in the alkanediyl group may be replaced by —O— or —CO—.

In the formula (a1-5), $R^{31}$ is preferably a hydrogen atom, a methyl group or trifluoromethyl group;

$L^1$ is preferably —O—;

$L^2$ and $L^3$ are independently preferably *—O— or *—S—, and more preferably —O— for one and —S— for another;

s1 is preferably 1;

s1' is preferably an integer of 0 to 2;

$Z^1$ is preferably a single bond or —$CH_2$—CO—O—.

Examples of the compound represented by the formula (a1-5) include compounds below.

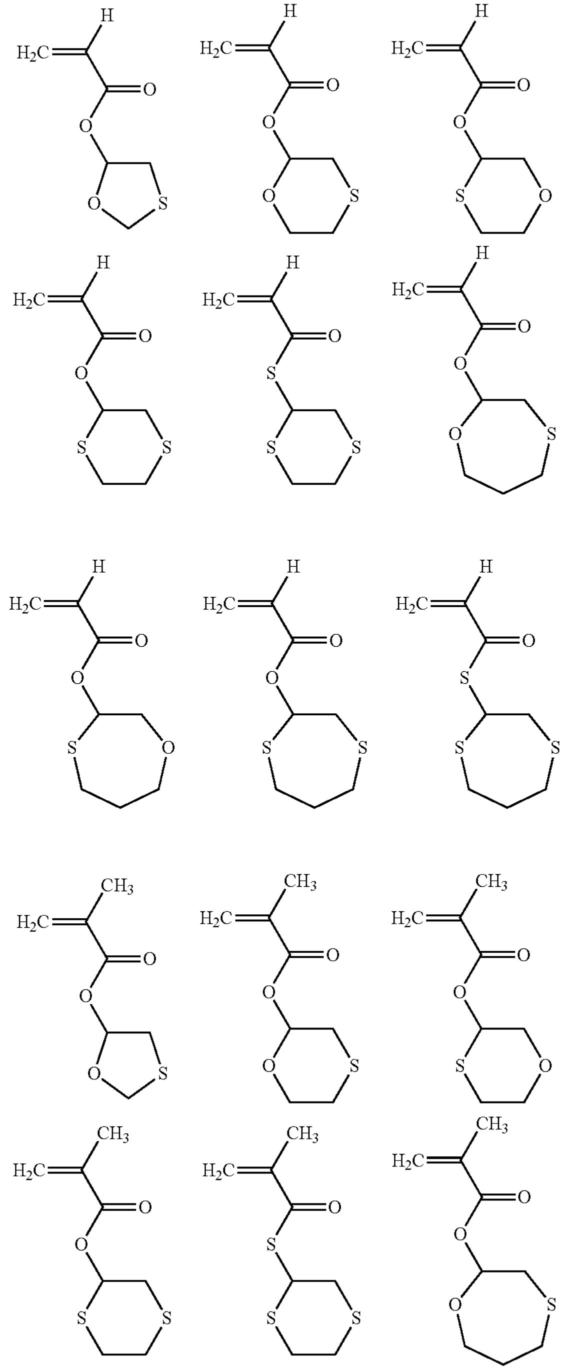

-continued

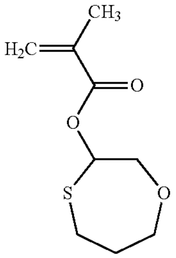
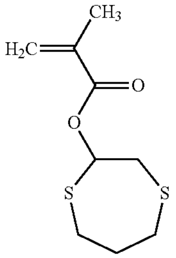
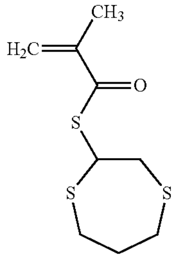
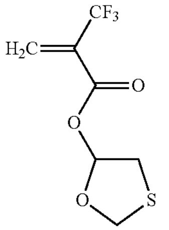
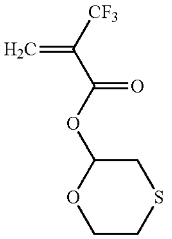
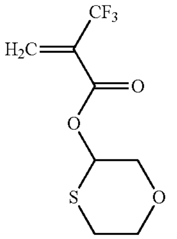
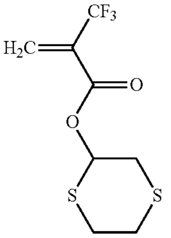
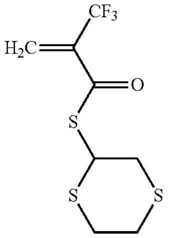
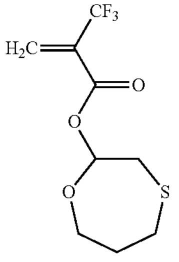
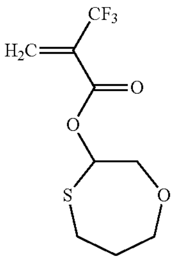
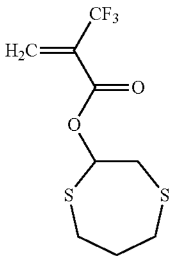
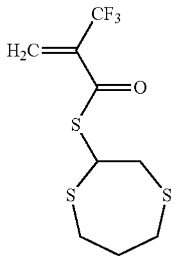
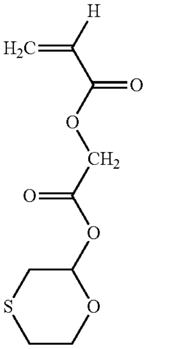
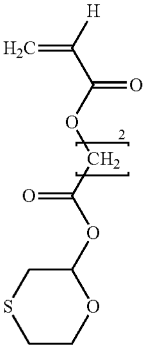
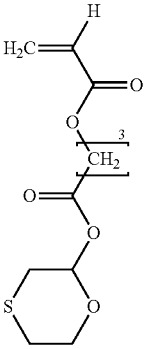
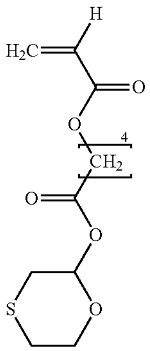
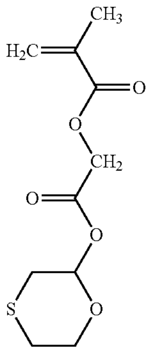
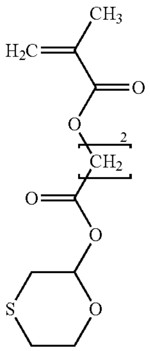

-continued

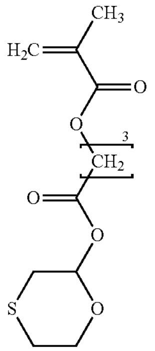
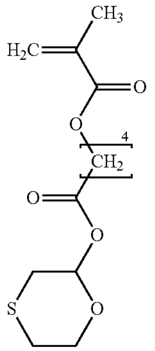
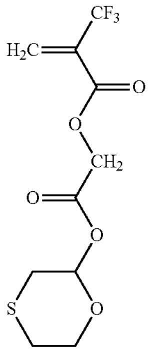
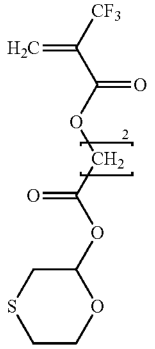
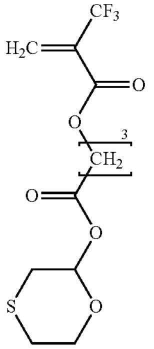
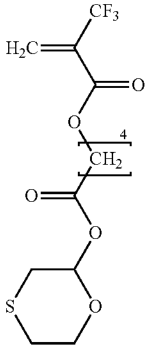

When the resin (A2) contains the structural unit derived from the monomer represented by the formula (a1-5), the proportion thereof is generally 1 to 50 mol %, preferably 3 to 45 mol %, and more preferably 5 to 40 mol %, with respect to the total structural units (100 mol %) constituting the resin (A2).

<Acid Stable Monomer>

As the acid stable monomer, a monomer having a hydroxy group or a lactone ring is preferable. When a resin containing the structural unit derived from a monomer having hydroxy group (hereinafter such acid stable monomer may be referred to as "acid stable monomer (a2)") or a acid stable monomer having a lactone ring (hereinafter such acid stable monomer may be referred to as "acid stable monomer (a3)") is used, the adhesiveness of resist to a substrate and resolution of resist tend to be improved.

<Acid Stable Monomer (a2)>

The acid stable monomer (a2), which has the hydroxy group, is preferably selected depending on the kinds of an exposure light source at producing the resist pattern.

When KrF excimer laser lithography (248 nm), or high-energy irradiation such as electron beam or EUV light is used for the resist composition, using the acid stable monomer having a phenolic hydroxy group such as hydroxystyrene as the acid stable monomer (a2) is preferable.

When ArF excimer laser lithography (193 nm), i.e., short wavelength excimer laser lithography is used, using the acid stable monomer having a hydroxy adamantyl group represented by the formula (a2-1) as the acid stable monomer (a2) is preferable.

The acid stable monomer (a2) having the hydroxy group may be used as a single monomer or as a combination of two or more monomers.

Examples of the acid stable monomer having hydroxy adamantyl include the monomer represented by the formula (a2-1).

(a2-1)

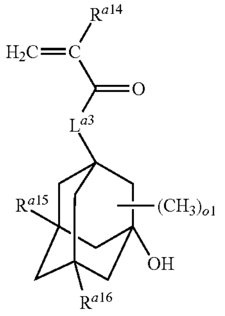

wherein Lai represents —O— or *—O—$(CH_2)_{k2}$—CO—O—;

k2 represents an integer of 1 to 7;

* represents a bind to —CO—;

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably —O—, —O—$(CH_2)_{f1}$—CO—O—, here f1 represents an integer of 1 to 4, and more preferably —O—.

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid stable monomer (a2-1) include monomers described in JP 2010-204646A. Among these, the monomers are preferably monomers represented by the formula (a2-1-1) to the formula (a2-1-6), more preferably monomers represented by the formula (a2-1-1) to the formula (a2-1-4), and still more preferably monomers represented by the formula (a2-1-1) and the formula (a2-1-3) below.

(a2-1-1)

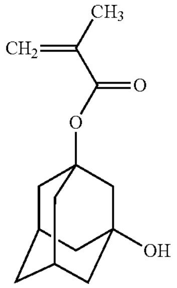

(a2-1-2)

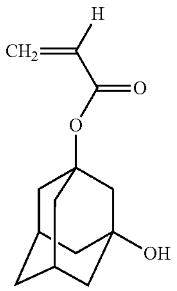

-continued (a2-1-3)

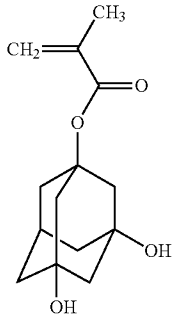

(a2-1-4)

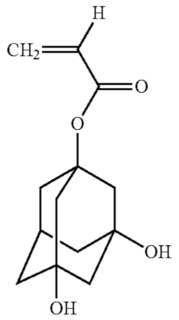

(a2-1-5)

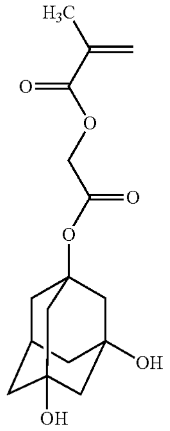

(a2-1-6)

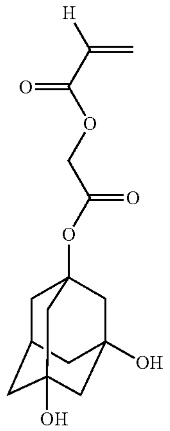

When the resin (A2) contains the acid stable structural unit derived from the monomer represented by the formula (a2-1), the proportion thereof is generally 3 to 40 mol %, preferably 5 to 35 mol %, more preferably 5 to 30 mol %, and still more preferably 5 to 20 mol %, with respect to the total structural units (100 mol %) constituting the resin (A2).

<Acid Stable Monomer (a3)>

The lactone ring included in the acid stable monomer (a3) may be a monocyclic compound such as β-propiolactone ring, γ-butyrolactone, δ-valerolactone, or a condensed ring with monocyclic lactone ring and other ring. Among these, γ-butyrolactone, and condensed ring with γ-butyrolactone and other ring are preferable.

Examples of the acid stable monomer (a3) having the lactone ring include monomers represented by the formula (a3-1), the formula (a3-2) and the formula (a3-3). These monomers may be used as a single monomer or as a combination of two or more monomers.

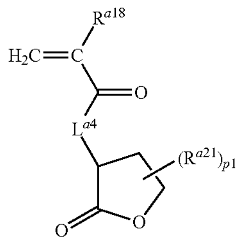

(a3-1)

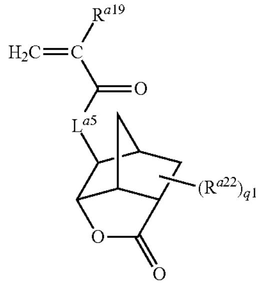

(a3-2)

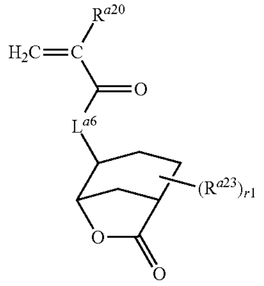

(a3-3)

wherein Lao to Lab independently represent —O— or *—O—$(CH_2)_{k3}$—CO—O—;

k3 represents an integer of 1 to 7, * represents a bind to —CO—;

$R^{a18}$ to $R^{a20}$ independently represent a hydrogen atom or a methyl group;

$R^{a21}$ in each occurrence represents a $C_1$ to $C_4$ alkyl group;

p1 represents an integer of 0 to 5;

$R^{a22}$ to $R^{a23}$ in each occurrence independently represent a carboxyl group, cyano group, and a $C_1$ to $C_4$ alkyl group;

q1 and r1 independently represent an integer of 0 to 3.

In the formulae (a3-1) to (a3-3), $L^{a4}$ to $L^{a6}$ include the same group as described in $L^{a3}$ above, and are independently preferably —O—, *—O—$(CH_2)_{k3'}$—CO—O—, here k3' represents an integer of 1 to 4 (preferably 1), and more preferably —O—;

$R^{a18}$ to $R^{a21}$ are independently preferably a methyl group.

$R^{a22}$ and $R^{a23}$ are independently preferably a carboxyl group, cyano group or methyl group;

p1 to r1 are independently preferably an integer of 0 to 2, and more preferably an integer of 0 or 1.

Examples of the monomer (a3) include monomers described in JP 2010-204646A. Among these, the monomers are preferably monomers represented by the formula (a3-1-1) to the formula (a3-1-4), the formula (a3-2-1) to the formula (a3-2-4), the formula (a3-3-1) to the formula (a3-3-4), more preferably monomers represented by the formula (a3-1-1) to the formula (a3-1-2), the formula (a3-2-3) to the formula (a3-2-4), and still more preferably monomers represented by the formula (a3-1-1) and the formula (a3-2-3) below.

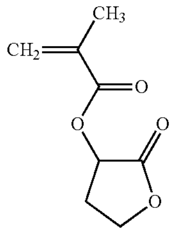

(a3-1-1)

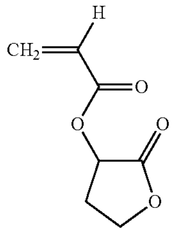

(a3-1-2)

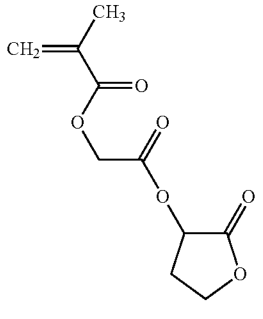

(a3-1-3)

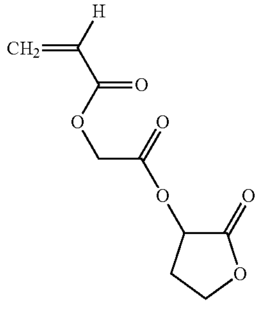

(a3-1-4)

-continued (a3-2-1)

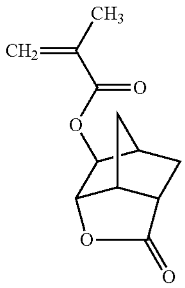

(a3-2-2)

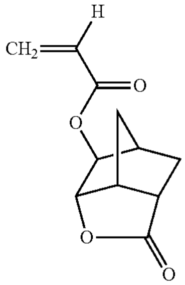

(a3-2-3)

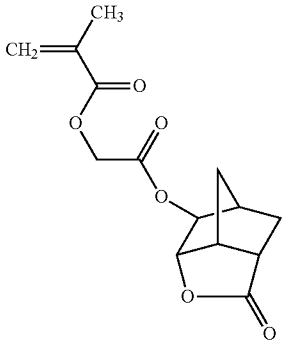

(a3-2-4)

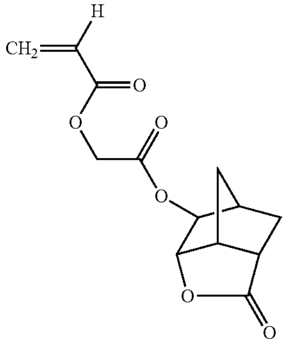

(a3-3-1)

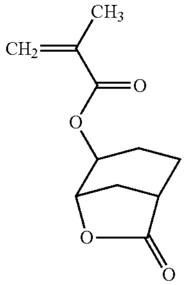

-continued (a3-3-2)

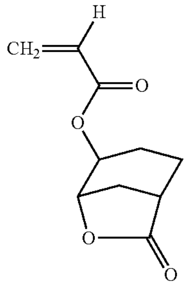

(a3-3-3)

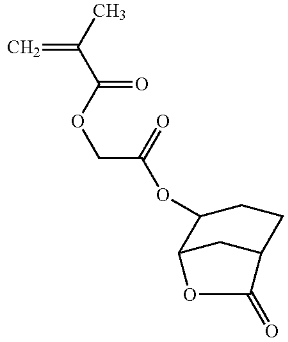

(a3-3-4)

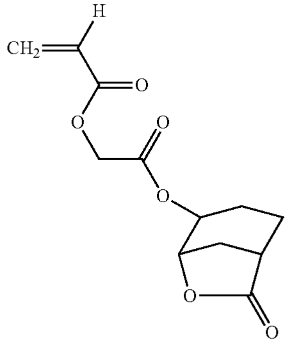

When the resin (A2) contains the structural units derived from the acid stable monomer (a3) having the lactone ring, the total proportion thereof is preferably 5 to 70 mol %, more preferably 10 to 65 mol %, still more preferably 15 to 60 mol %, with respect to the total structural units (100 mol %) constituting the resin (A2).

When the resin (A2) is the copolymer of the acid labile monomer (a1) and the acid stable monomer, the proportion of the structural unit derived from the acid labile monomer (a1) is preferably 10 to 80 mol %, and more preferably 20 to 60 mol %, with respect to the total structural units (100 mol %) constituting the resin (A2).

The proportion of the structural unit derived from the monomer having an adamantyl group (in particular, the monomer having the acid labile group (a1-1)) is preferably 15 mol % or more with respect to the structural units derived from the acid labile monomer (a1). As the mole ratio of the structural unit derived from the monomer having an adamantyl group increases within this range, the dry etching resistance of the resulting resist improves.

The resin (A2) preferably is a copolymer of the acid labile monomer (a1) and the acid stable monomer. In this copolymer, the acid labile monomer (a1) is preferably at least one of the acid labile monomer (a1-1) having an adamantyl group and the acid labile monomer (a1-2) having a cyclohexyl group, and more preferably is the acid labile monomer (a1-1).

The acid stable monomer is preferably the acid stable monomer (a2) having a hydroxy group and/or the acid stable monomer (a3) having a lactone ring. The acid stable monomer (a2) is preferably the monomer having the hydroxyadamantyl group (a2-1).

The acid stable monomer (a3) is preferably at least one of the monomer having the γ-butyrolactone ring (a3-1) and the monomer having the condensed ring of the γ-butyrolactone ring and the norbornene ring (a3-2).

The resin (A2) can be produced by a known polymerization method, for example, radical polymerization method, using at least one of the acid labile monomer (a1) and/or at least one of the acid stable monomer (a2) having a hydroxy group and/or at least one of the acid stable monomer (a3) having a lactone ring and/or at least one of a known compound.

The weight average molecular weight of the resin (A2) is preferably 2,500 or more (more preferably 3,000 or more, and still more preferably 4,000 or more), and 50,000 or less (more preferably 30,000 or less, and still more preferably 15,000 or less).

In the present resist composition, the weight ratio of the resins (A1)/(A2) (weight ratio) is preferably, for example, 0.01/10 to 5/10, more preferably 0.05/10 to 3/10, still more preferably 0.1/10 to 2/10, in particular, preferably 0.2/10 to 1/10.

<Resin Other than Resin (A1) and Resin (A2)>

The resist composition of the present invention may include a resin other than the resin (A1) and the resin (A2) described above. Such resin is a resin having a structural unit derived from the acid labile monomer, the acid stable monomer, as described above, and/or a known monomer in this field.

When the resist composition of the present invention include a resin other than the resin (A1) and the resin (A2), the proportion thereof is generally 0.1 to 50 weight %, preferably 0.5 to 30 weight %, and more preferably 1 to 20 weight %, with respect to the total structural units (100 weight %) of the resin (A) in the resist composition.

The proportion of the resin (A) can be adjusted with respect to the total solid proportion of the resist composition. For example, the resist composition of the present invention preferably contains 80 weight % or more and 99 weight % or less of the resin (A), with respect to the total solid proportion of the resist composition.

In the specification, the term "solid proportion of the resist composition" means the entire proportion of all ingredients other than the solvent (E). For example, if the proportion of the solvent (E) is 90 weight %, the solid proportion of the resist composition is 10 weight %.

The proportion of the resin (A) and the solid proportion of the resist composition can be measured with a known analytical method such as, for example, liquid chromatography and gas chromatography.

<Acid Generator (B)>

The acid generator has an acid labile group. The "acid labile group" means a group in which an elimination group is cleaved by contacting with an acid resulting in forming a hydrophilic group such as a hydroxy or carboxy group as described above. Examples of the acid labile group include the group represented by the formula (1) and the group represented by the formula (2) as described above. Examples of the acid generator (B) include acid generators described in JP2009-145408A, JP2009-229603A and JP2010-111660A, and a salt represented by the formula (II-0) (hereinafter may be referred to as "salt (II-0)").

(II-0)

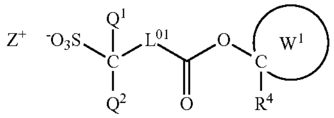

wherein $Q^1$ and $Q^2$ independently represent a fluorine atom or a $C_1$ to $C_6$ perfluoroalkyl group;

$L^{01}$ represents a single bond or an optionally substituted $C_1$ to $C_{20}$ divalent hydrocarbon group, and one or more —$CH_2$— contained in the divalent hydrocarbon group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

Examples of the perfluoroalkyl group of $Q^1$ and $Q^2$ include trifluoromethyl, perfluoroethyl, perfluoropropyl, perfluoroisopropyl, perfluorobutyl, perfluoro-sec-butyl, perfluoro-tert-butyl, perfluoropentyl and perfluorohexyl groups.

Among these, $Q^1$ and $Q^2$ independently are preferably trifluoromethyl or fluorine atom, and more preferably a fluorine atom.

The optionally substituted divalent hydrocarbon group of $L^{01}$ is preferably a $C_1$ to $C_{10}$ alkanediyl group or a divalent group represented by the formula (II-0-$L^{01}$).

(II-0-$L^{01}$)

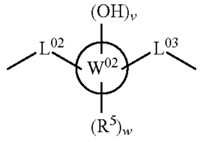

wherein $L^{02}$ and $L^{03}$ independently represent a $C_1$ to $C_8$ alkanediyl group, and one or more —$CH_2$— contained in the alkanediyl group may be replaced by —O— or —CO—;

ring $W^{02}$ represents a $C_3$ to $C_{12}$ saturated hydrocarbon ring, and one or more —$CH_2$— contained in the saturated hydrocarbon ring may be replaced by —O— or —CO—;

v represents an integer of 0 to 2;

$R^5$ represents a $C_1$ to $C_6$ alkyl group;

w represents an integer of 0 to 2, provided that the total carbon number contained in the alkanediyl group of $L^{02}$ and $L^{03}$, the saturated hydrocarbon ring of $W^{02}$, and the alkyl group of $R^5$ is 20 or less.

Examples of the alkanediyl group include the same groups as described above, among these, the alkanediyl group of $L^{01}$ is preferably a $C_1$ to $C_{10}$ alkanediyl group.

Examples of $L^{02}$ preferably include *—CO—O-$L^{04}$-, *—CO—O-$L^{05}$-O— and *—CO—O-$L^{06}$-CO—O—, wherein $L^{04}$ represents a single bond or a $C_1$ to $C_o$ alkanediyl group, $L^{05}$ represents a $C_1$ to $C_5$ alkanediyl group, $L^{06}$ represents a $C_1$ to $C_4$ alkanediyl group, * represents a bond to —C($Q^1$)($Q^2$).

Examples of $L^{03}$ preferably include *—O-$L^{07}$- and *—CO—O-$L^{08}$-, wherein $L^{07}$ represents a $C_1$ to $C_7$ alkanediyl group, $L^{08}$ represents a $C_1$ to $C_6$ alkanediyl group, * represents a bond to ring $W^{02}$.

The saturated hydrocarbon ring of $W^{02}$ is a ring containing only carbon atoms and hydrogen atoms, and not containing an unsaturated bond. Examples of the saturated hydrocarbon ring include a cyclohexane ring and an adamantane ring, and adamantane ring is preferable.

Examples of the alkyl group of $R^5$ include methyl, ethyl, n-propyl, iso-propyl, n-butyl, sec-butyl, tert-butyl, iso-butyl, n-pentyl, iso-pentyl, tert-pentyl, neo-pentyl and hexyl groups. The alkyl group is preferably a $C_1$ to $C_4$ alkyl group, more preferably a $C_1$ to $C_2$ alkyl group, and still more preferably a methyl group.

Examples of the divalent group represented by the formula (II-0-A) include groups below.

(II-0-A)

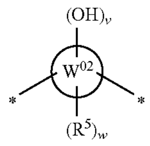

wherein $W^{02}$, $R^5$, v and w have the same definition of the above, * represents a bond.

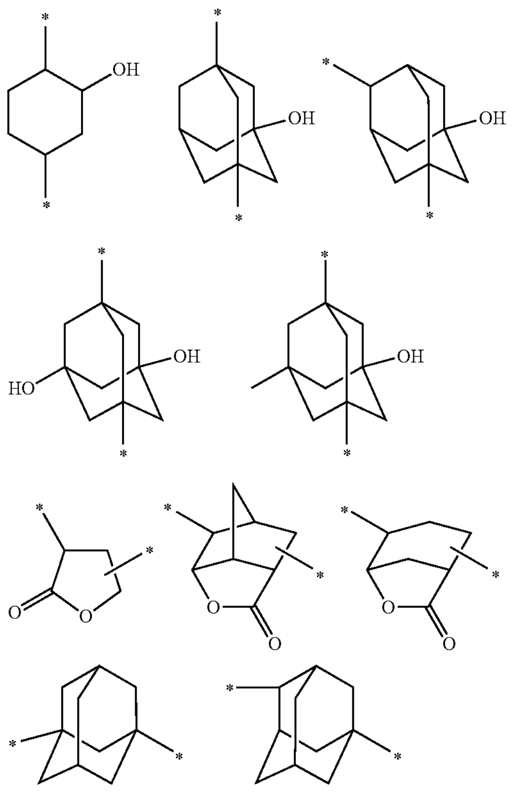

$R^4$ is preferably an alkyl group, in particular more preferably a $C_1$ to $C_6$ alkyl group.

The hydrocarbon ring of ring $W^1$ is preferably a $C_3$ to $C_{12}$ hydrocarbon ring. Among these, a saturated hydrocarbon ring is more preferable, and a cyclohexane ring and an adamantane ring are still more preferable.

Examples of the group represented by the formula (II-A) include groups below. * represents a bond to —O—.

(II-A)

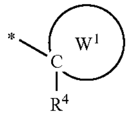

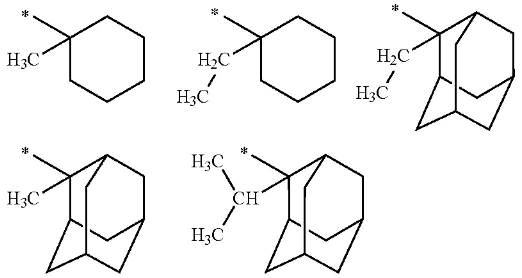

Examples of the substituents of ring $W^1$ include a halogen atom, a $C_1$ to $C_6$ alkyl group that optionally has a halogen atom or a hydroxy group, a $C_1$ to $C_6$ alkoxy group that optionally has a halogen atom or a hydroxy group, a hydroxy group or groups represented by the formula (II-1) to the formula (II-4) in addition to $R^4$. Among these, a $C_1$ to $C_6$ alkyl group that optionally has a hydroxy group, a $C_1$ to $C_6$ alkoxy group that optionally has a hydroxy group, a hydroxy group and groups represented by the formula (II-1) to the formula (II-4) are preferable, a $C_1$ to $C_o$ alkyl group, a $C_1$ to $C_6$ alkoxy group, a hydroxy group and groups represented by the formula (II-1) to the formula (II-4) are more preferable. In the formula (II-1) to the formula (II-4), * represents a bond to ring $W^1$.

In particular, for the substituents of ring $W^1$, the alkyl group is preferably a $C_1$ to $C_4$ alkyl group, more preferably a $C_1$ to $C_3$ alkyl group, still more preferably methyl and ethyl groups.

(II-1)

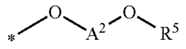

wherein $A^2$ represents a $C_1$ to $C_6$ alkanediyl group, $R^5$ represents a $C_1$ to $C_6$ alkyl group.

(II-2)

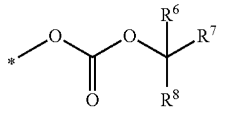

wherein $R^6$, $R^7$ and $R^8$ independently represent a $C_1$ to $C_6$ alkyl group.

(II-3)

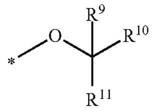

wherein $R^9$, $R^{10}$ and $R^{11}$ independently represent a $C_1$ to $C_6$ alkyl group.

(II-4)

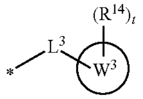

wherein $L^3$ represents a $C_1$ to $C_{10}$ alkanediyl group, and one or more —$CH_2$— contained in the alkanediyl group may be replaced by —O— or —CO—;

ring $W^3$ represents a $C_3$ to $C_{18}$ saturated hydrocarbon ring, and one or more —$CH_2$— contained in the saturated hydrocarbon ring may be replaced by —O— or —CO—;

$R^{14}$ in each occurrence independently represents a $C_1$ to $C_6$ alkyl group, a $C_1$ to $C_6$ alkoxy group, a $C_1$ to $C_6$ alkoxycarbonyl group, a hydroxy group, a $C_1$ to $C_6$ hydroxyalkyl group or a $C_1$ to $C_6$ hydroxyalkoxy group.

t represents an integer of 0 to 3.

Examples of the alkoxy group include methoxy, ethoxy, propoxy, butoxy, pentyloxy, hexyloxy, heptyloxy, octyloxy, decyloxy and dodecyloxy groups.

The alkyl group that has a halogen atom and the alkoxy group that has a halogen atom are preferably the alkyl group that has a fluorine atom and the alkoxy group that has a fluorine atom.

Examples of the alkyl group that has a hydroxy group include hydroxy methyl, hydroxyethyl and hydroxy propyl groups.

Examples of the alkoxy group that has a hydroxy group include hydroxy methoxy, hydroxyethoxy and hydroxy propoxy groups.

Examples of the alkanediyl group in which the —$CH_2$— contained therein is replaced by —O— or —CO— of $L^3$ preferably include *—O-$L^7$-CO—O—, *—O-$L^8$-CO—O-$L^9$-O—, *—CO—O-$L^{10}$-CO—O—, *—O—CO-$L^{11}$-O—or *—O-$L^{12}$-O—, among these, *—O-$L^7$-CO—O— and *—CO—O-$L^{10}$-CO—O— are preferable, *—O—$CH_2$—CO—O— and *—O—$CH_2$—CO—O—$C_2H_4$—O— are more preferable. $L^7$ to $L^{12}$ independently represent $C_1$ to $C_8$ alkanediyl group, and * represents a bond to ring $W^1$.

Examples of the saturated hydrocarbon ring of ring $W^3$ include the same ring as the alicyclic hydrocarbon ring described above.

Examples of the alkoxycarbonyl group of $R^{14}$ include a group in which the carbonyl group bonds to the alkoxy group, such as methoxycarbonyl and ethoxycarbonyl group.

Examples of the group represented by the formula (II-1) include groups below.

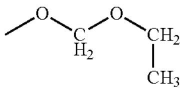 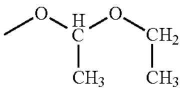

Examples of the group represented by the formula (II-2) include groups below.

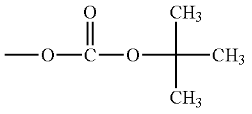 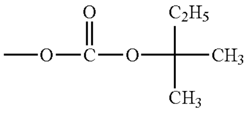

-continued

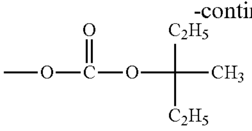

Examples of the group represented by the formula (II-3) include groups below.

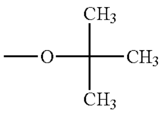 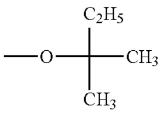 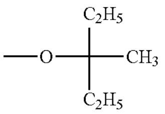

Examples of the group represented by the formula (II-4) include groups below.

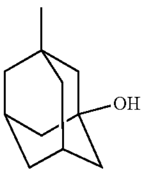 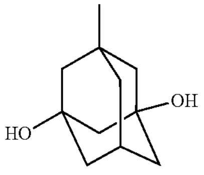

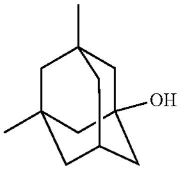 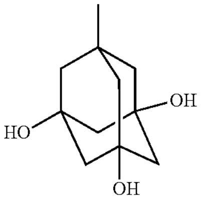

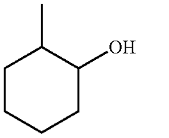 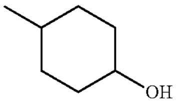

(II-4-1)

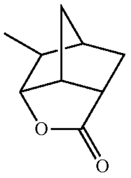

(II-4-2)

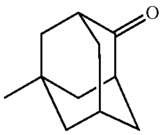

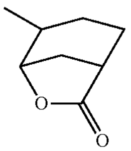 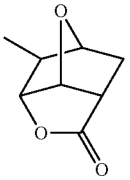 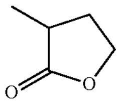

Among groups represented by the formula, groups represented by the formula (II-4-1) and (II-4-2) are preferable.

As the salt (II-0), a salt represented by the formula (II) in which $L^{01}$ in the salt (II-0) is a $C_1$ to $C_{10}$ alkanediyl group (hereinafter may be referred to as "salt (II-0)") is preferable.

(II)

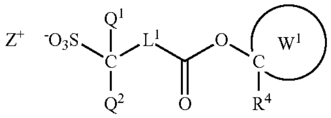

wherein $Q^1$ and $Q^2$ independently represent a fluorine atom or a $C_1$ to $C_6$ perfluoroalkyl group;

$L^1$ represents a single bond or a $C_1$ to $C_{10}$ alkanediyl group, and one or more —$CH_2$— contained in the alkanediyl group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

Examples of the alkanediyl group of $L^1$ in which one or more —$CH_2$— contained in the alkanediyl group is replaced by —O— or —CO— include groups represented by the formula (b1-1) to the formula (b1-6) below. In the formula (b1-1) to the formula (b1-6), the group is represented so as to correspond with two sides of the formula (B1), that is, the left side of the group bonds to $C(Q^1)(Q^2)$- and the right side of the group bonds to —Y (examples of the formula (b1-1) to the formula (b1-6) are the same as above).

(b1-1)

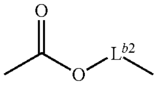

(b1-2)

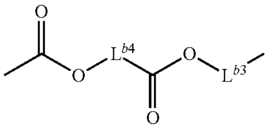

(b1-3)

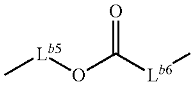

(b1-4)

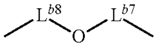

(b1-5)

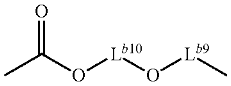

(b1-6)

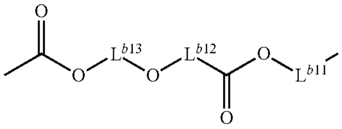

wherein $Lb^2$ to $Lb^{13}$ independently represent a fluorine atom or a $C_1$ to $C_6$ perfluoroalkyl group;

$L^1$ represents a single bond or a $C_1$ to $C_8$ alkanediyl group.

Examples of the divalent group represented by the formula (b1-1) include groups below.

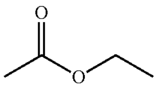 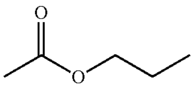

Examples of the divalent group represented by the formula (b1-2) include groups below.

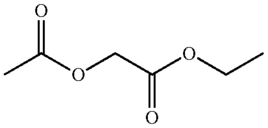

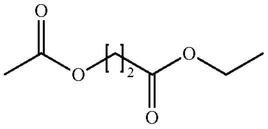

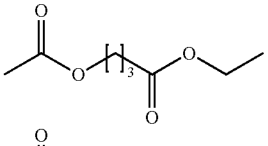

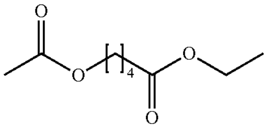

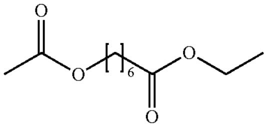

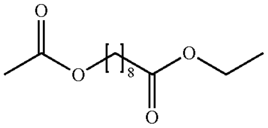

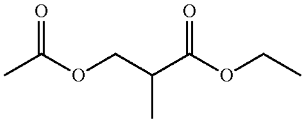

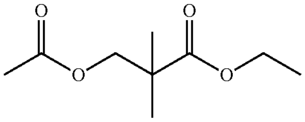

Examples of the divalent group represented by the formula (b1-3) include groups below.

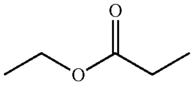 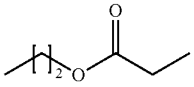

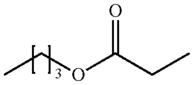 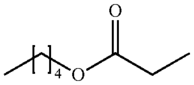

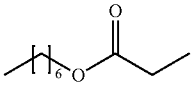 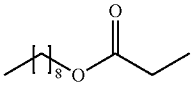

Examples of the divalent group represented by the formula (b1-4) include groups below.

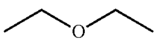 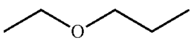

Examples of the divalent group represented by the formula (b1-5) include groups below.

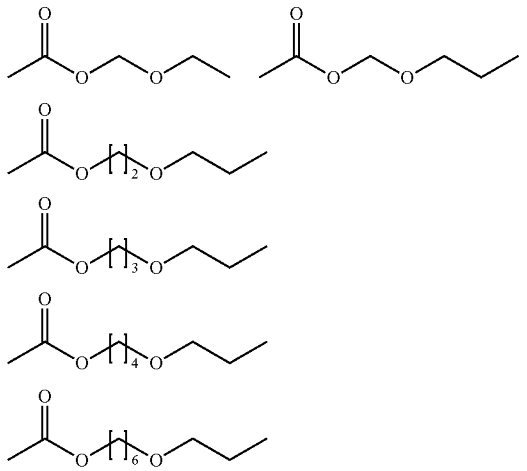

Examples of the divalent group represented by the formula (b1-6) include groups below.

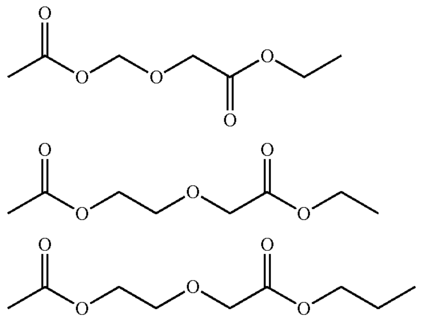

Among the salt represented by the formula (II), a salt represented by the formula (II-4-a) is preferable.

(II-4a)

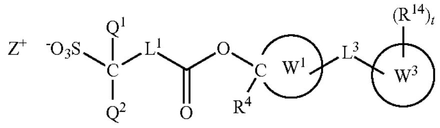

wherein $Q^1$, $Q^2$, $L^1$, $R^4$, ring $W^1$, $L^3$, ring $W^3$, $R^{14}$, t and $Z^+$ have the same definition of the above.

Examples of the salt represented by the formula (II-0) include salts below.

(b1-s-1)

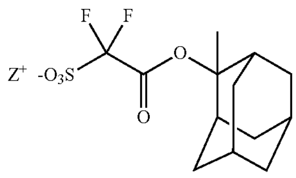

-continued (b1-s-2)

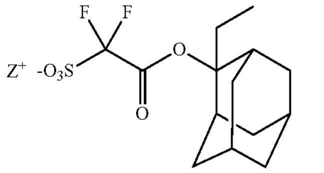

(b1-s-3)

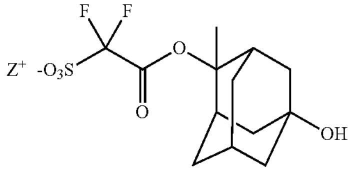

(b1-s-4)

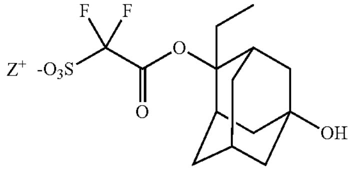

(b1-s-5)

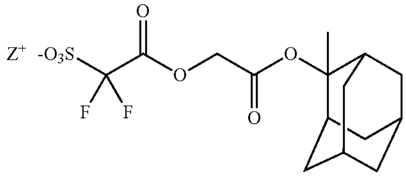

(b1-s-6)

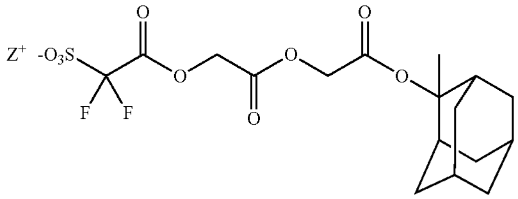

(b1-s-7)

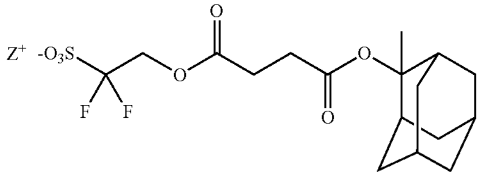

(b1-s-8)

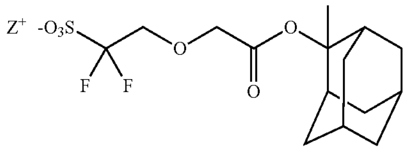

(b1-s-9)

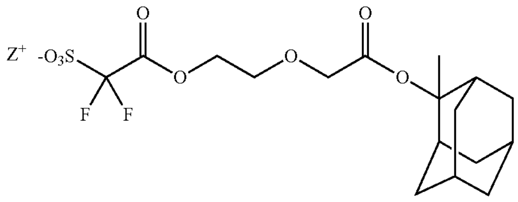

-continued
(b1-s-10)
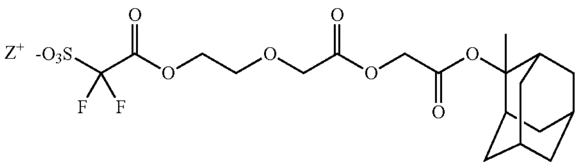
(b1-s-11)
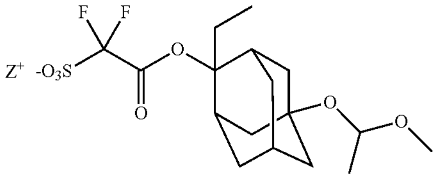
(b1-s-12)
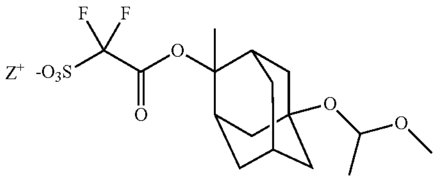
(b1-s-13)
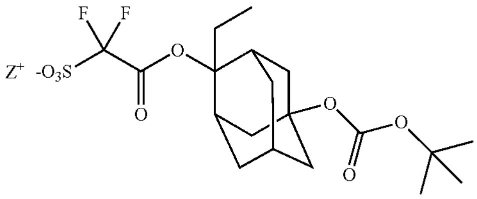
(b1-s-14)
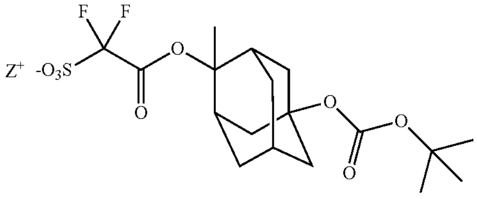
(b1-s-15)
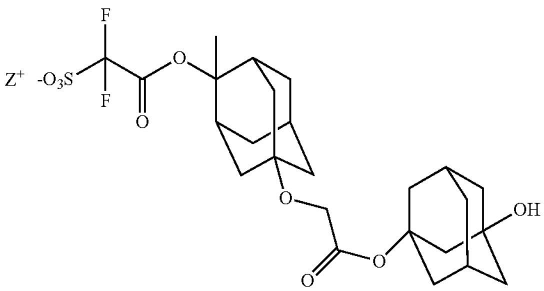
-continued
(b1-s-16)
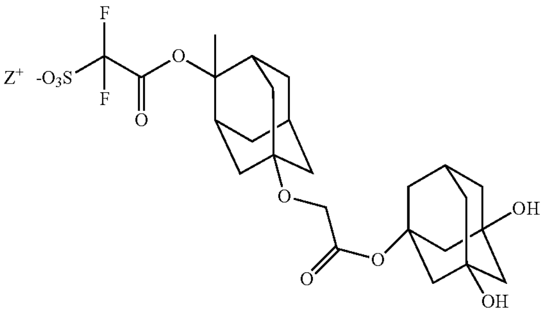
(b1-s-17)
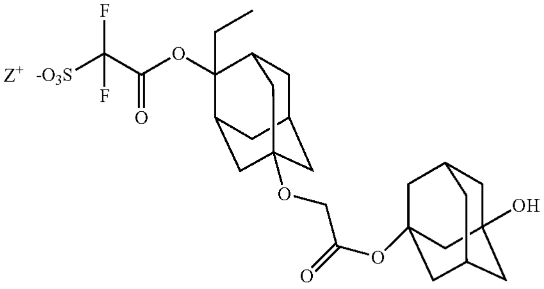
(b1-s-18)
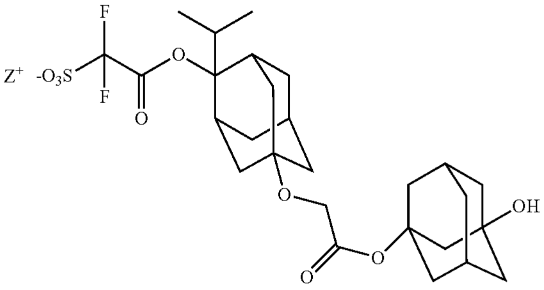
(b1-s-19)
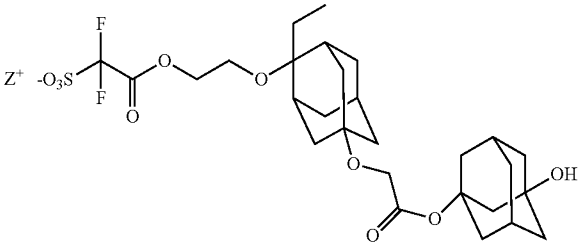
(b1-s-20)
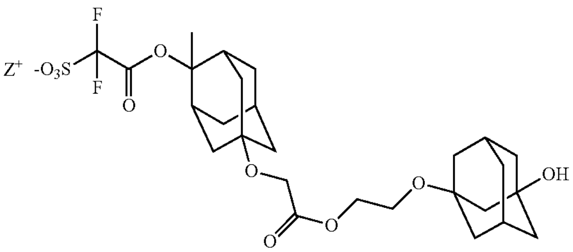

-continued
(b1-s-21)
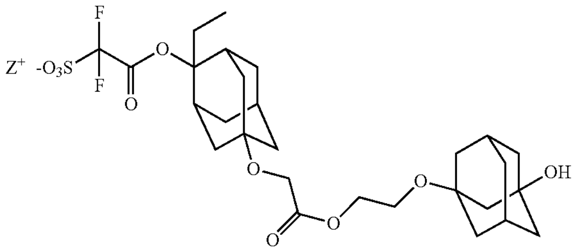
(b1-s-22)
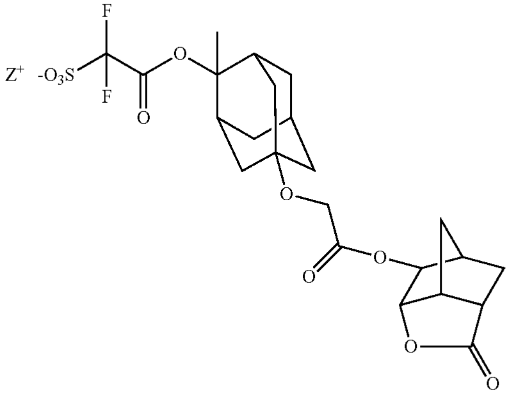
(b1-s-23)
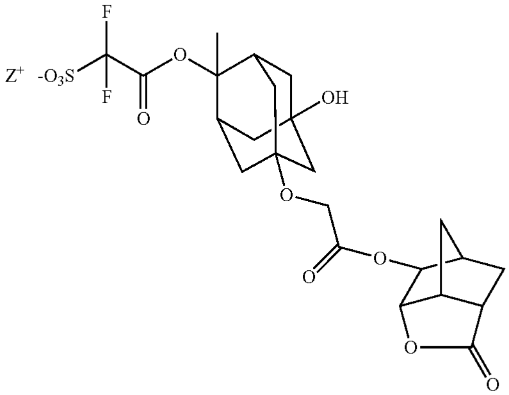
(b1-s-24)
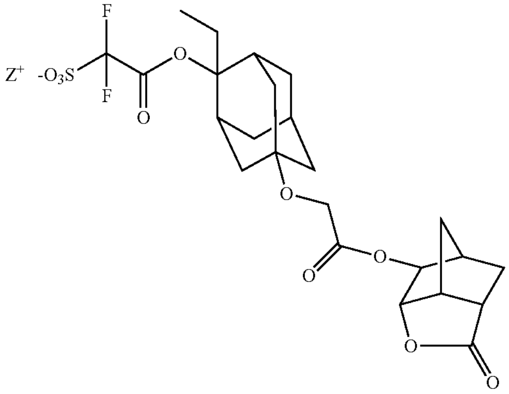
-continued
(b1-s-25)
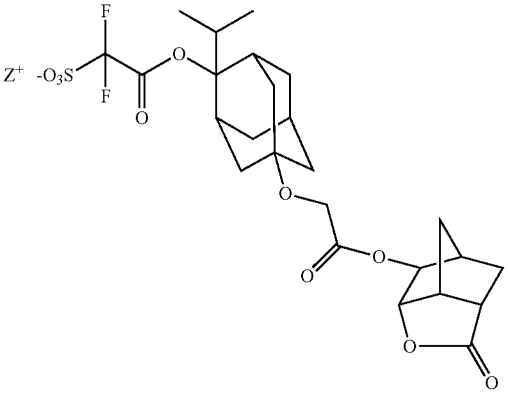
(b1-s-26)
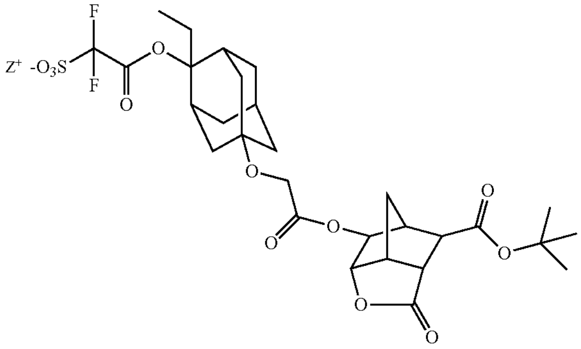
(b1-s-27)
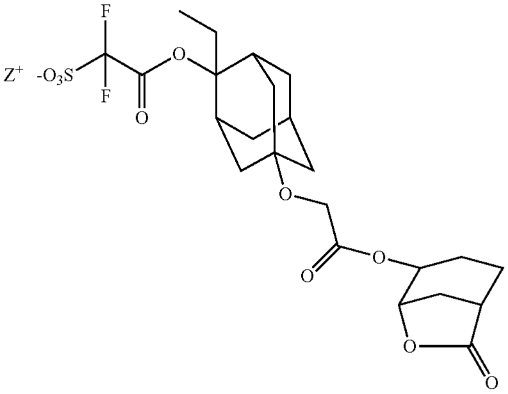
(b1-s-28)
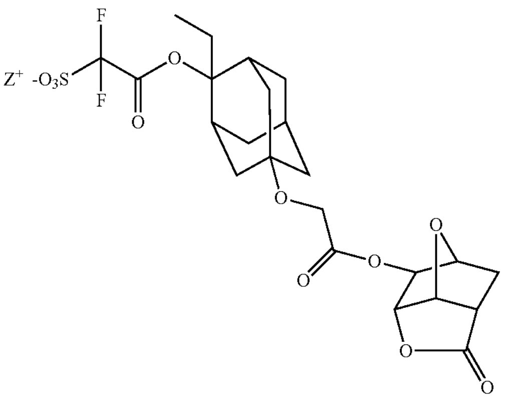

-continued
(b1-s-29)
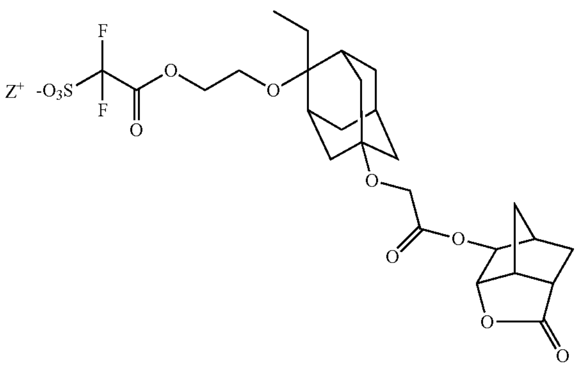
(b1-s-30)
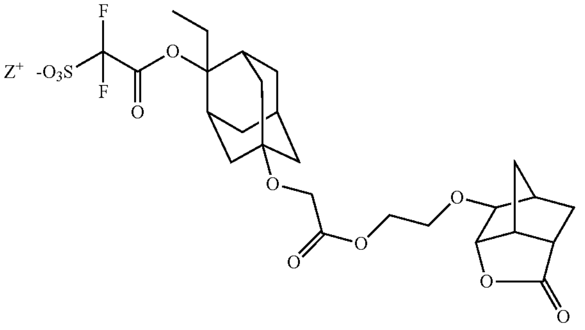
(b1-s-31)
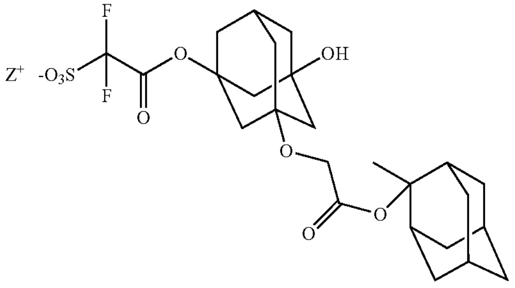
(b1-s-32)
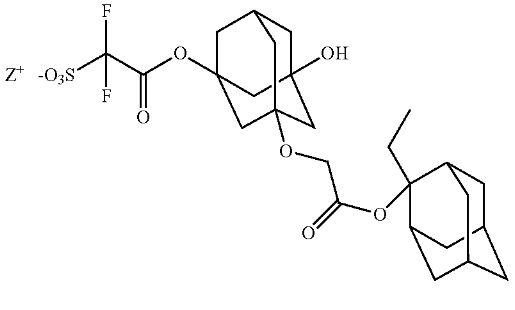
-continued
(b1-s-33)
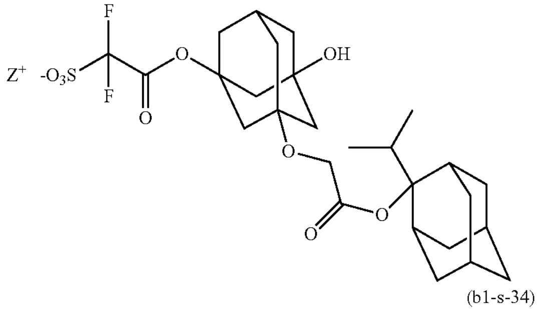
(b1-s-34)
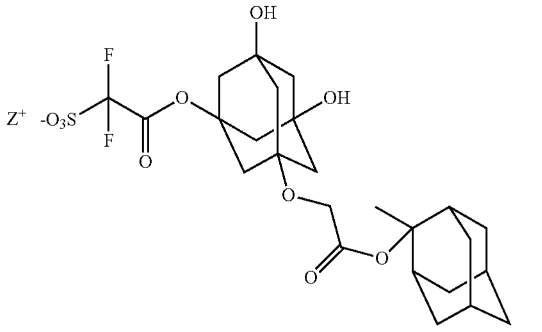
(b1-s-35)
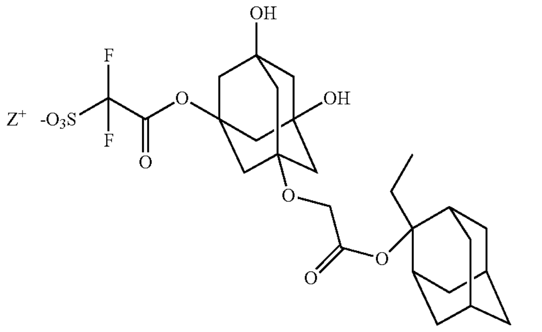
(b1-s-36)
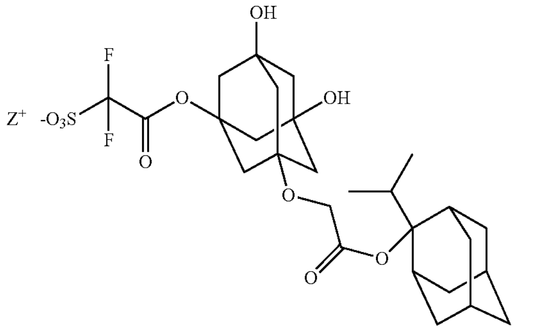
(b1-s-37)
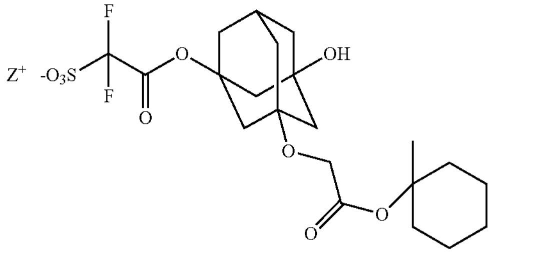

-continued
(b1-s-38)
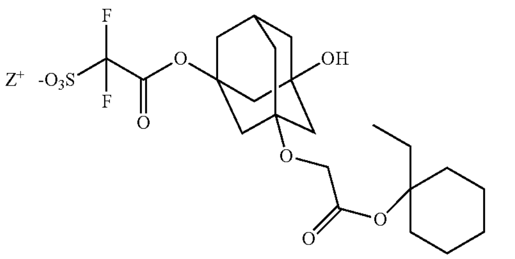
(b1-s-39)
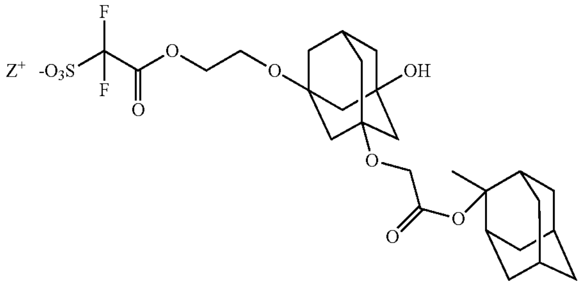
(b1-s-40)
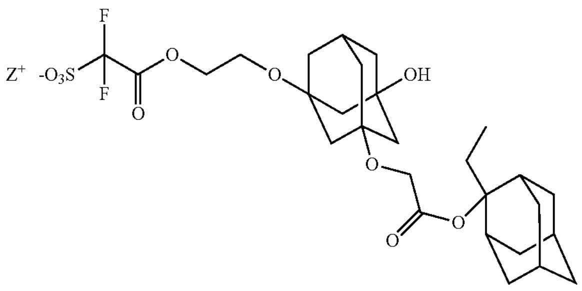
(b1-s-41)
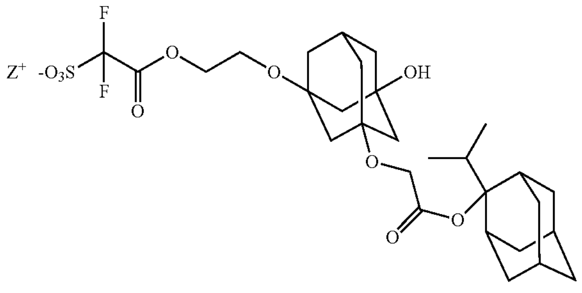
(b1-s-42)
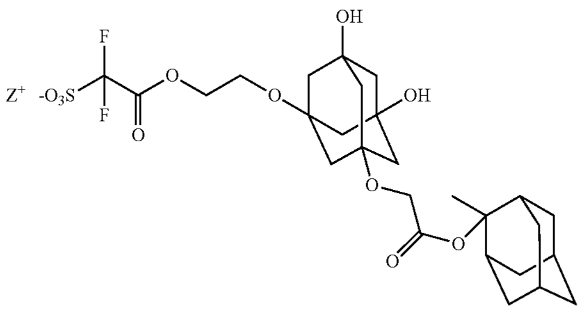
-continued
(b1-s-43)
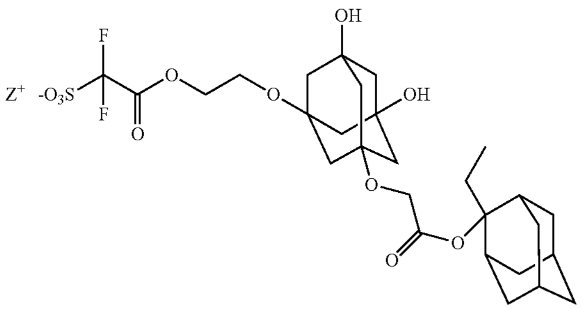
(b1-s-44)
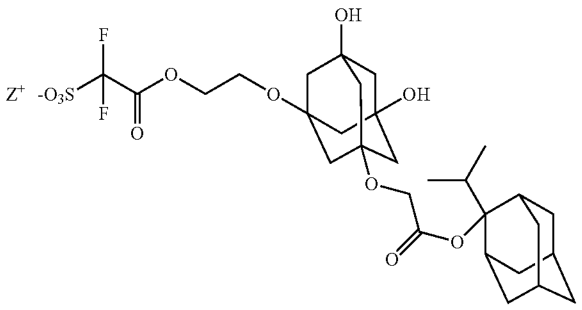
(b1-s-45)
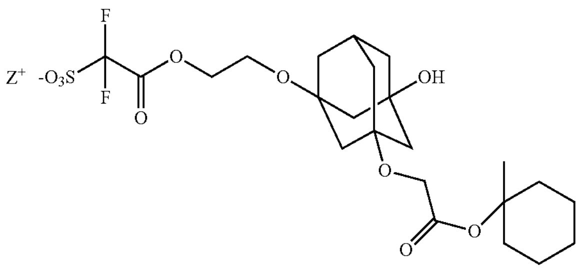
(b1-s-46)
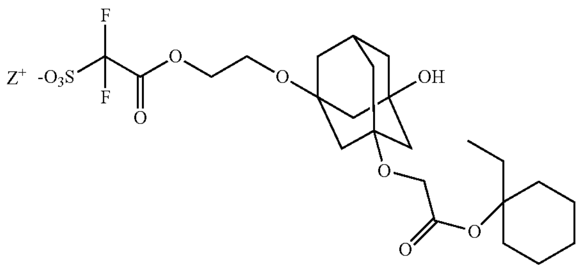
(b1-s-47)
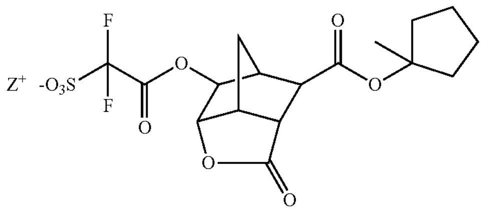

-continued
(b1-s-48)
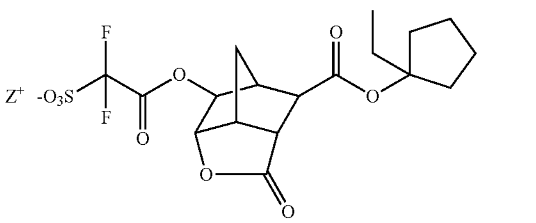
(b1-s-49)
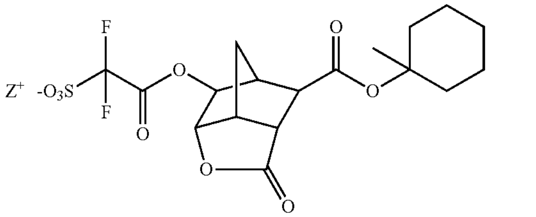
(b1-s-50)
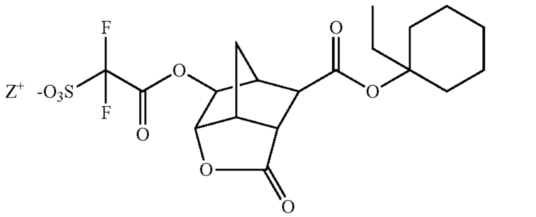
(b1-s-51)
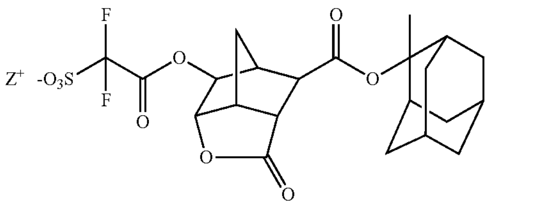
(b1-s-52)
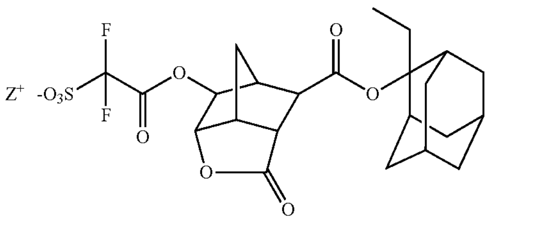
(b1-s-53)
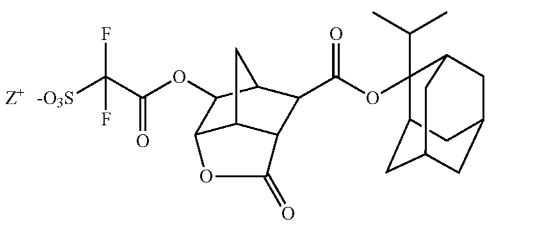
-continued
(b1-s-54)
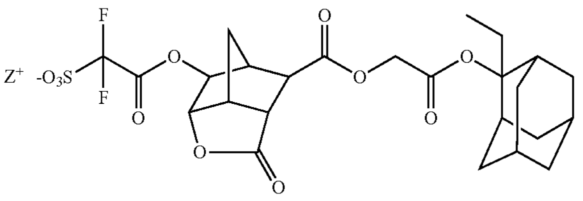
(b1-s-55)
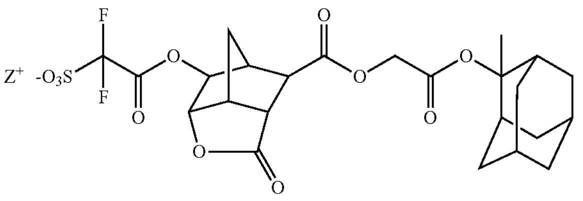
(b1-s-56)
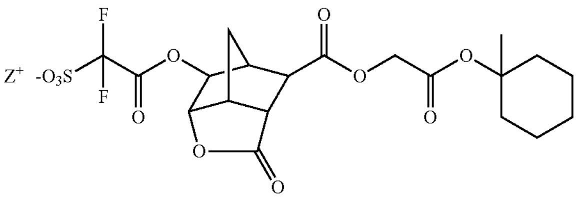
(b1-s-57)
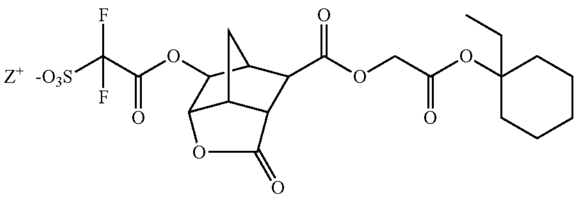
(b1-s-58)
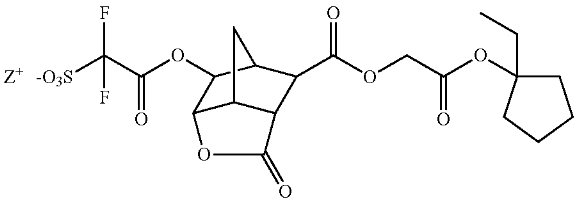
(b1-s-59)
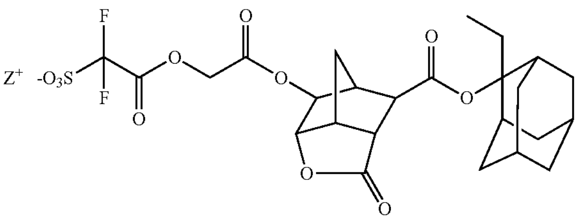
(b1-s-60)
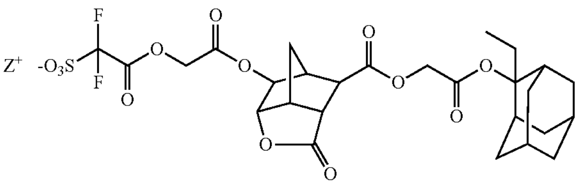

-continued
(b1-s-61)
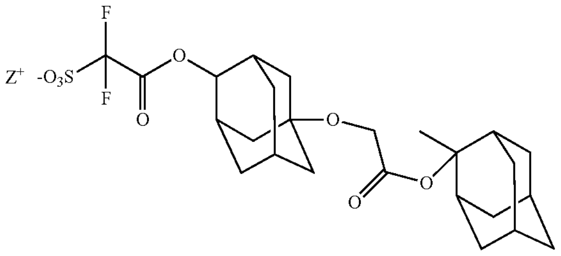
(b1-s-62)
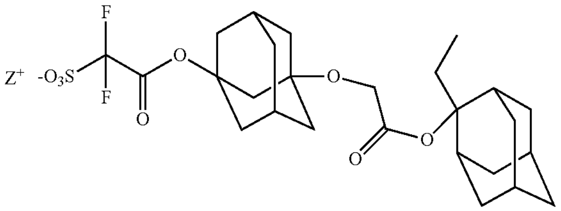
(b1-s-63)
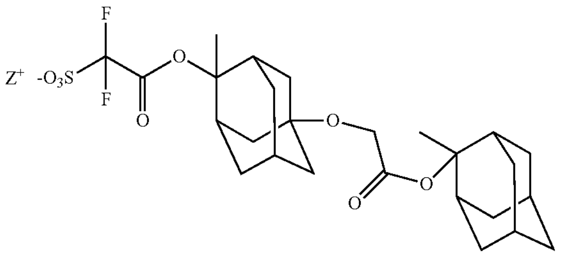
(b1-s-64)
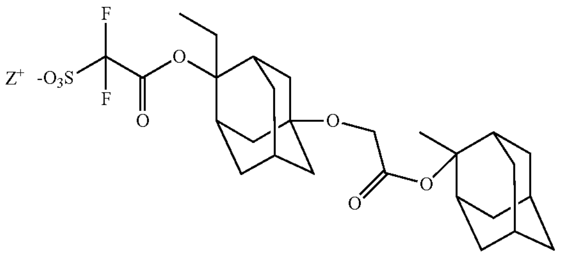
(b1-s-65)
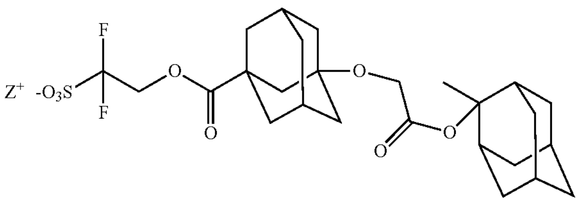
(b1-s-66)
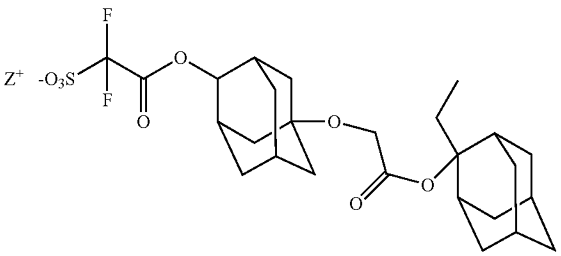
-continued
(b1-s-67)
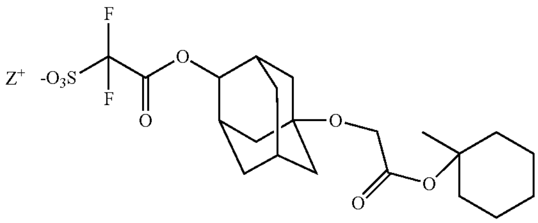
(b1-s-68)
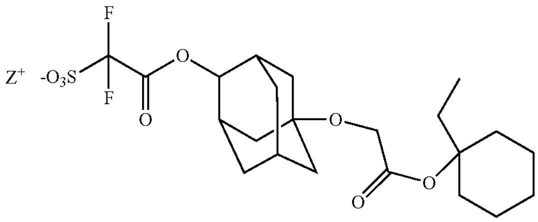
(b1-s-69)
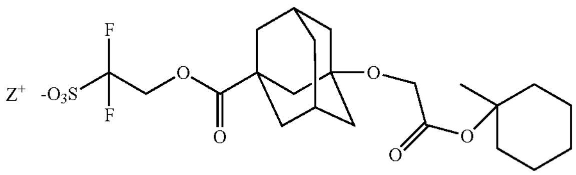
(b1-s-70)
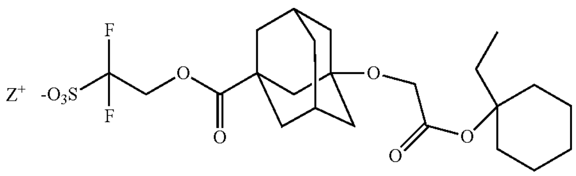
(b1-s-71)
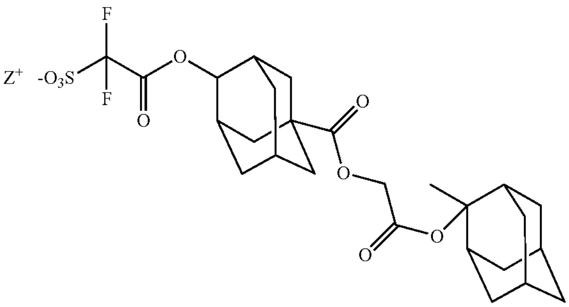
(b1-s-72)
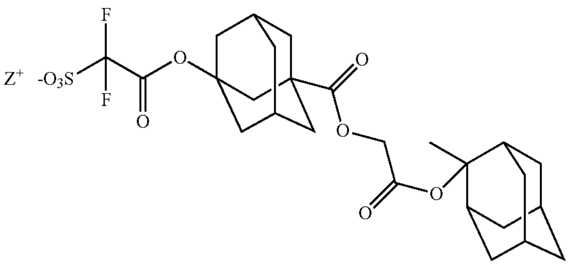

-continued (b1-s-73)

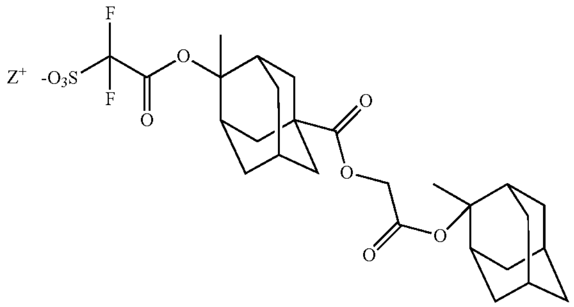

(b1-s-74)

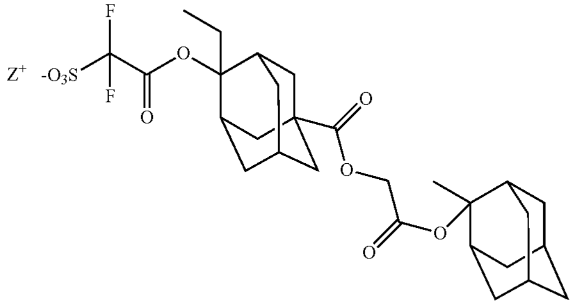

(b1-s-75)

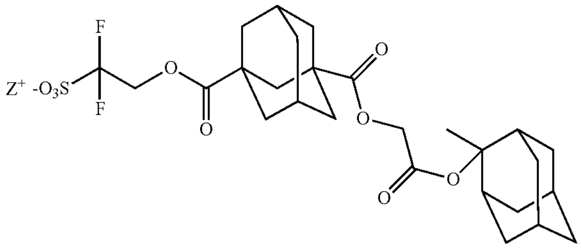

(b1-s-76)

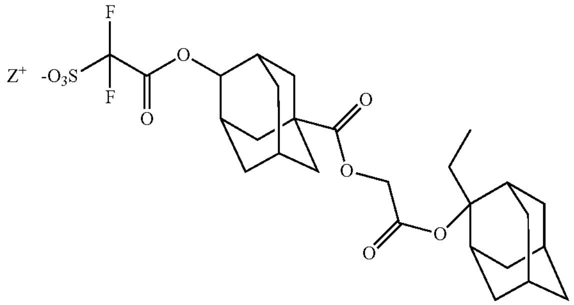

(b1-s-77)

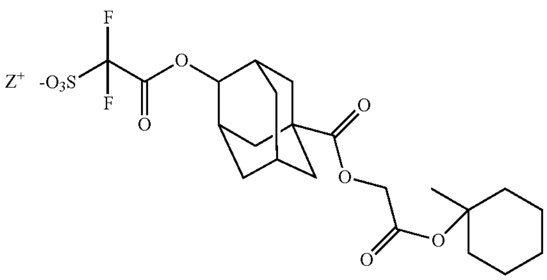

-continued (b1-s-78)

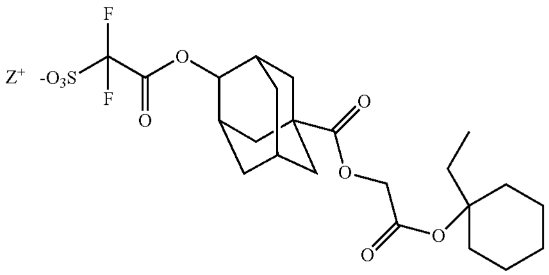

(b1-s-79)

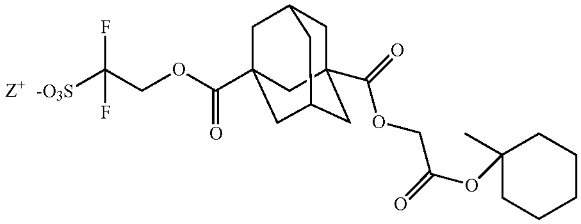

(b1-s-80)

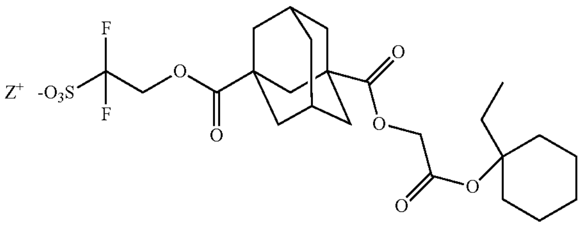

Examples of the cation of the salt include an organic onium cation, for example, organic sulfonium cation, organic iodonium cation, organic ammonium cation, organic benzothiazolium cation and organic phosphonium cation. Among these, organic sulfonium cation and organic iodonium cation are preferable, and cations represented by the formula (b2-1) to (b2-4) are more preferable.

$Z^+$ of the formula (B1) is preferably represented by any of the formula (b2-1) to the formula (b2-4).

(b2-1)

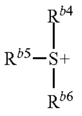

(b2-2)

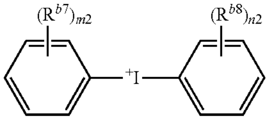

(b2-3)

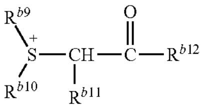

-continued (b2-4)

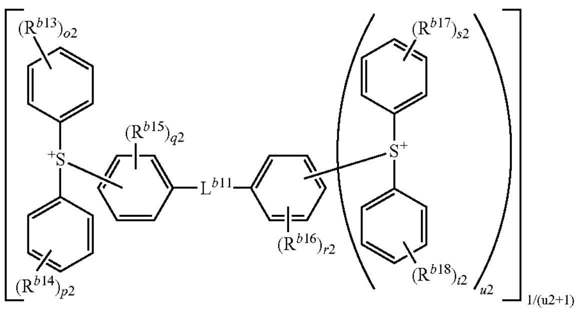

wherein $R^{b4}$, $R^{b5}$ and $R^{b6}$ independently represent a $C_1$ to $C_{30}$ hydrocarbon group, the hydrocarbon group is preferably a $C_1$ to $C_{30}$ alkyl group, a $C_3$ to $C_{18}$ alicyclic hydrocarbon group or a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group, or $R^{b9}$ and $R^{b10}$ may be bonded together with a sulfur atom bonded thereto to form a sulfur-containing 3- to 12-membered (preferably 3- to 7-membered) ring, and one or more —$CH_2$— contained in the ring may be replaced by —O—, —S— or —CO—;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{12}$ alkyl group, a $C_3$ to $C_{18}$ alicyclic hydrocarbon group and a $C_6$ to $C_{18}$ aromatic hydrocarbon group, the aromatic hydrocarbon group may be substituted with a $C_1$ to $C_{12}$ alkyl group, a $C_1$ to $C_{12}$ alkoxy group, a $C_3$ to $C_{18}$ alicyclic hydrocarbon group or a $C_1$ to $C_{12}$ alkyl carbonyloxy group;

$R^{b11}$ and $R^{b12}$ may be bonded together with —CH—CO— bonded thereto to form a 3- to 12-membered (preferably a 3- to 7-membered) ring, and one or more —$CH_2$— contained in the ring may be replaced by —O—, —S— or —CO—;

$R^{b13}$, $R^{b14}$, $R^{b15}$, $R^{b16}$, $R^{b17}$ and $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group of $R^{b9}$ to $R^{b12}$ preferably include methyl, ethyl, n-propyl, isopropyl, n-butyl, sec-butyl, tert-butyl, pentyl, hexyl, octyl and 2-ethylhexyl groups.

Examples of the alicyclic hydrocarbon group of $R^{b9}$ to $R^{b11}$ preferably include cyclopropyl, cyclobutyl, cyclopentyl, cyclohexyl, cycloheptyl, cyclodecyl, 2-alkyladamantane-2-yl, 1-(adamatane-1-yl)-1-alkyl and isobornyl groups.

Examples of the aromatic hydrocarbon group of $R^{b12}$ preferably include phenyl, 4-methylphenyl, 4-ethylphenyl, 4-t-butylphenyl, 4-cyclohexylphenyl, 4-methoxyphenyl, naphthyl and biphenyl groups.

Examples of the aromatic group substituted with an alkyl group typically represent an aralkyl group such as benzyl and phenethyl groups.

Examples of the alkyl carbonyloxy group of the $R^{b12}$ include methyl carbonyloxy, ethyl carbonyloxy, n-propyl carbonyloxy, isopropyl carbonyloxy, n-butyl carbonyloxy, sec-butyl carbonyloxy, tert-butyl carbonyloxy, pentyl carbonyloxy, hexyl carbonyloxy, octylcarbonyloxy and 2-ethylhexylcarbonyloxy groups.

Examples of the ring having —CH—CO— and formed by $R^{b9}$ and $R^{b10}$ bonded together include thiolane-1-ium ring (tetrahydrothiophenium ring), thian-1-ium ring and 1,4-oxathian-4-ium ring.

Examples of the ring having a sulfur atom and formed by $R^{b11}$ and $R^{b12}$ bonded together include oxocycloheptane ring, oxocyclohexane ring, oxonorbornane ring and oxoadamantane ring.

Specific examples of the organic cations represented by the formula (b2-1) to the formula (b2-4) include, for example, compounds described in JP2010-204646A.

Among the cations represented by the formula (b2-1) to the formula (b2-4), the cation represented by the formula (b2-1-1) is preferable, and triphenyl sulfonium cation (v2=w2=x2=0 in the formula (b2-1-1)), diphenyltolyl sulfonium cation (v2=w2=0, x2=1, and $R^{b21}$ is a methyl group in the formula (b2-1-1)) and tritolyl sulfonium cation (v2=w2=x2=1, $R^{b19}$, $R^{b20}$ and $R^{b21}$ are a methyl group in the formula (b2-1-1)) are more preferable.

(b2-1-1)

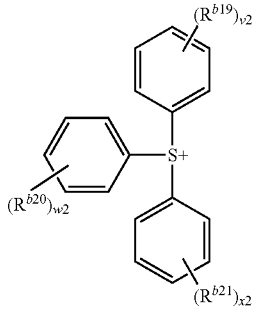

wherein $R^{b19}$, $R^{b20}$ and $R^{b21}$ in each occurrence independently represent a halogen atom, a hydroxy group, a $C_1$ to $C_{12}$ alkyl group, a $C_3$ to $C_{18}$ alicyclic hydrocarbon group or a $C_1$ to $C_{12}$ alkoxy group, and the alkyl group, the alicyclic hydrocarbon group and the alkoxy group may be substituted with a halogen group, a hydroxy group, a $C_1$ to $C_{12}$ alkoxy group, a $C_6$ to $C_{18}$ aromatic hydrocarbon group, a $C_2$ to $C_4$ acyl group or a glycidyloxy group;

v2 to x2 independently represent an integer of 0 to 5.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to x2 independently represent preferably 0 or 1.

Specific examples of the cation of the formula (b2-1-1) include a cation below.

(b2-c-1)
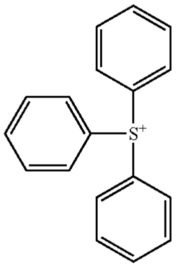
(b2-c-2)
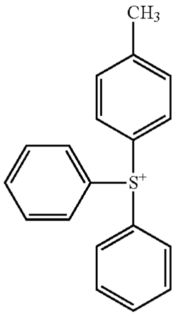
(b2-c-3)
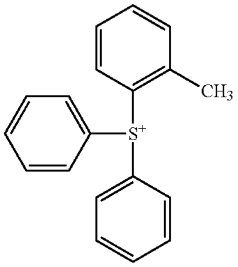
(b2-c-4)
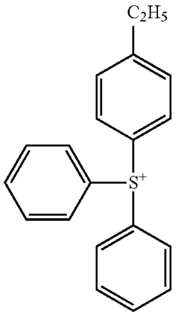
(b2-c-5)
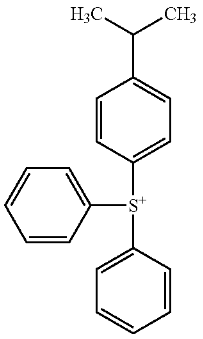
-continued
(b2-c-6)
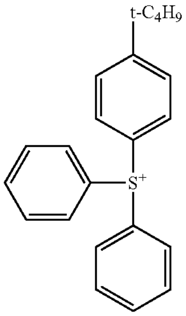
(b2-c-7)
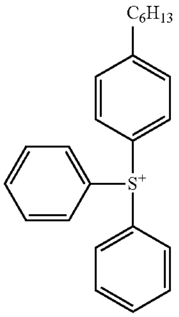
(b2-c-8)
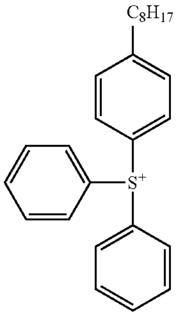
(b2-c-9)
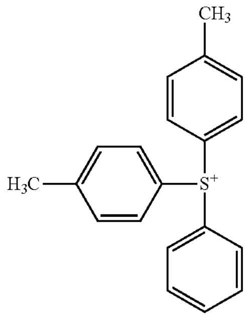
(b2-c-10)
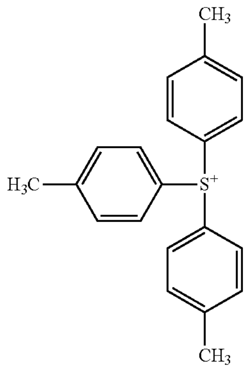

-continued
(b2-c-11)
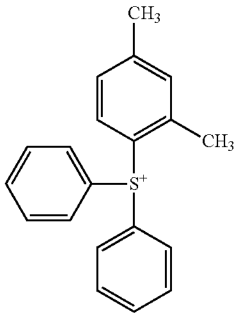
(b2-c-12)
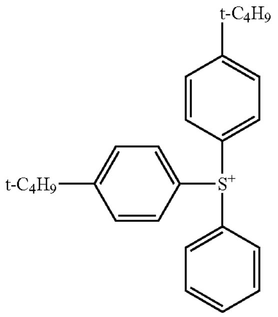
(b2-c-13)
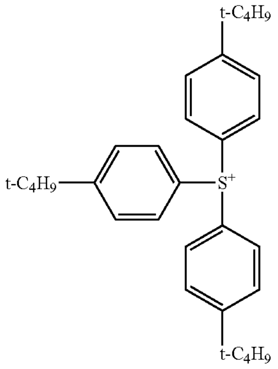
(b2-c-14)
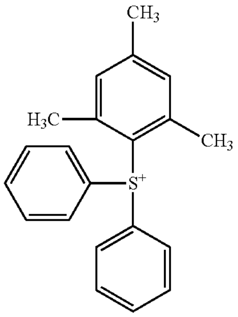
-continued
(b2-c-15)
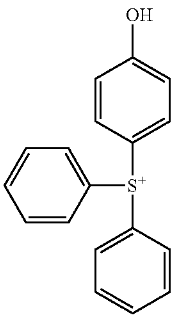
(b2-c-16)
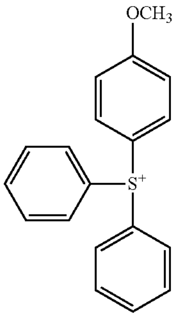
(b2-c-17)
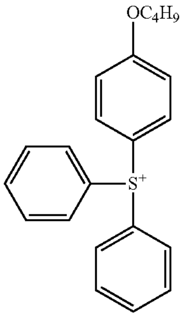
(b2-c-18)
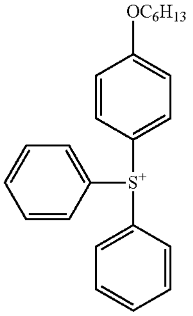
(b2-c-25)
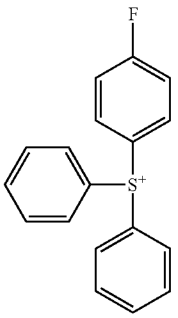

-continued (b2-c-19)

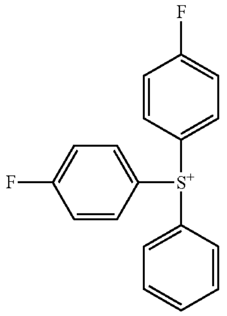

(b2-c-20)

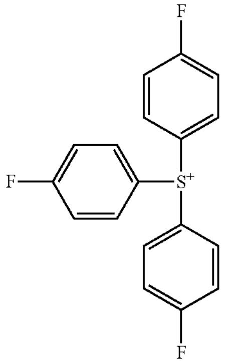

Specific examples of the cation of the formula (b2-3) include a cation below.

(b2-c-21)

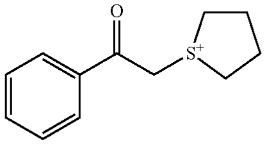

(b2-c-22)

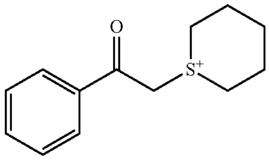

(b2-c-23)

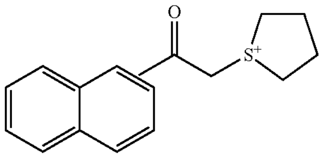

(b2-c-24)

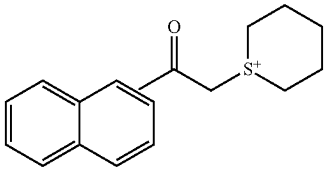

The salt represented by the formula (II-0) is a compound in combination of the above sulfonate anion and an organic cation.

The above sulfonate anion and the organic cation may optionally be combined, for example, as described in the Table 3 below. The sulfonate anion represented by the formula (b1-s-2) is expressed "(b1-s-2)", and the organic cation represented by the formula (b2-c-1) is expressed "(b2-c-1)" in the table, for example.

TABLE 1

| Acid Generator | Anion | Cation |
|---|---|---|
| (II-1) | (b1-s-2) | (b2-c-1) |
| (II-2) | (b1-s-2) | (b2-c-2) |
| (II-3) | (b1-s-2) | (b2-c-6) |
| (II-4) | (b1-s-2) | (b2-c-10) |
| (II-5) | (b1-s-2) | (b2-c-12) |
| (II-6) | (b1-s-2) | (b2-c-15) |
| (II-7) | (b1-s-2) | (b2-c-21) |
| (II-8) | (b1-s-2) | (b2-c-23) |
| (II-9) | (b1-s-4) | (b2-c-1) |
| (II-10) | (b1-s-4) | (b2-c-2) |
| (II-11) | (b1-s-4) | (b2-c-6) |
| (II-12) | (b1-s-4) | (b2-c-10) |
| (II-13) | (b1-s-4) | (b2-c-12) |
| (II-14) | (b1-s-4) | (b2-c-15) |
| (II-15) | (b1-s-4) | (b2-c-21) |
| (II-16) | (b1-s-4) | (b2-c-23) |
| (II-17) | (b1-s-1) | (b2-c-1) |
| (II-18) | (b1-s-1) | (b2-c-2) |
| (II-19) | (b1-s-1) | (b2-c-6) |
| (II-20) | (b1-s-1) | (b2-c-10) |
| (II-21) | (b1-s-1) | (b2-c-12) |
| (II-22) | (b1-s-1) | (b2-c-15) |
| (II-23) | (b1-s-1) | (b2-c-21) |
| (II-24) | (b1-s-1) | (b2-c-23) |
| (II-25) | (b1-s-3) | (b2-c-1) |
| (II-26) | (b1-s-3) | (b2-c-2) |
| (II-27) | (b1-s-3) | (b2-c-6) |
| (II-28) | (b1-s-3) | (b2-c-10) |
| (II-29) | (b1-s-3) | (b2-c-12) |
| (II-30) | (b1-s-3) | (b2-c-15) |
| (II-31) | (b1-s-3) | (b2-c-21) |
| (II-32) | (b1-s-3) | (b2-c-23) |
| (II-33) | (b1-s-5) | (b2-c-1) |
| (II-34) | (b1-s-5) | (b2-c-2) |
| (II-35) | (b1-s-5) | (b2-c-6) |
| (II-36) | (b1-s-5) | (b2-c-10) |
| (II-37) | (b1-s-5) | (b2-c-12) |
| (II-38) | (b1-s-5) | (b2-c-15) |
| (II-39) | (b1-s-5) | (b2-c-21) |
| (II-40) | (b1-s-5) | (b2-c-23) |

TABLE 2

| Acid Generator | Anion | Cation |
|---|---|---|
| (II-41) | (b1-s-17) | (b2-c-1) |
| (II-42) | (b1-s-17) | (b2-c-2) |
| (II-43) | (b1-s-17) | (b2-c-6) |
| (II-44) | (b1-s-17) | (b2-c-10) |
| (II-45) | (b1-s-17) | (b2-c-12) |
| (II-46) | (b1-s-17) | (b2-c-15) |
| (II-47) | (b1-s-17) | (b2-c-21) |
| (II-48) | (b1-s-17) | (b2-c-23) |
| (II-49) | (b1-s-24) | (b2-c-1) |
| (II-50) | (b1-s-24) | (b2-c-2) |
| (II-51) | (b1-s-24) | (b2-c-6) |
| (II-52) | (b1-s-24) | (b2-c-10) |
| (II-53) | (b1-s-24) | (b2-c-12) |
| (II-54) | (b1-s-24) | (b2-c-15) |
| (II-55) | (b1-s-24) | (b2-c-21) |
| (II-56) | (b1-s-24) | (b2-c-23) |
| (II-57) | (b1-s-6) | (b2-c-1) |
| (II-58) | (b1-s-6) | (b2-c-10) |
| (II-59) | (b1-s-7) | (b2-c-1) |
| (II-60) | (b1-s-7) | (b2-c-10) |
| (II-61) | (b1-s-8) | (b2-c-1) |
| (II-62) | (b1-s-8) | (b2-c-10) |

TABLE 2-continued

| Acid Generator | Anion | Cation |
|---|---|---|
| (II-63) | (b1-s-9) | (b2-c-1) |
| (II-64) | (b1-s-9) | (b2-c-10) |
| (II-65) | (b1-s-10) | (b2-c-1) |
| (II-66) | (b1-s-10) | (b2-c-10) |
| (II-67) | (b1-s-11) | (b2-c-1) |
| (II-68) | (b1-s-11) | (b2-c-10) |
| (II-69) | (b1-s-12) | (b2-c-1) |
| (II-70) | (b1-s-12) | (b2-c-10) |
| (II-71) | (b1-s-13) | (b2-c-1) |
| (II-72) | (b1-s-13) | (b2-c-10) |
| (II-73) | (b1-s-14) | (b2-c-1) |
| (II-74) | (b1-s-14) | (b2-c-10) |
| (II-75) | (b1-s-15) | (b2-c-1) |
| (II-76) | (b1-s-15) | (b2-c-10) |
| (II-77) | (b1-s-16) | (b2-c-1) |
| (II-78) | (b1-s-16) | (b2-c-10) |
| (II-79) | (b1-s-18) | (b2-c-1) |
| (II-80) | (b1-s-18) | (b2-c-10) |

TABLE 3

| Acid Generator | Anion | Cation |
|---|---|---|
| (II-81) | (b1-s-19) | (b2-c-1) |
| (II-82) | (b1-s-19) | (b2-c-10) |
| (II-83) | (b1-s-20) | (b2-c-1) |
| (II-84) | (b1-s-20) | (b2-c-10) |
| (II-85) | (b1-s-21) | (b2-c-1) |
| (II-86) | (b1-s-21) | (b2-c-10) |
| (II-87) | (b1-s-22) | (b2-c-1) |
| (II-88) | (b1-s-22) | (b2-c-10) |
| (II-89) | (b1-s-23) | (b2-c-1) |
| (II-90) | (b1-s-23) | (b2-c-10) |
| (II-91) | (b1-s-25) | (b2-c-1) |
| (II-92) | (b1-s-25) | (b2-c-10) |
| (II-93) | (b1-s-26) | (b2-c-1) |
| (II-94) | (b1-s-26) | (b2-c-10) |
| (II-95) | (b1-s-27) | (b2-c-1) |
| (II-96) | (b1-s-27) | (b2-c-10) |
| (II-97) | (b1-s-28) | (b2-c-1) |
| (II-98) | (b1-s-28) | (b2-c-10) |
| (II-99) | (b1-s-29) | (b2-c-1) |
| (II-100) | (b1-s-29) | (b2-c-10) |
| (II-101) | (b1-s-30) | (b2-c-1) |
| (II-102) | (b1-s-30) | (b2-c-10) |

TABLE 4

| Acid Generator | Anion | Cation |
|---|---|---|
| (II-103) | (b1-s-31) | (b2-c-1) |
| (II-104) | (b1-s-31) | (b2-c-2) |
| (II-105) | (b1-s-31) | (b2-c-6) |
| (II-106) | (b1-s-31) | (b2-c-10) |
| (II-107) | (b1-s-31) | (b2-c-12) |
| (II-108) | (b1-s-31) | (b2-c-15) |
| (II-109) | (b1-s-31) | (b2-c-21) |
| (II-110) | (b1-s-31) | (b2-c-23) |
| (II-111) | (b1-s-32) | (b2-c-1) |
| (II-112) | (b1-s-32) | (b2-c-2) |
| (II-113) | (b1-s-32) | (b2-c-6) |
| (II-114) | (b1-s-32) | (b2-c-10) |
| (II-115) | (b1-s-32) | (b2-c-12) |
| (II-116) | (b1-s-32) | (b2-c-15) |
| (II-117) | (b1-s-32) | (b2-c-21) |
| (II-118) | (b1-s-32) | (b2-c-23) |
| (II-119) | (b1-s-34) | (b2-c-1) |
| (II-120) | (b1-s-34) | (b2-c-2) |
| (II-121) | (b1-s-34) | (b2-c-6) |
| (II-122) | (b1-s-34) | (b2-c-10) |

TABLE 4-continued

| Acid Generator | Anion | Cation |
|---|---|---|
| (II-123) | (b1-s-34) | (b2-c-12) |
| (II-124) | (b1-s-34) | (b2-c-15) |
| (II-125) | (b1-s-34) | (b2-c-21) |
| (II-126) | (b1-s-34) | (b2-c-23) |
| (II-127) | (b1-s-35) | (b2-c-1) |
| (II-128) | (b1-s-35) | (b2-c-2) |
| (II-129) | (b1-s-35) | (b2-c-6) |
| (II-130) | (b1-s-35) | (b2-c-10) |
| (II-131) | (b1-s-35) | (b2-c-12) |
| (II-132) | (b1-s-35) | (b2-c-15) |
| (II-133) | (b1-s-35) | (b2-c-21) |
| (II-134) | (b1-s-35) | (b2-c-23) |

TABLE 5

| Acid Generator | Anion | Cation |
|---|---|---|
| (II-135) | (b1-s-37) | (b2-c-1) |
| (II-136) | (b1-s-37) | (b2-c-2) |
| (II-137) | (b1-s-37) | (b2-c-6) |
| (II-138) | (b1-s-37) | (b2-c-10) |
| (II-139) | (b1-s-37) | (b2-c-12) |
| (II-140) | (b1-s-37) | (b2-c-15) |
| (II-141) | (b1-s-37) | (b2-c-21) |
| (II-142) | (b1-s-37) | (b2-c-23) |
| (II-143) | (b1-s-38) | (b2-c-1) |
| (II-144) | (b1-s-38) | (b2-c-2) |
| (II-145) | (b1-s-38) | (b2-c-6) |
| (II-146) | (b1-s-38) | (b2-c-10) |
| (II-147) | (b1-s-38) | (b2-c-12) |
| (II-148) | (b1-s-38) | (b2-c-15) |
| (II-149) | (b1-s-38) | (b2-c-21) |
| (II-150) | (b1-s-38) | (b2-c-23) |
| (II-151) | (b1-s-49) | (b2-c-1) |
| (II-152) | (b1-s-49) | (b2-c-2) |
| (II-153) | (b1-s-49) | (b2-c-6) |
| (II-154) | (b1-s-49) | (b2-c-10) |
| (II-155) | (b1-s-49) | (b2-c-12) |
| (II-156) | (b1-s-49) | (b2-c-15) |
| (II-157) | (b1-s-49) | (b2-c-21) |
| (II-158) | (b1-s-49) | (b2-c-23) |
| (II-159) | (b1-s-50) | (b2-c-1) |
| (II-160) | (b1-s-50) | (b2-c-2) |
| (II-161) | (b1-s-50) | (b2-c-6) |
| (II-162) | (b1-s-50) | (b2-c-10) |
| (II-163) | (b1-s-50) | (b2-c-12) |
| (II-164) | (b1-s-50) | (b2-c-15) |
| (II-165) | (b1-s-50) | (b2-c-21) |
| (II-166) | (b1-s-50) | (b2-c-23) |

TABLE 6

| Acid Generator | Anion | Cation |
|---|---|---|
| (II-167) | (b1-s-51) | (b2-c-1) |
| (II-168) | (b1-s-51) | (b2-c-2) |
| (II-169) | (b1-s-51) | (b2-c-6) |
| (II-170) | (b1-s-51) | (b2-c-10) |
| (II-171) | (b1-s-51) | (b2-c-12) |
| (II-172) | (b1-s-51) | (b2-c-15) |
| (II-173) | (b1-s-51) | (b2-c-21) |
| (II-174) | (b1-s-51) | (b2-c-23) |
| (II-175) | (b1-s-52) | (b2-c-1) |
| (II-176) | (b1-s-52) | (b2-c-2) |
| (II-177) | (b1-s-52) | (b2-c-6) |
| (II-178) | (b1-s-52) | (b2-c-10) |
| (II-179) | (b1-s-52) | (b2-c-12) |
| (II-180) | (b1-s-52) | (b2-c-15) |
| (II-181) | (b1-s-52) | (b2-c-21) |
| (II-182) | (b1-s-52) | (b2-c-23) |

TABLE 6-continued

| Acid Generator | Anion | Cation |
|---|---|---|
| (II-183) | (b1-s-54) | (b2-c-1) |
| (II-184) | (b1-s-54) | (b2-c-2) |
| (II-185) | (b1-s-54) | (b2-c-6) |
| (II-186) | (b1-s-54) | (b2-c-10) |
| (II-187) | (b1-s-54) | (b2-c-12) |
| (II-188) | (b1-s-54) | (b2-c-15) |
| (II-189) | (b1-s-54) | (b2-c-21) |
| (II-190) | (b1-s-54) | (b2-c-23) |
| (II-191) | (b1-s-55) | (b2-c-1) |
| (II-192) | (b1-s-55) | (b2-c-2) |
| (II-193) | (b1-s-55) | (b2-c-6) |
| (II-194) | (b1-s-55) | (b2-c-10) |
| (II-195) | (b1-s-55) | (b2-c-12) |
| (II-196) | (b1-s-55) | (b2-c-15) |
| (II-197) | (b1-s-55) | (b2-c-21) |
| (II-198) | (b1-s-55) | (b2-c-23) |

TABLE 7

| Acid Generator | Anion | Cation |
|---|---|---|
| (II-199) | (b1-s-61) | (b2-c-1) |
| (II-200) | (b1-s-61) | (b2-c-10) |
| (II-201) | (b1-s-62) | (b2-c-1) |
| (II-202) | (b1-s-62) | (b2-c-10) |
| (II-203) | (b1-s-63) | (b2-c-1) |
| (II-204) | (b1-s-63) | (b2-c-10) |
| (II-205) | (b1-s-64) | (b2-c-1) |
| (II-206) | (b1-s-64) | (b2-c-10) |
| (II-207) | (b1-s-66) | (b2-c-1) |
| (II-208) | (b1-s-66) | (b2-c-10) |
| (II-209) | (b1-s-67) | (b2-c-1) |
| (II-210) | (b1-s-67) | (b2-c-10) |
| (II-211) | (b1-s-68) | (b2-c-1) |
| (II-212) | (b1-s-68) | (b2-c-10) |
| (II-213) | (b1-s-71) | (b2-c-1) |
| (II-214) | (b1-s-71) | (b2-c-10) |
| (II-215) | (b1-s-72) | (b2-c-1) |
| (II-216) | (b1-s-72) | (b2-c-10) |
| (II-217) | (b1-s-73) | (b2-c-1) |
| (II-218) | (b1-s-73) | (b2-c-10) |
| (II-219) | (b1-s-74) | (b2-c-1) |
| (II-220) | (b1-s-74) | (b2-c-10) |
| (II-221) | (b1-s-76) | (b2-c-1) |
| (II-222) | (b1-s-76) | (b2-c-10) |
| (II-223) | (b1-s-77) | (b2-c-1) |
| (II-224) | (b1-s-77) | (b2-c-10) |
| (II-225) | (b1-s-78) | (b2-c-1) |
| (II-226) | (b1-s-78) | (b2-c-10) |

More preferable examples of the salt (II-0) include salts below.

(II-17)

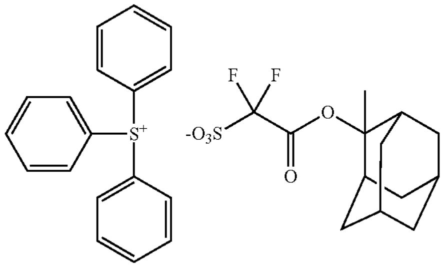

-continued (II-1)

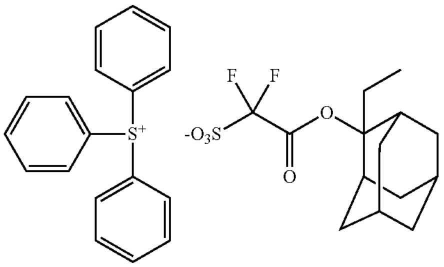

(II-25)

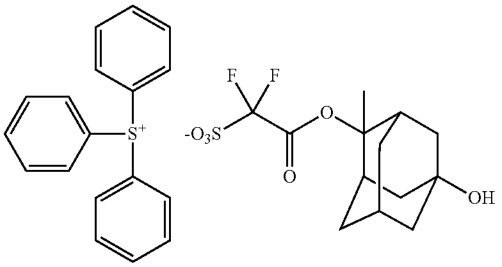

(II-9)

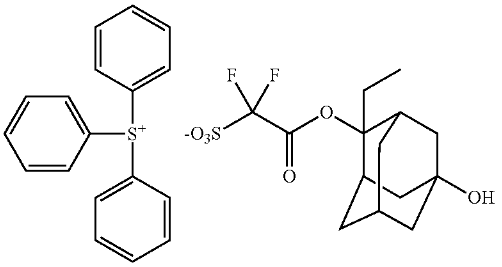

(II-33)

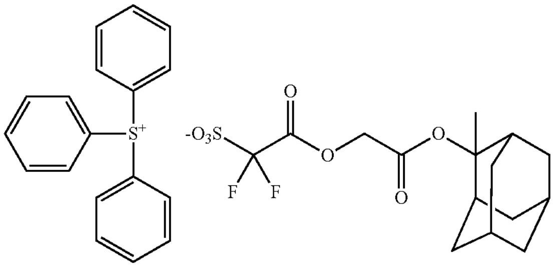

(II-41)

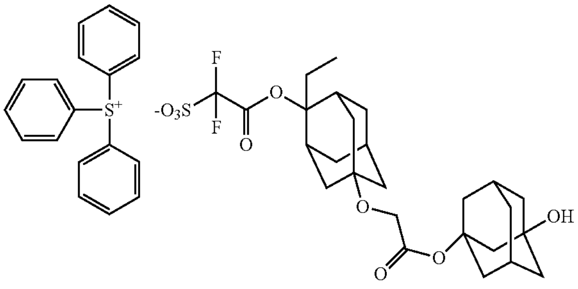

-continued
(II-49)
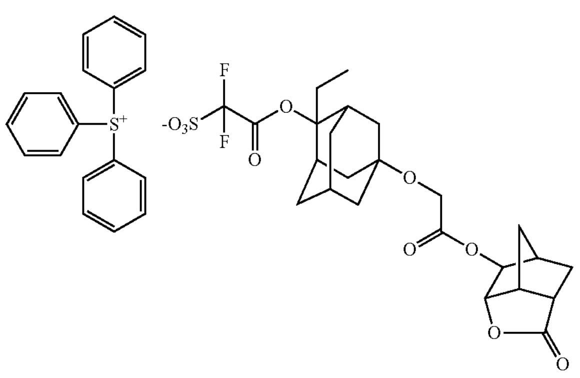
(II-103)
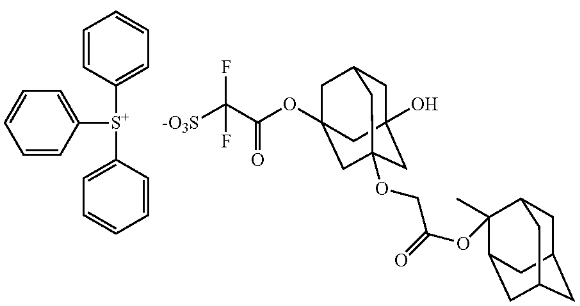
(II-114)
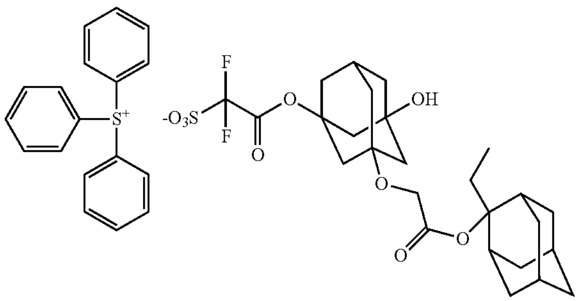
(II-119)
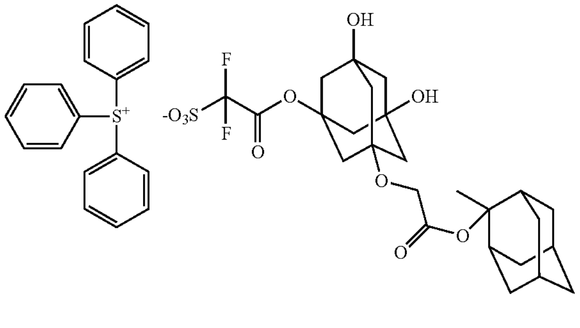
-continued
(II-127)
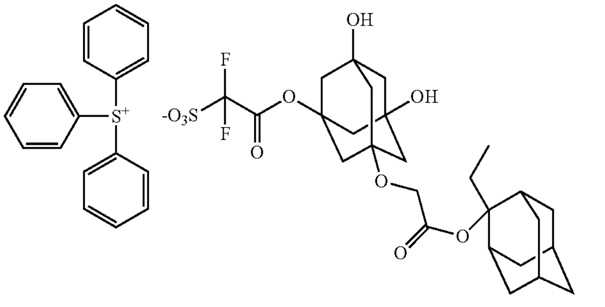
(II-135)
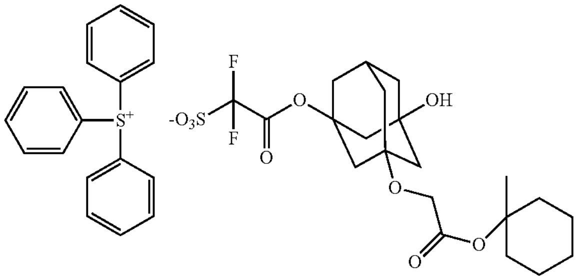
(II-143)
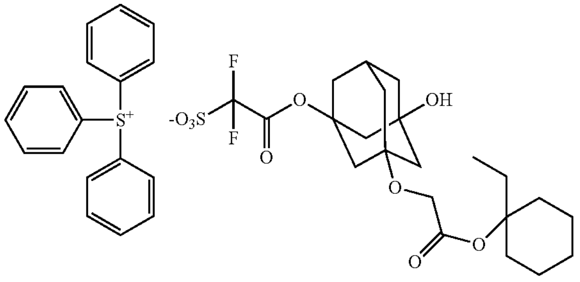
(II-151)
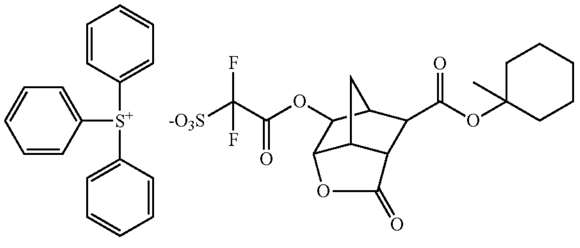
(II-159)
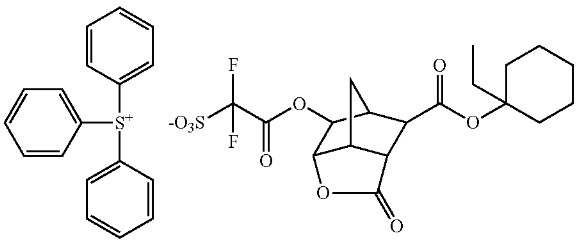

-continued
(II-167)
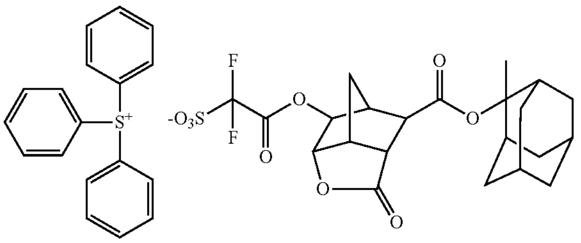
(II-175)
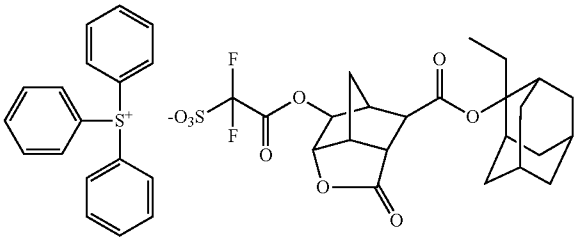
(II-183)
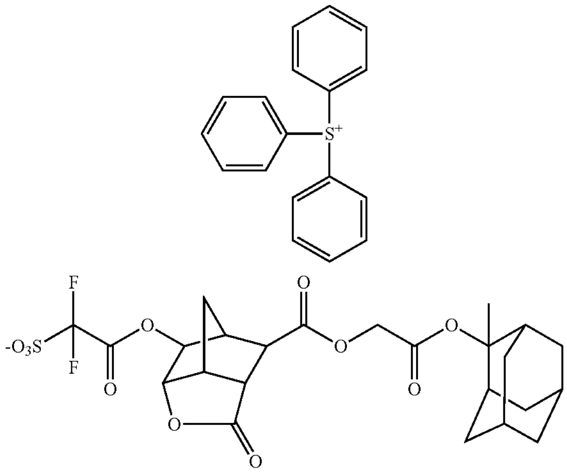
(II-191)
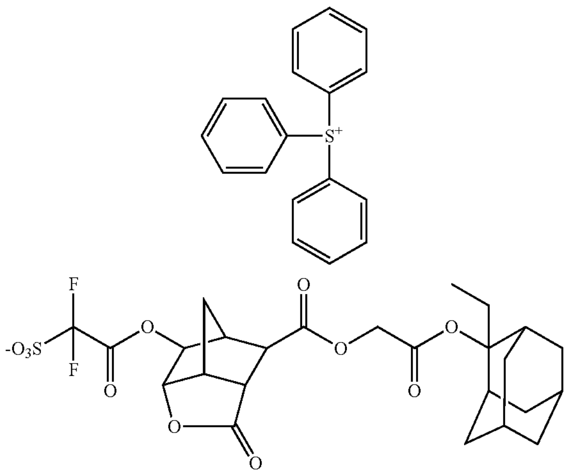
-continued
(II-199)
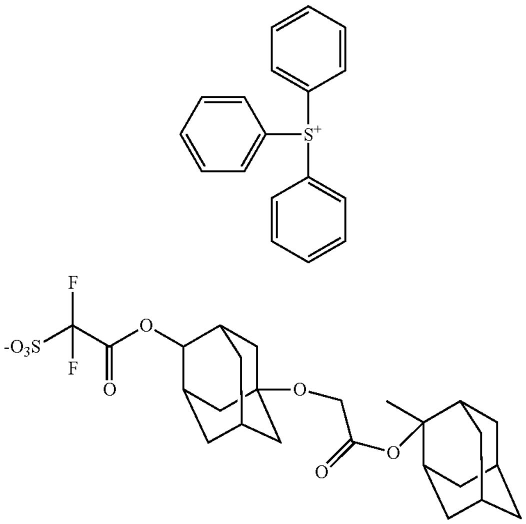
(II-201)
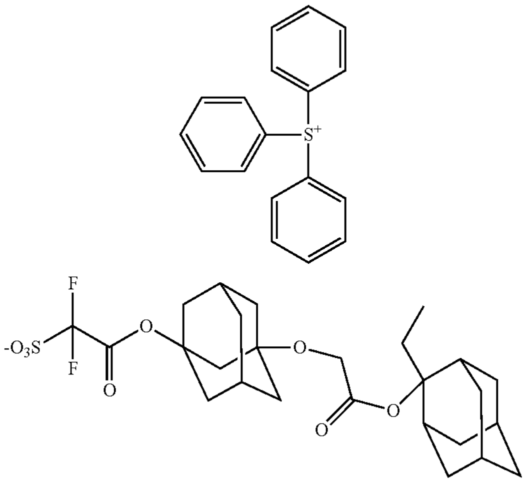
(II-203)
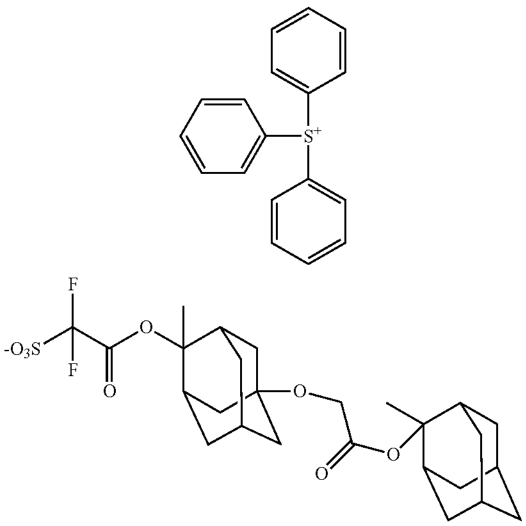

-continued
(II-205)
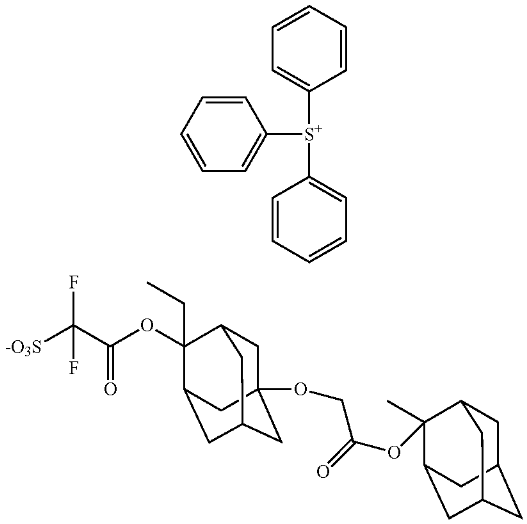
(II-207)
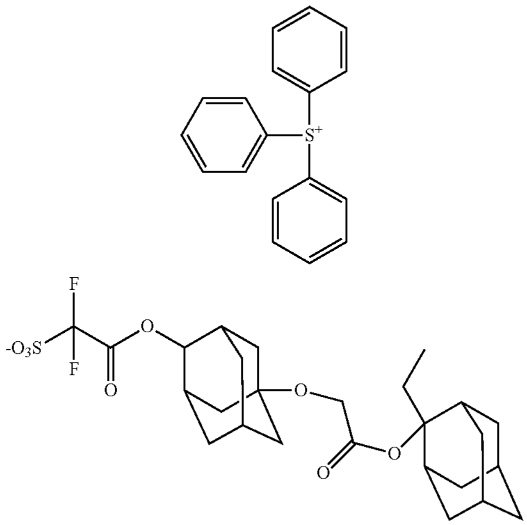
(II-209)
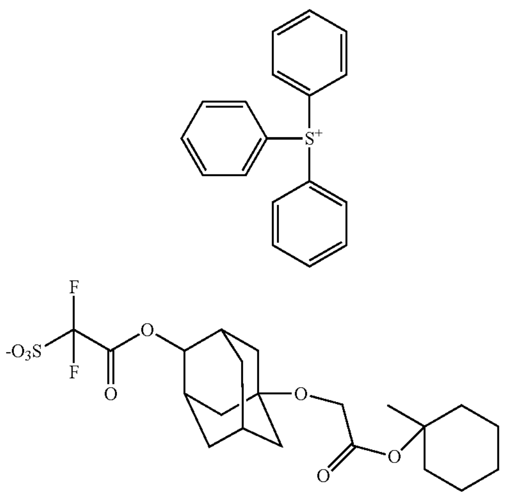
-continued
(II-211)
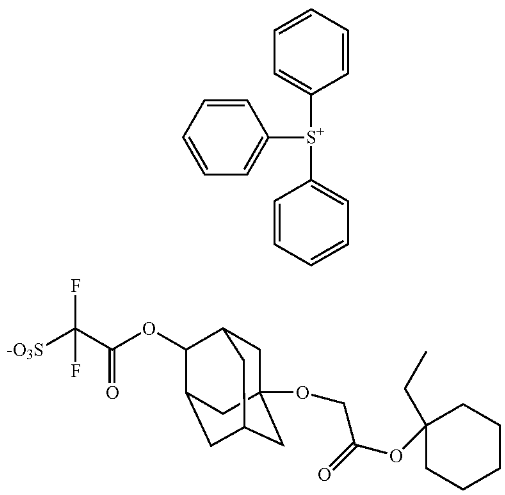
(II-213)
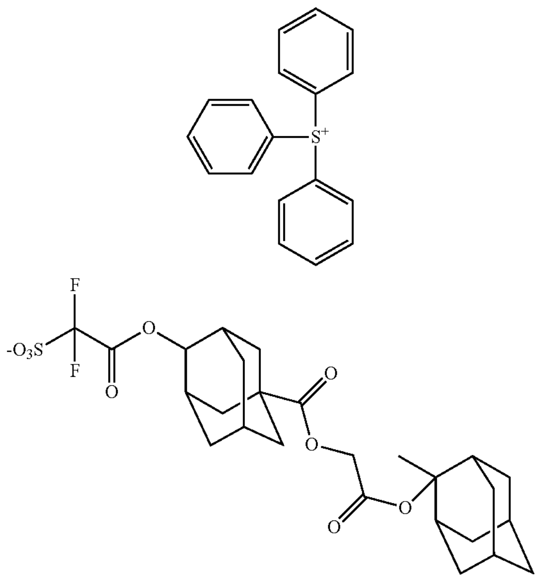
(II-215)
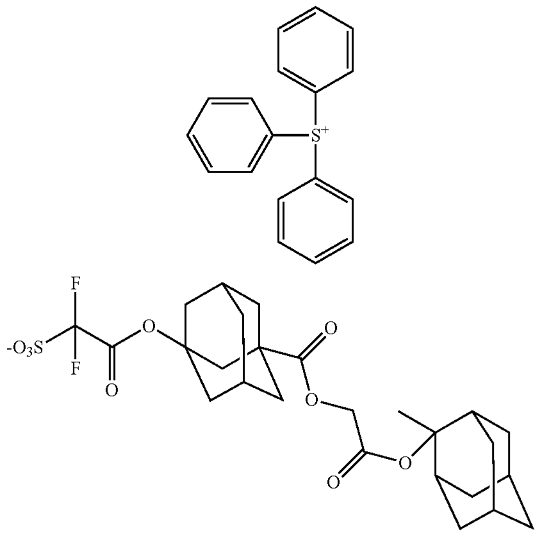

-continued
(II-217)
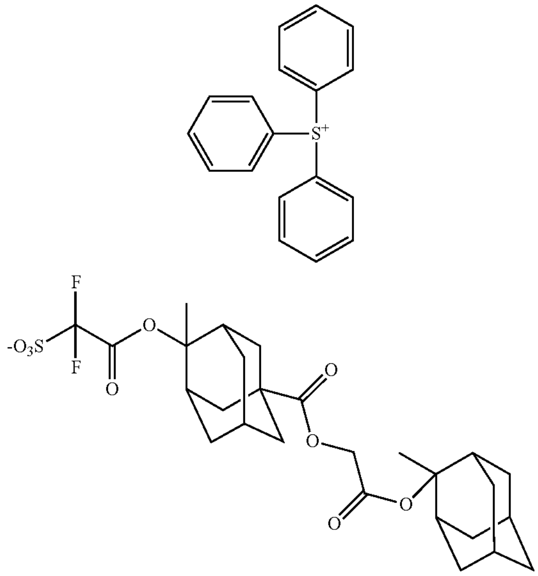
(II-219)
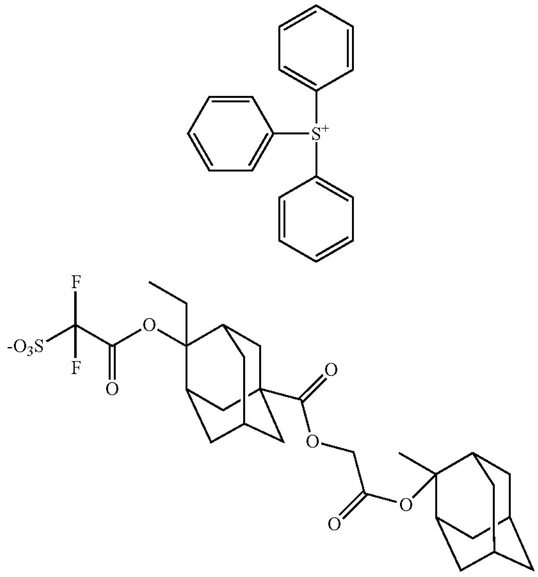
-continued
(II-221)
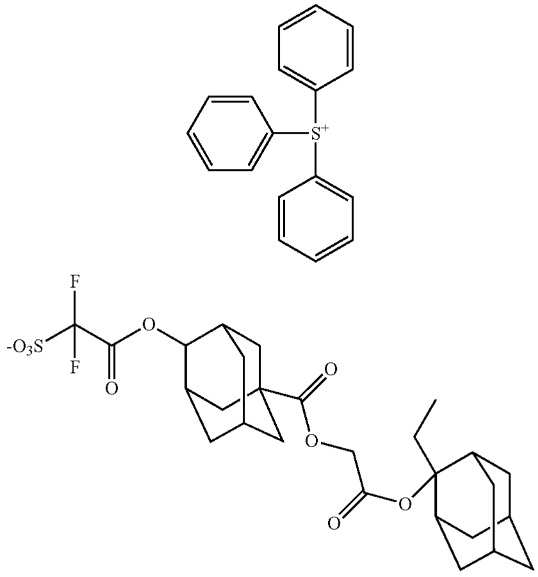
(II-223)
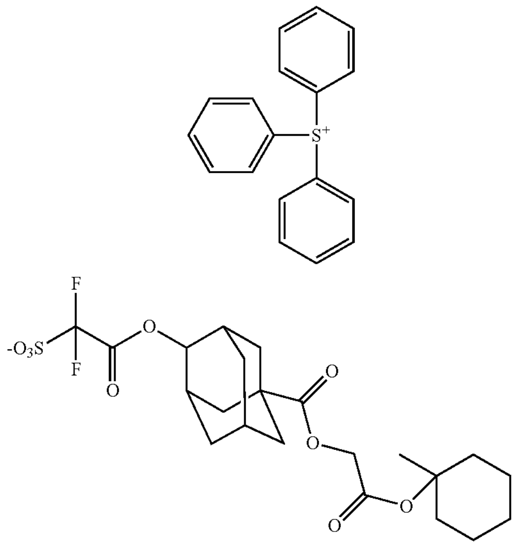

-continued
(II-225)
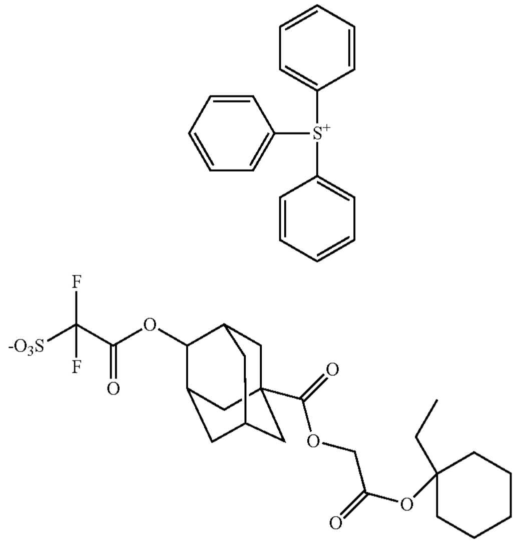
(II-20)
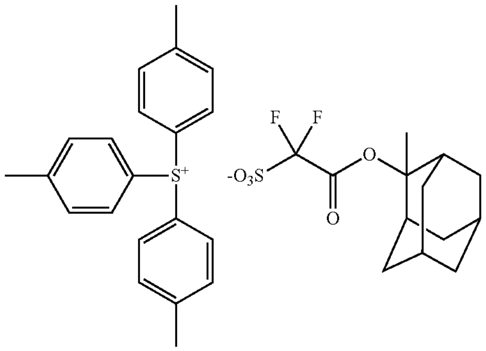
(II-4)
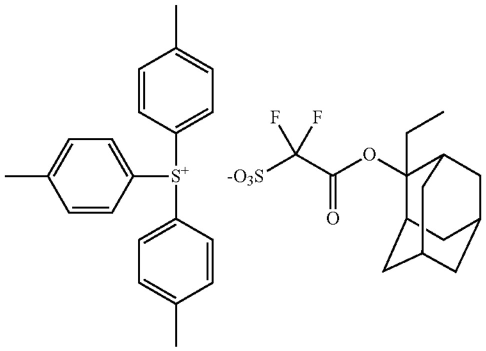
-continued
(II-28)
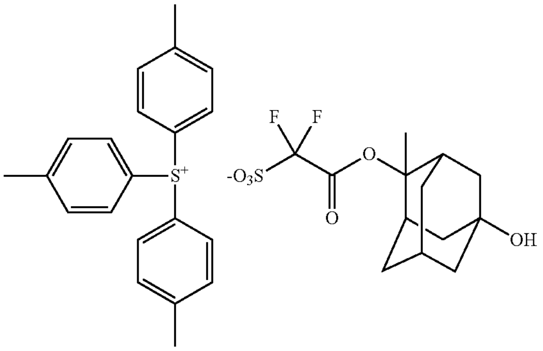
(II-12)
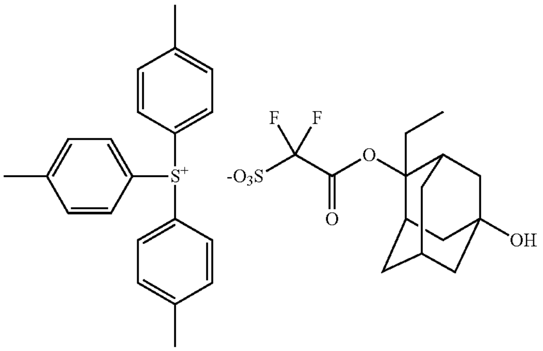
(II-36)
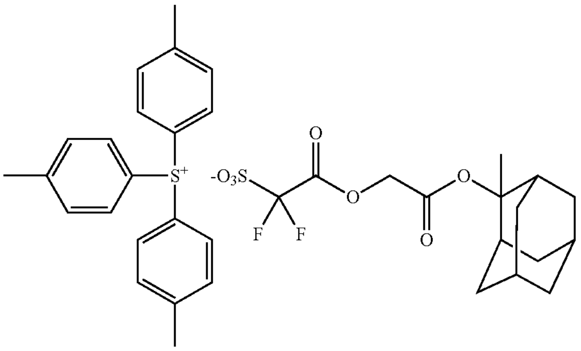
(II-44)
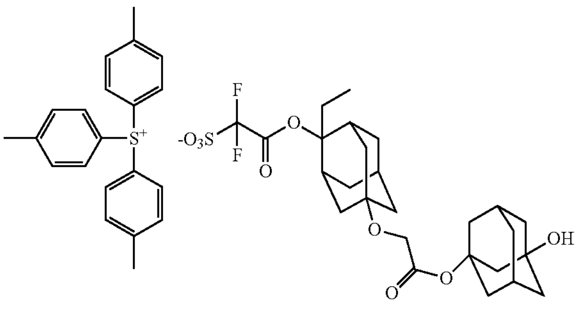

-continued
(II-52)
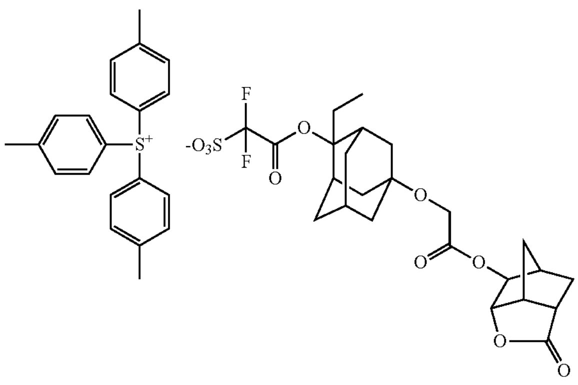
(II-106)
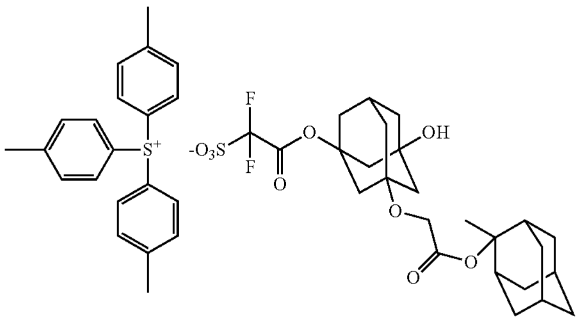
(II-117)
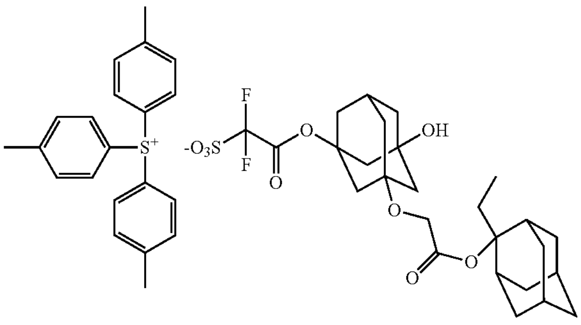
(II-122)
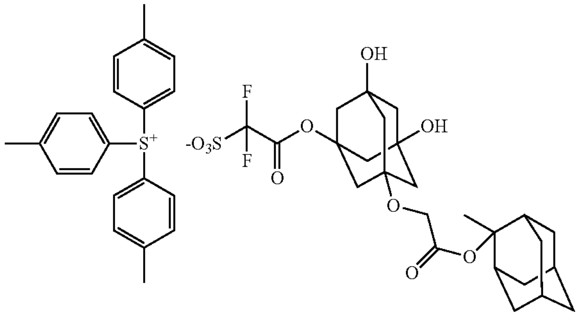
-continued
(II-130)
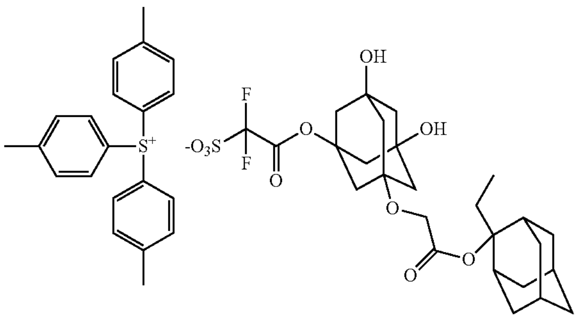
(II-138)
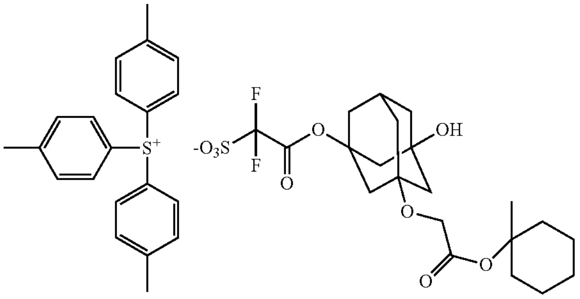
(II-146)
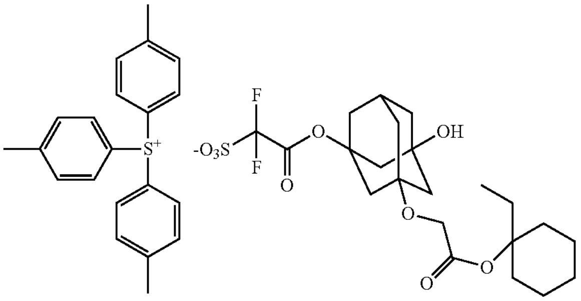
(II-154)
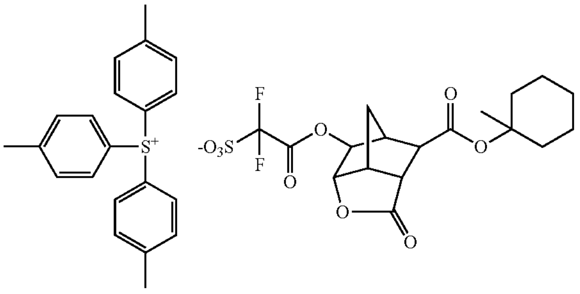
(II-162)
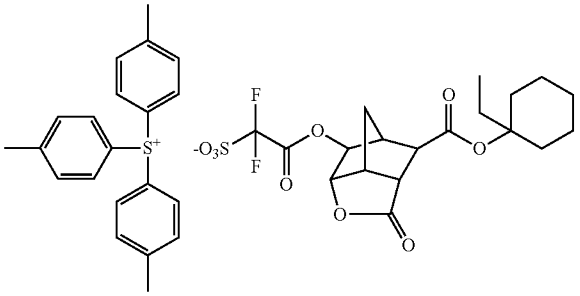

-continued
(II-170)
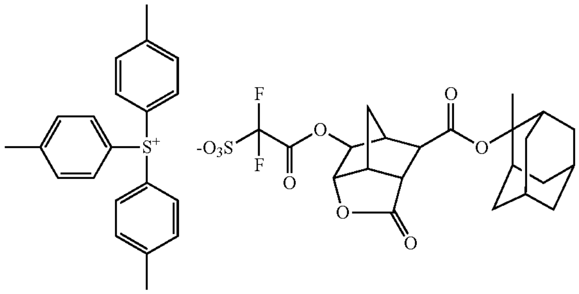
(II-178)
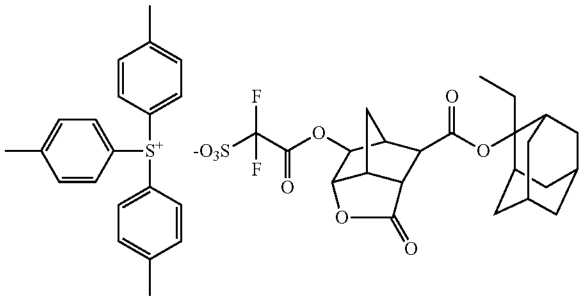
(II-186)
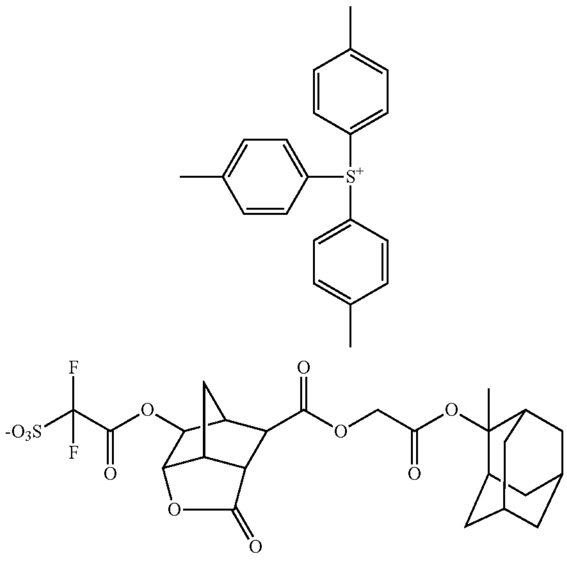
-continued
(II-194)
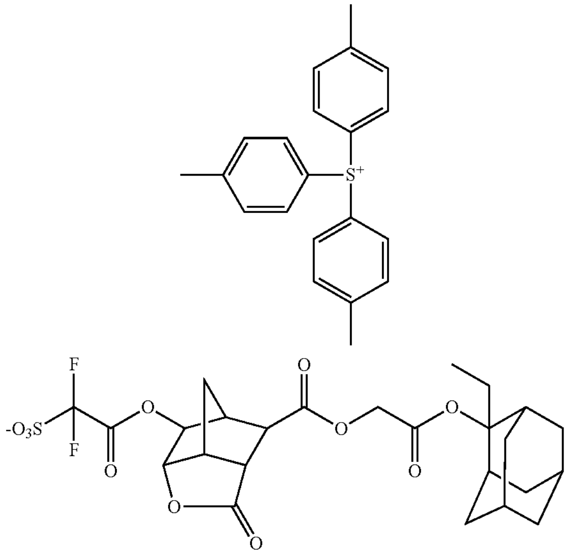
(II-200)
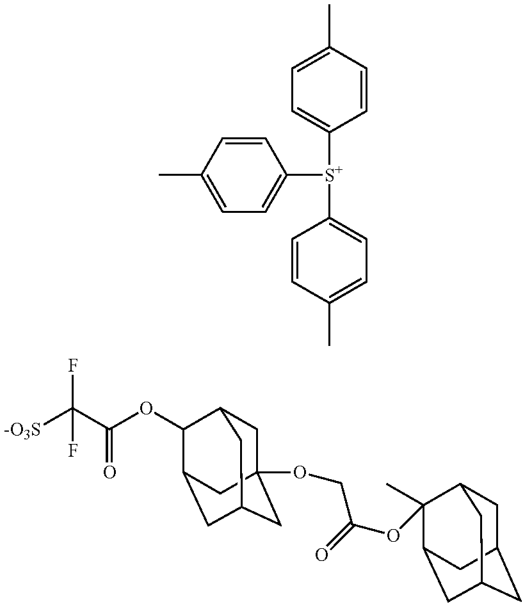

-continued
(II-202)
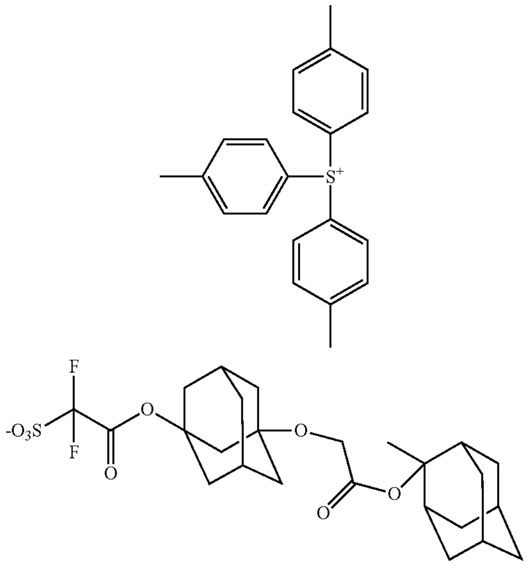
(II-204)
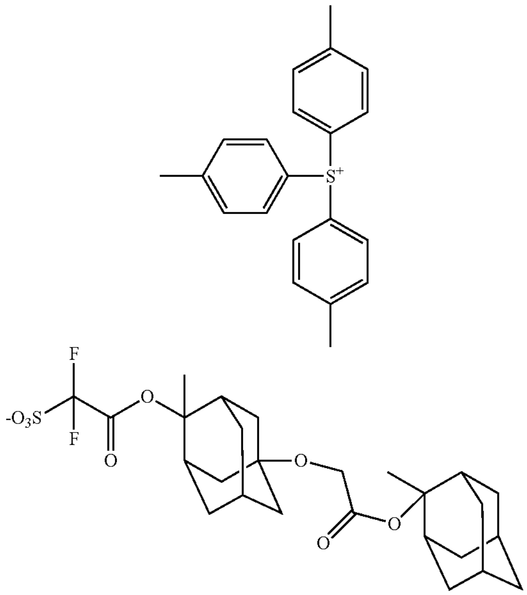
-continued
(II-206)
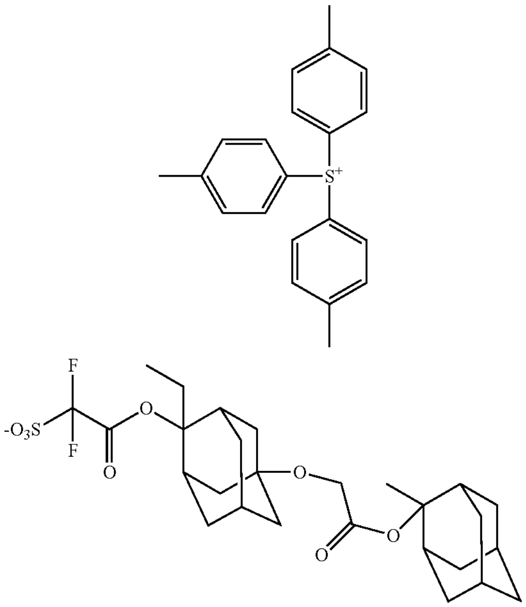
(II-208)
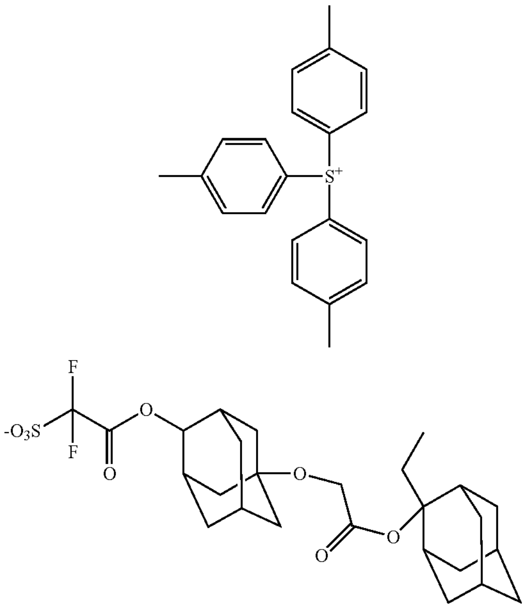

-continued
(II-210)
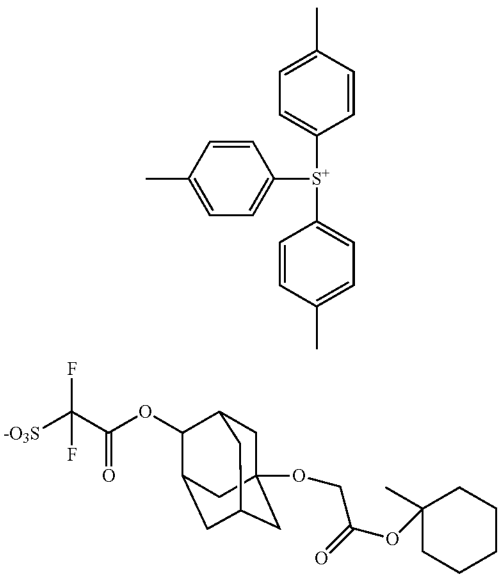
(II-212)
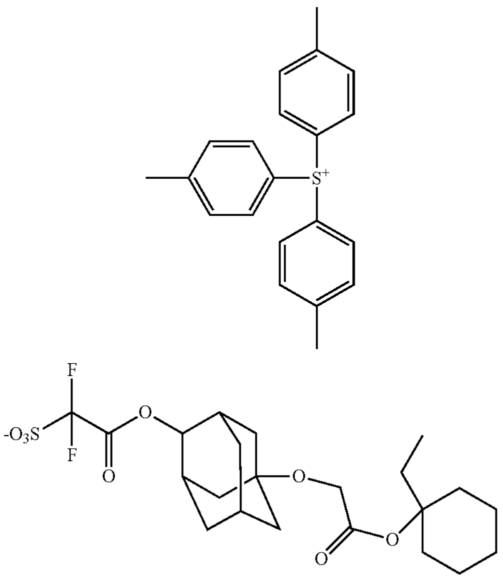
-continued
(II-214)
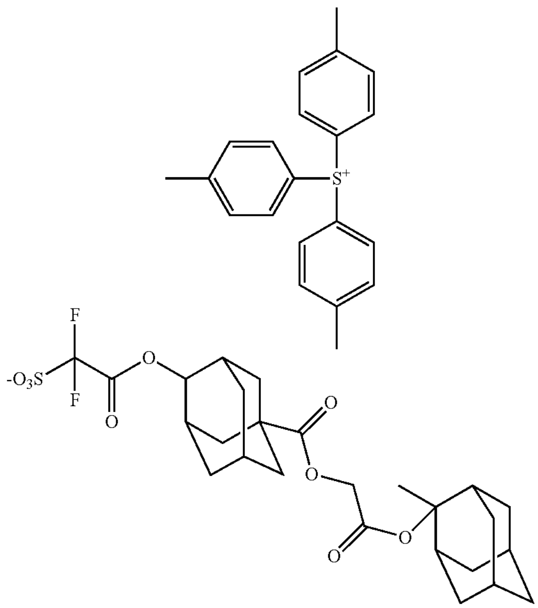
(II-216)
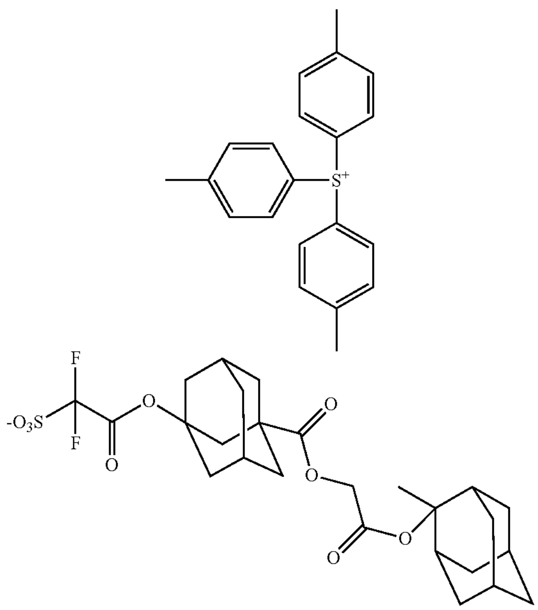

-continued
(II-218)
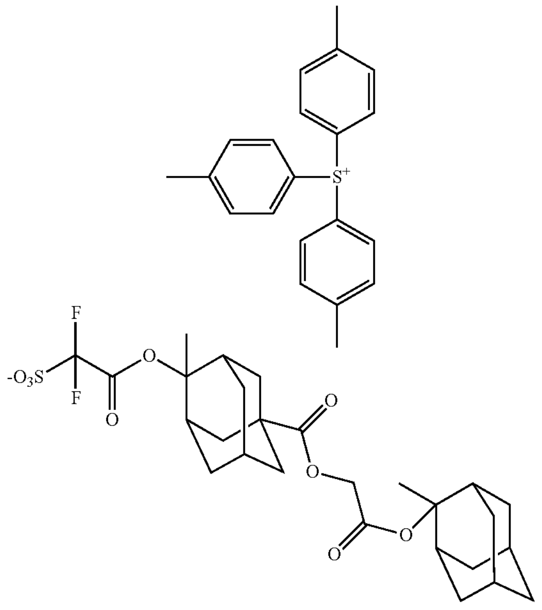
(II-220)
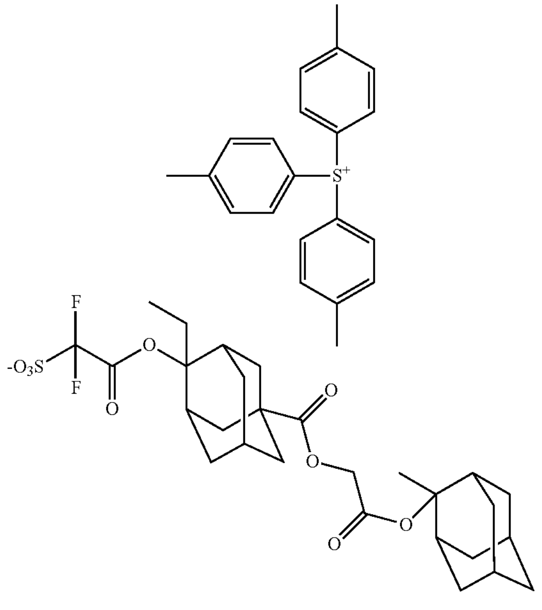
-continued
(II-222)
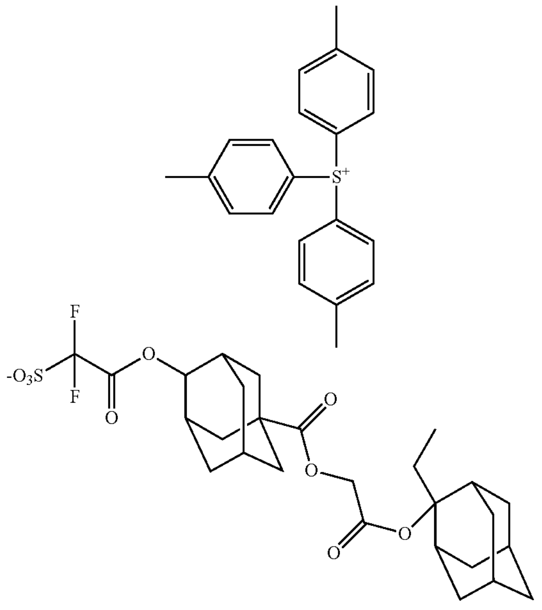
(II-224)
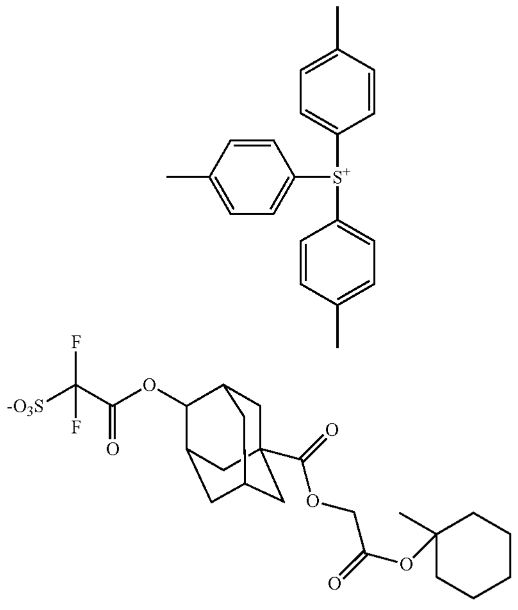

-continued (II-226)

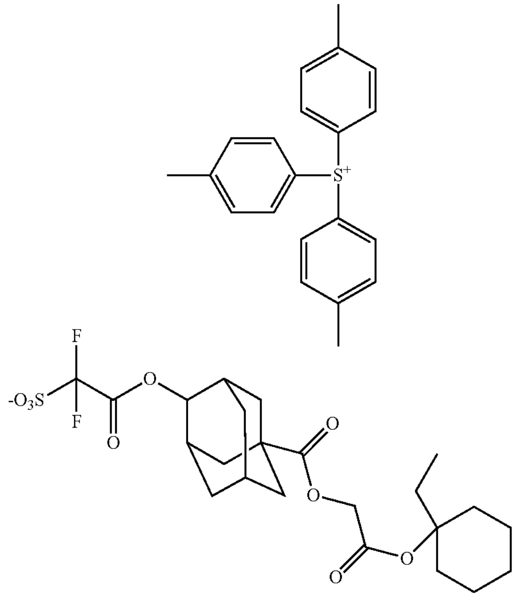

The group represented by the formula (IIa) contained in the acid generator preferably decomposes by the action of the acid and occurs a carboxylic acid.

The acid generator having the group represented by the formula (IIa) can be determined if the group represented by the formula (IIa) decomposes by the action of the acid and converts into an alkali-soluble group, by dissolving the acid generator having the group represented by the formula (IIa) in a solvent, adding an acid to thus obtained solution, and heating it. When decomposition occurs, the group represented by the formula (IIa) converts a carboxylic acid and a vinyl compound. Preferred examples of the solvent include dimethylformamide. Preferred examples of the acid include hydrochloride.

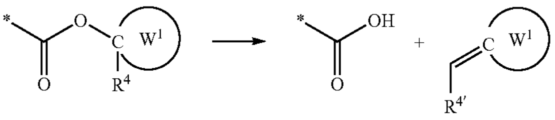

(IIa)

wherein $R^4$ and ring $W^1$ have the same definition of the above, $R^{4'}$ represents a hydrogen atom or a $C_1$ to $C_{11}$ hydrocarbon group.

The salt represented by the formula (II-0) can be produced by methods described as or according to below (a) to (f). In the formulae below, the groups have the same definition of the above.

(a) A salt represented by the formula (II-1A) in which $L^1$ in the formula (II) is a single bond can be produced by reacting a compound represented by the formula (II-1-a) with a compound represented by the formula (II-1-b) in presence of a basic catalyst in a solvent.

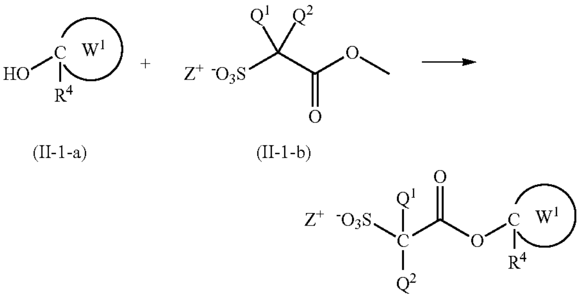

(II-1-a) (II-1-b)

(II-1A)

Preferred examples of the solvent include chloroform. Preferred examples of the basic catalyst include lithium amide.

The compound (II-1-b) can be produced by a method described in JP2008-13551A.

(b) A salt represented by the formula (II-2A) in which $L^1$ in the formula (II) is —CO—O—$CH_2$— can be produced as follows.

A compound represented by the formula (II-2-d) can be obtained by reacting a compound represented by the formula (II-2-a) with a compound represented by the formula (II-2-c) in presence of a basic catalyst in a solvent. Preferred examples of the solvent include tetrahydrofuran. Preferred examples of the basic catalyst include pyridine.

Then, the compound represented by the formula (II-2A) can be obtained by reacting a compound represented by the formula (II-1-b) with a compound represented by the formula (II-2-d) in presence of a basic catalyst in a solvent. Preferred examples of the solvent include chloroform. Preferred examples of the basic catalyst include lithium amide.

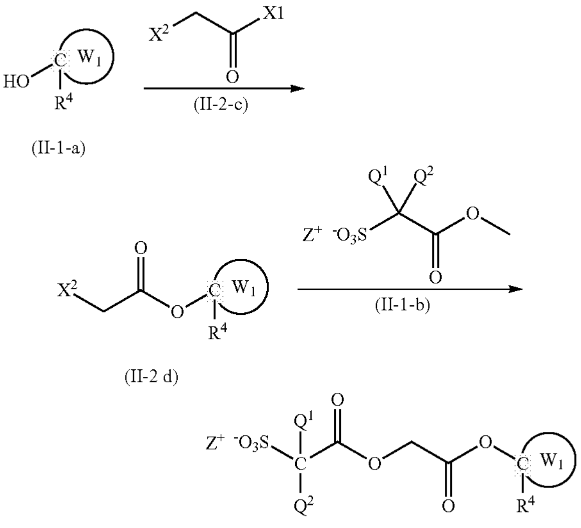

(II-1-a)

(II-2 d)

(II-2A)

wherein $X^1$ and $X^2$ independently represent a halogen atom.

Example of the halogen atom is a chlorine atom, a fluorine atom and bromine atom, and chlorine atom is preferable.

(c) A salt represented by the formula (II-3A) in which $L^1$ in the formula (II) is a single bond, the substituent of ring $W^1$ is a group represented by the formula (II-4) and $L^3$ is *—O-$L^7$-CO—O— (* represents a bond to ring $W^1$) can be produced as follows.

(II-3A)

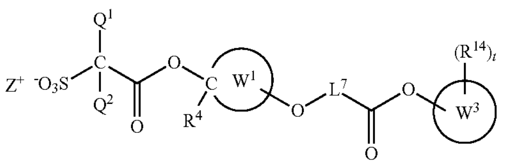

A compound represented by the formula (b1-c) can be obtained by reacting a compound represented by the formula (b1-a) with a compound represented by the formula (b1-b) in presence of a basic catalyst in a solvent. Preferred examples of the solvent include tetrahydrofuran. Preferred examples of the basic catalyst include pyridine.

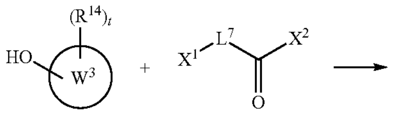

(b1-a) (b1-b)

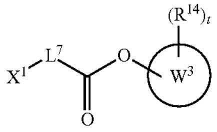

(b1-c)

Then, a compound represented by the formula (b1-e) can be obtained by reacting a compound represented by the formula (b1-c) with a compound represented by the formula (b1-d) in presence of a catalyst in a solvent. Preferred examples of the solvent include dimethylformamide. Preferred examples of the catalyst include potassium carbonate and potassium iodide.

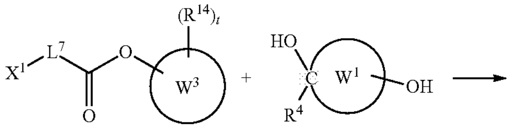

(b1-c) (b1-d)

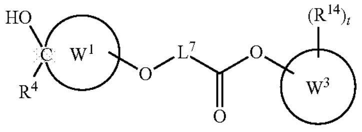

(b1-e)

The compound represented by the formula (II-3A) can be obtained by reacting a compound represented by the formula (b1-e) with a salt represented by the formula (b1-f) in presence of a catalyst in a solvent. Preferred examples of the solvent include monochlorobenzene. Preferred examples of the catalyst include sulfuric acid.

The salt represented by the formula (b1-f) can be formed by a method described in JP2008-127367A.

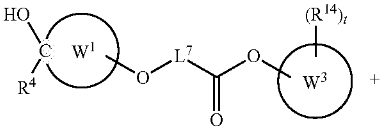

(b1-e)

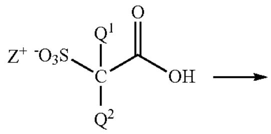

(b1-f)

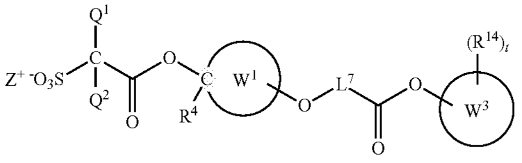

(II-3A)

(d) A salt represented by the formula (II-0A) can be produced by the following method.

(II-0A)

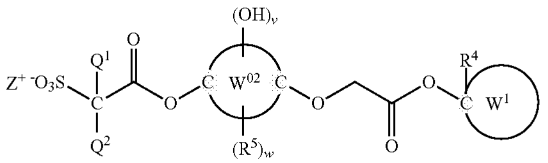

The salt represented by the formula (II-0A) can be produced by reacting a compound represented by the formula (II-0A-a) with a compound represented by the formula (II-0A-b) in presence of a basic catalyst in a solvent. Preferred examples of the solvent include tetrahydrofuran. Preferred examples of the basic catalyst include pyridine.

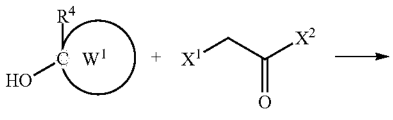

(II-0A-a) (II-0A-b)

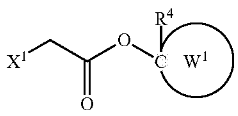

(II-0A-c)

wherein $X^1$ and $X^2$ independently represent a halogen atom.

As the halogen atom, chlorine atom is preferable.

Then, a compound represented by the formula (II-0A-e) can be obtained by reacting a compound represented by the formula (II-0A-c) with a compound represented by the formula (II-0A-d) in presence of a catalyst in a solvent. Preferred examples of the solvent include dimethylformamide. Preferred examples of the catalyst include potassium carbonate and potassium iodide.

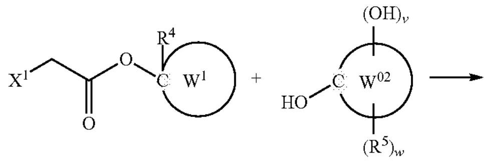

(II-0A-c) (II-0A-d)

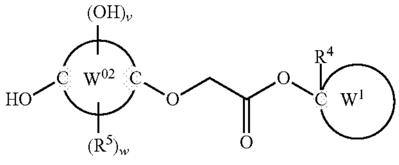

(II-0A-e)

A compound represented by the formula (II-0A-h) can be obtained by reacting a salt represented by the formula (II-0A-f) with a compound represented by the formula (II-0A-g). The salt represented by the formula (II-0A-f) can be obtained by a method described in JP2008-13551A.

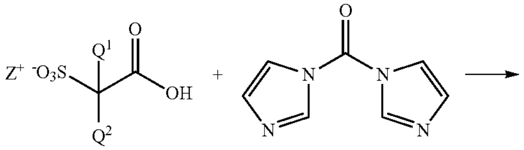

(II-0A-f) (II-0A-g)

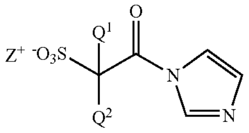

(II-0A-h)

The salt represented by the formula (II-0A) can be obtained by reacting a compound represented by the formula (II-0A-e) with a salt represented by the formula (II-0A-h) in a solvent. Preferred examples of the solvent include acetonitrile.

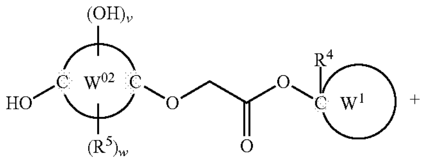

(II-0A-e)

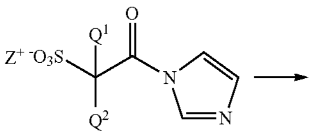

(II-0A-h)

-continued

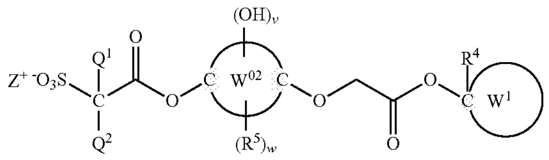

(II-0A)

(e) A salt represented by the formula (II-0B) can be produced by the following method.

(II-0B)

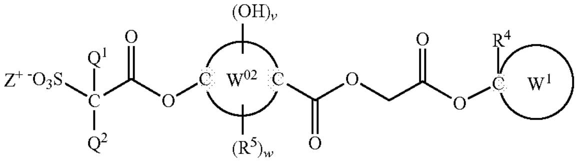

A compound represented by the formula (II-0B-e) can be obtained by reacting a compound represented by the formula (II-0A-c) with a compound represented by the formula (II-0B-d) in presence of a catalyst in a solvent. Preferred examples of the solvent include dimethylformamide. Preferred examples of the catalyst include potassium carbonate and potassium iodide.

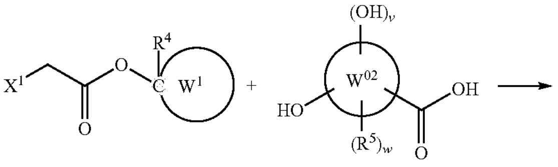

(II-0A-c) (II-0B-d)

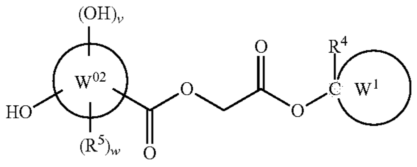

(II-0B-e)

A compound represented by the formula (II-0B-h) can be obtained by reacting a salt represented by the formula (II-0B-f) with a compound represented by the formula (II-0B-g). The salt represented by the formula (II-0B-f) can be obtained by a method described in JP2008-13551A.

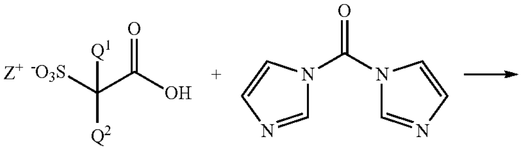

(II-0B-f) (II-0B-g)

-continued

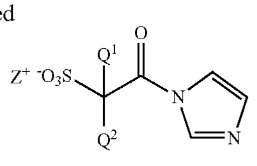

(II-0B-h)

The salt represented by the formula (II-0B) can be obtained by reacting a compound represented by the formula (II-0B-e) with a salt represented by the formula (II-0B-h) in a solvent. Preferred examples of the solvent include acetonitrile.

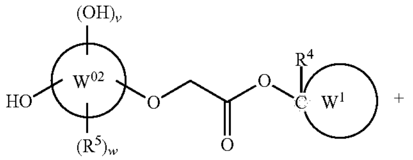

(II-0B-e)

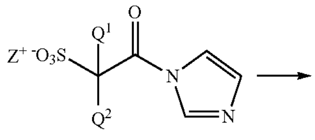

(II-0B-h)

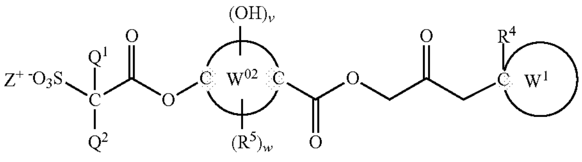

(II-0B)

(f) A salt represented by the formula (II-0C) can be produced by the following method.

(II-0C)

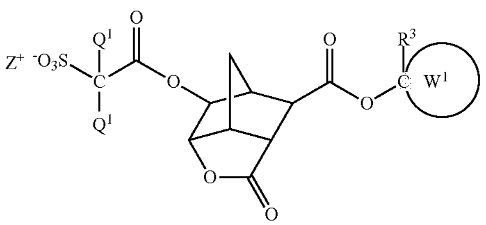

A compound represented by the formula (II-0C-c) can be obtained by reacting a compound represented by the formula (II-0C-a) with a compound represented by the formula (II-0C-b) in presence of a basic catalyst in a solvent. Preferred examples of the solvent include tetrahydrofuran. Preferred examples of the basic catalyst include dimethylamino pyridine.

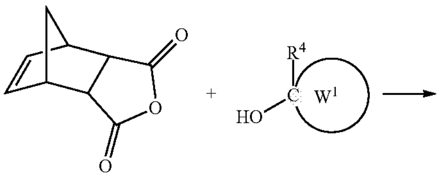

(II-0C-a) (II-0C-b)

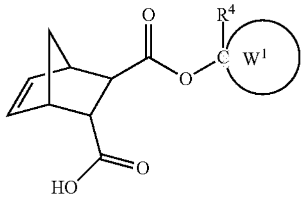

(II-0C-c)

Then, a compound represented by the formula (II-0C-d) can be obtained by intramolecula-reacting a compound represented by the formula (II-0C-c) in presence of a catalyst in a solvent. Preferred examples of the solvent include chloroform. Preferred examples of the catalyst include m-chloroperbenzoic acid.

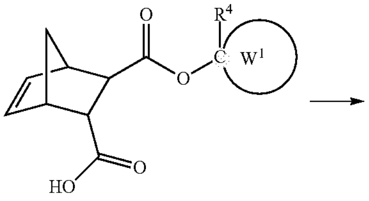

(II-0C-c)

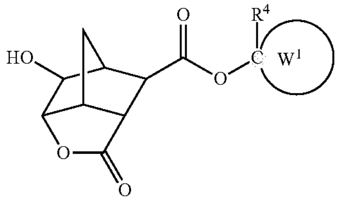

(II-0C-d)

The salt represented by the formula (II-0C) can be obtained by reacting a compound represented by the formula (II-0C-d) with a salt represented by the formula (II-0A-f) in presence of a catalyst in a solvent. Preferred examples of the solvent include chloroform. Preferred examples of the catalyst include lithium amide.

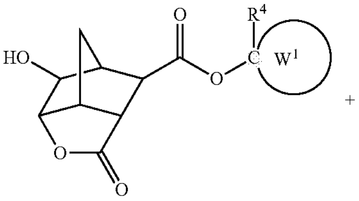

(II-0C-d)

-continued

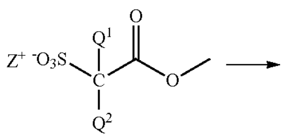

(II-0A-f)

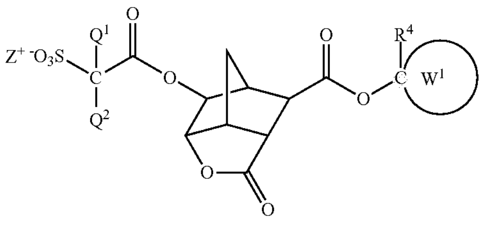

(II-0C)

When the salt represented by the formula (II-0) is used as the acid generator, the salt may be used as a single salt or as a combination of two or more salts.

The resist composition of the present invention may include one or more known salt for the acid generator other than the salt represented by the formula (II-0) as the acid generator. Examples of such salt include a salt which include the organic cation contained in the salt (II-0) and a known anion (an anion other than the sulfonic anion contained in the salt (II-0)) and a salt which include the sulfonic anion contained in the salt (II-0) and a known cation (a cation other that the cation contained in the salt (II-0).

Examples of the acid generator used together with the salt (II-0) include salts represented by the formula (B1-1) to the formula (B1-17). Among these, a salt which contains triphenyl sulfonium cation or tritolyl sulfonium cation are preferable, salts represented by the formulae (B1-1), (B1-2), (B1-3), (B1-6), (B1-7), (B1-11), (B1-12), (B1-13) and (B1-14) are more preferable.

(B1-1)

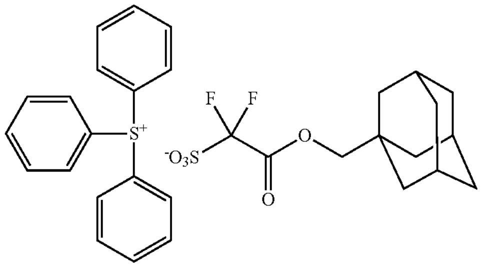

(B1-2)

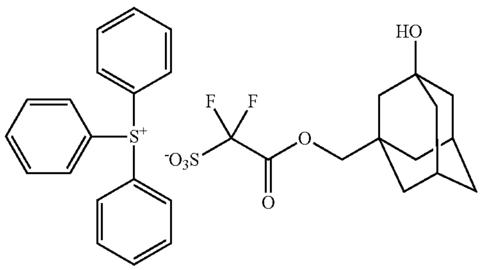

-continued (B1-3)

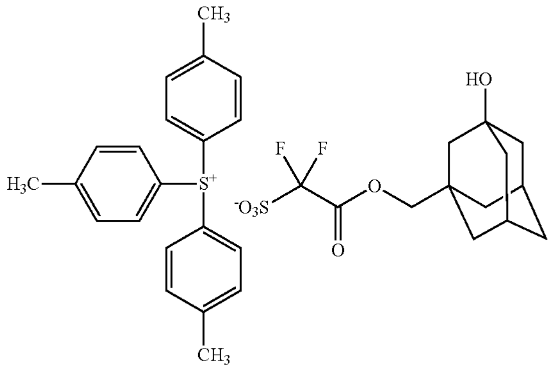

(B1-4)

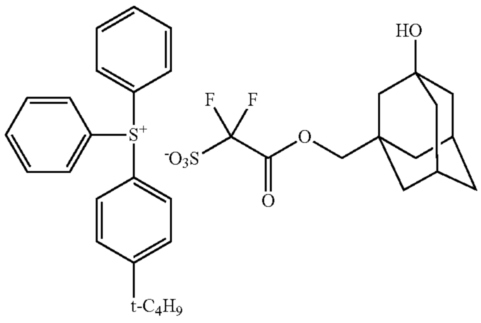

(B1-5)

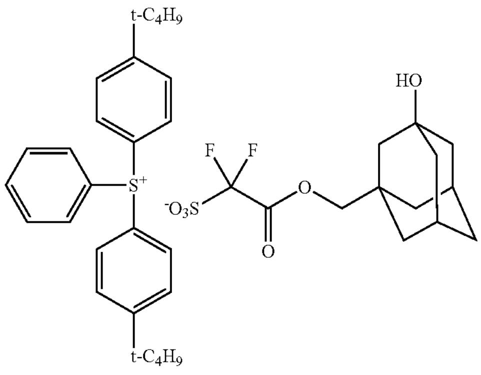

(B1-6)

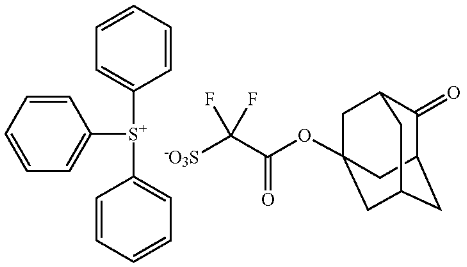

-continued
(B1-7)
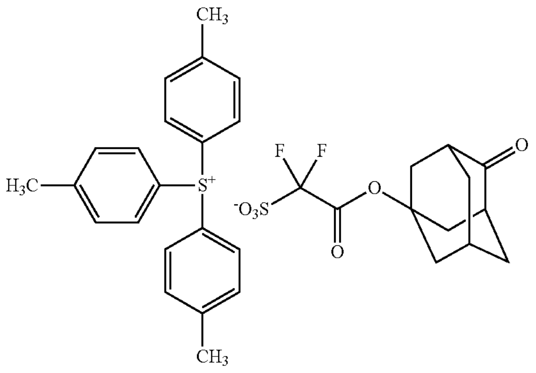
(B1-8)
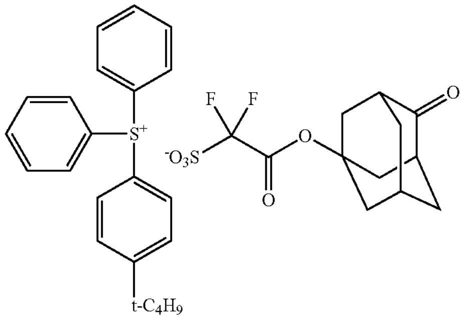
(B1-9)
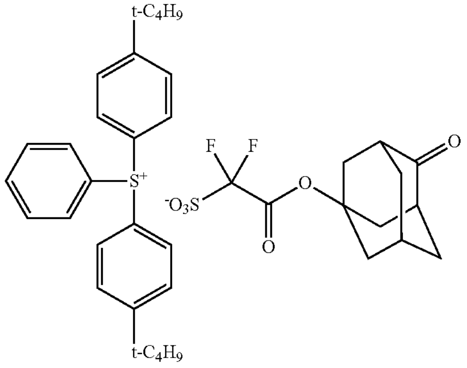
(B1-10)
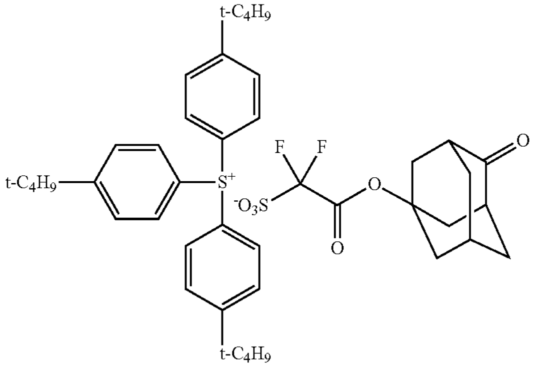
-continued
(B1-11)
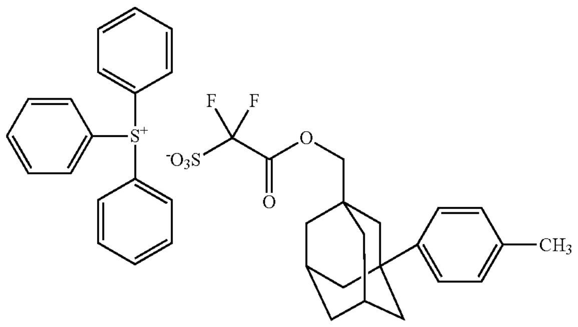
(B1-12)
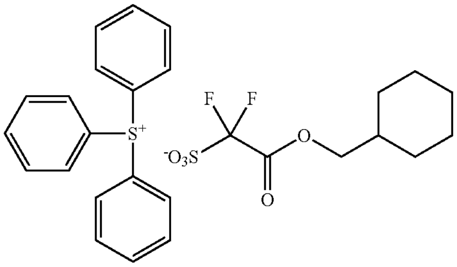
(B1-13)
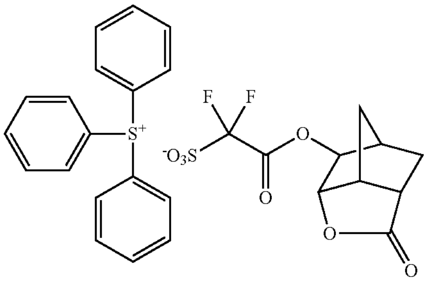
(B1-14)
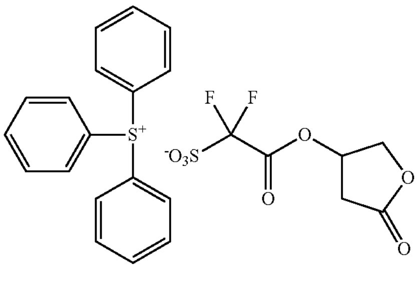
(B1-15)
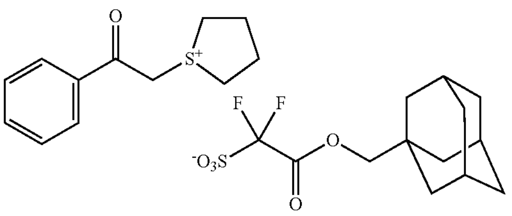

-continued (B1-16)

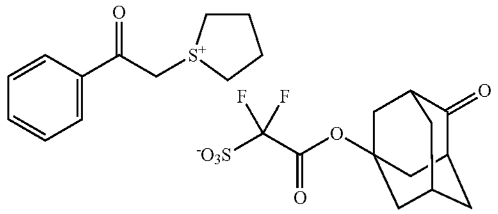

(B1-17)

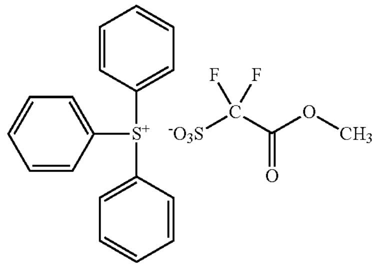

In the resist composition of the present invention in which the salt represented by the formula (II-0) is contained as the acid generator (B), the proportion of the acid generator (B) is preferably not less than 1 parts by weight (and more preferably not less than 3 parts by weight), and not more than 30 parts by weight (and more preferably not more than 25 parts by weight), with respect to 100 parts by weight of the resin (A2).

In the resist composition of the present invention in which the salt represented by the formula (II-0) is contained together with the acid generator other than the salt (II-0) as the acid generator (B), the total proportion of the acid generator and the acid generator (B) is preferably not less than 1 parts by weight (and more preferably not less than 3 parts by weight), and not more than 40 parts by weight (and more preferably not more than 35 parts by weight), with respect to 100 parts by weight of the resin (A2).

In this case, the weight ratio of salt (II-0)/acid generator other than salt (II-0) may be 5/95 to 95/5, preferably 10/90 to 91/10, and more preferably 15/85 to 85/15.

<Solvent (E)>

The resist composition of the present invention preferably includes a solvent (E). The proportion of the solvent (E) is 90 weight % or more, preferably 92 weight % or more, and more preferably 94 weight % or more, and also preferably 99 weight % or less and more preferably 99.9 weight % or less. The proportion of the solvent (E) can be measured with a known analytical method such as, for example, liquid chromatography and gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Basic Compound (C)>

The resist composition of the present invention may contain a basic compound (C). The basic compound (C) is a compound having a property to quench an acid, in particular, generated from the acid generator (B), and called “quencher”.

As the basic compounds (C), nitrogen-containing basic compounds (for example, amine and basic ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a heteroaromatic amine such as pyridine.

Preferred basic compounds (C) include compounds presented by the formula (C1) to the formula (C8) as described below. Among these, the basic compound presented by the formula (C1-1) is more preferable.

(C1)

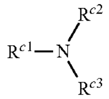

wherein $R^{c1}$, $R^{c2}$ and $R^{c3}$ independently represent a hydrogen atom, a $C_1$ to $C_6$ alkyl group, $C_5$ to $C_{10}$ alicyclic hydrocarbon group or a $C_6$ to $C_{10}$ aromatic hydrocarbon group, one or more hydrogen atom contained in the alkyl group and alicyclic hydrocarbon group may be replaced by a hydroxy group, an amino group or a $C_1$ to $C_6$ alkoxyl group, one or more hydrogen atom contained in the aromatic hydrocarbon group may be replaced by a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group.

(C1-1)

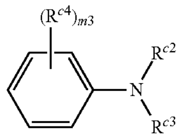

wherein $R^{c2}$ and $R^{c3}$ have the same definition of the above;

$R^{c4}$ in each occurrence represents a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group;

m3 represents an integer 0 to 3.

(C2)

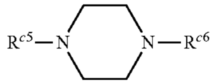

(C3)

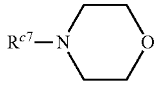

(C4)

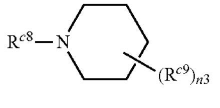

wherein $R^{c5}$, $R^{c6}$, $R^{c7}$ and $R^{c8}$ independently represent the any of the group as described in $R^{c1}$ of the above;

$R^{c9}$ in each occurrence independently represents a $C_1$ to $C_6$ alkyl group, a $C_3$ to $C_6$ alicyclic hydrocarbon group or a $C_2$ to $C_6$ alkanoyl group;

n3 represents an integer of 0 to 8.

Examples of the alkanoyl group include acetyl group, 2-methylacetyl group, 2,2-dimethylacetyl group, propionyl group, butylyl group, isobutylyl group, pentanoyl group, and 2,2-dimethylpropionyl group.

(C5)

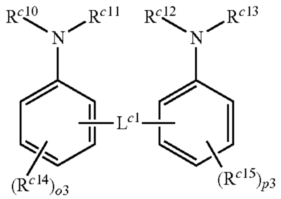

(C6)

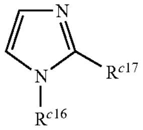

wherein $R^{c10}$, $R^{c11}$, $R^{c12}$, $R^{c13}$ and $R^{c16}$ independently represent the any of the groups as described in $R^{c1}$;

$R^{c14}$, $R^{c15}$ and $R^{c17}$ in each occurrence independently represent the any of the groups as described in $R^{c4}$;

o3 and p3 represent an integer of 0 to 3;

$L^{c1}$ represents a divalent $C_1$ to $C_6$ alkanediyl group, —CO—, —C(═NH)—, —S— or a combination thereof.

(C7)

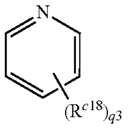

(C8)

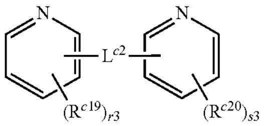

wherein $R^{c18}$, $R^{c19}$ and $R^{c20}$ in each occurrence independently represent the any of the groups as described in $R^{c4}$;

q3, r3 and s3 represent an integer of 0 to 3;

Lc2 represents a single bond, a $C_1$ to $C_6$ alkanediyl group, —CO—, —C(═NH)—, —S— or a combination thereof.

Specific examples of the amine represented by the formula (C1) include 1-naphtylamine and 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl] amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Among these, diisopropylaniline is preferable, particularly 2,6-diisopropylaniline is more preferable as the basic compounds (C) contained in the present resist composition.

Specific examples of the compound represented by the formula (C2) include, for example, piperadine.

Specific examples of the compound represented by the formula (C3) include, for example, morpholine.

Specific examples of the compound represented by the formula (C4) include, for example, piperidine, a hindered amine compound having piperidine skeleton described in JP H11-52575A.

Specific examples of the compound represented by the formula (C5) include, for example, 2,2'-methylenebisaniline.

Specific examples of the compound represented by the formula (C6) include, for example, imidazole and 4-methylimidazole.

Specific examples of the compound represented by the formula (C7) include, for example, pyridine and 4-methylpyridine.

Specific examples of the compound represented by the formula (C8) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

The proportion of the basic compound (C) is preferably 0.01 to 5 weight %, more preferably 0.01 to 3 weight %, and still more preferably 0.01 to 1 weight % with respect to the total solid proportion of the resist composition.

<Other Ingredient (Hereinafter May be Referred to as "Other Ingredient (F)">

The resist composition can also include small amounts of various additives such as sensitizers, dissolution inhibitors, surfactants, stabilizers, and dyes, as needed.

<Preparing the Resist Composition>

The present resist composition can be prepared by mixing the resin (A1), the resin (A2) and the acid generator (B), and the basic compound (C), the solvent (E) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.003 to 0.2 μm pore diameter.

<Method for Producing Resist Pattern>

The method for producing resist pattern of the present invention includes the steps of:

(1) applying the resist composition of the present invention onto a substrate;

(2) drying the applied composition to form a composition layer;

(3) exposing the composition layer;

(4) heating the exposed composition layer, and (5) developing the heated composition layer.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0\times10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The composition ratio of the resin (the copolymerization ratio of the structural unit derived from each monomer used in the preparation with respect to the resin) was calculated by measuring the amount of the unreacted monomer in the reacted solution after the completion of the reaction through liquid chromatography, and calculating the amount of the monomer use in the polymerization from the obtained results.

The weight average molecular weight is a value determined by gel permeation chromatography.

Column: TSK gel Multipore HXL-M×3+guardcolumn (Tosoh Co. Ltd.)

Eluant: tetrahydrofuran

Flow rate: 1.0 mL/min

Detecting device: RI detector

Column temperature: 40° C.

Injection amount: 100 μL

Standard material for calculating molecular weight: standard polysthylene (Toso Co. ltd.)

Synthesis Example 1

Synthesis of a Salt Represented by the Formula (II-4)

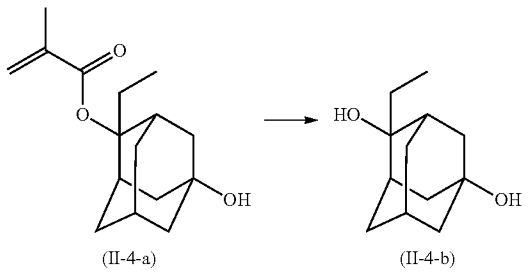 [SMILES: C=C(C)C(=O)OC1(CC)C2CC3CC1CC(O)(C3)C2 ; CCC1(O)C2CC3CC1CC(O)(C3)C2]

(II-4-a) (II-4-b)

26.44 parts of the salt represented by the formula (II-4-a) (trade name: HADM, Idemitsu Kosan Co., Ltd.) and 80.00 parts of dioxane were charged, and stirred at 23° C., a solution in which 4.40 parts of sodium hydroxide was dissolved in 80.00 parts of ion-exchanged water was added in the form of drops thereto over 30 minutes. The resultant was stirred for 36 hour at 90° C. The obtained reacted mass was cooled, 400.0 parts of ion-exchanged water, 500.0 parts of ethyl acetate and 200.0 parts of sodium hydroxide were added to the obtained mass, stirred, and separated to obtain an organic layer. To the obtained organic layer, 400.0 parts of 3N sodium hydroxide was added, stirred, and separated to obtain an organic layer.

To the obtained organic layer, 400.0 parts of ion-exchanged water was added, stirred, and separated to obtain an organic layer. This washing with water operation was repeated three times. The obtained organic layer was concentrated to obtain a concentrate. The concentrate was column-fractionated under the condition below, whereby giving 7.89 parts of the compound (II-4-b).

Developing medium: silica gel 60, 200 mesh (Merck & Co., Inc.)

Developing solvent: n-heptane/ethyl acetate=1/1 (bulk ratio)

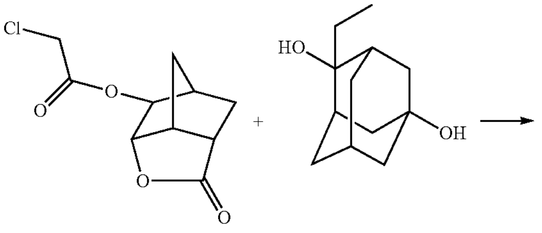

(II-4-c) (II-4-b)

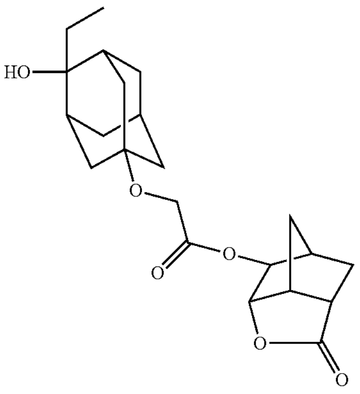

(II-4-d)

4.61 parts of a compound represented by the formula (II-4-c) (Trade name: CANL, Kuraray Co., Ltd.) and 25.00 parts of N,N'-dimethylformamide were charged, and stirred for 30 minutes at 23° C. 1.66 parts of potassium carbonate and 0.84 parts of potassium iodide were added thereto, and the obtained mixture was stirred for 1 hour at 50° C. The obtained mixture was cooled to 40° C., a solution in which 3.93 parts of a compound represented by the formula (II-4-b) was dissolved in 25.00 parts of N,N'-dimethylformamide was added in the form of drops thereto over 1 hour, and the mixture was stirred for 5 hours at 75° C. The obtained mixture was cooled to 23° C., 60.00 parts of chloroform and 60.00 parts of 1N hydrochloride were added thereto, stirred, and separated to obtain an organic layer. The obtained organic layer was washed with ion-exchanged water until an aqueous layer was neutralized. The obtained organic layer was concentrated to obtain a concentrate. The concentrate was column-fractionated under the condition below, whereby giving 2.24 parts of the compound (II-4-d).

Developing medium: silica gel 60, 200 mesh (Merck & Co., Inc.)

Developing solvent: ethyl acetate.

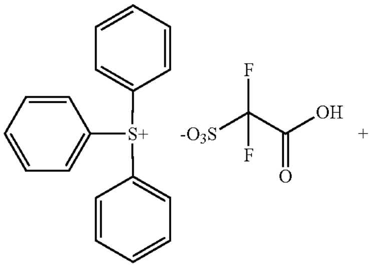

(II-4-e)

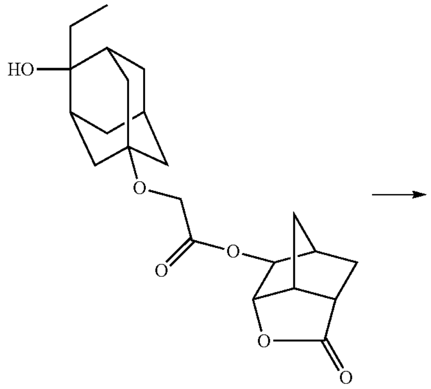

(II-4-d)

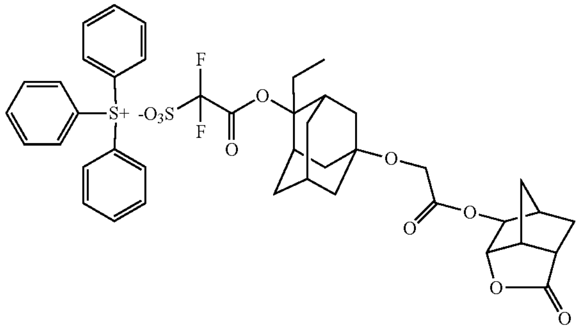

(II-4)

A salt represented by the formula (II-4-e) was synthesized by the method described in Example 1 of JP2008-127367A. 1.75 parts of the salt represented by the formula (II-4-e), 40.00 parts of the monochlorobenzene and 1.87 parts of the compound represented by the formula (II-4-d) were charged, and stirred for 30 minutes at 23° C. 0.16 parts of sulfuric acid and 10.00 parts of molecular sieve (Trade name: molecular sieve 4A, Wako Pure Chemical Industries, Ltd.) was added thereto, and the obtained mixture was stirred for 3 hours at 130° C. to reflux-dehydrate. The obtained reactant was concentrated, and to the obtained reactant, 100 parts of chloroform and 50 parts of ion-exchanged water were added, stirred, and separated to obtain an organic layer. The obtained organic layer was washed with water for three times. To the obtained organic layer, 1.00 part of activated carbon was added, and the mixture was stirred for 30 minutes at 23° C., and filtrated. The filtrate was concentrated to obtain a concentrate, to this concentrate, 20 parts of acetonitrile was mixed to dissolve, and concentrated. To the obtained residue, 20 parts of ethyl acetate was added, stirred, and remove a supernatant. To the obtained residue, 20 parts of tert-butyl methyl ether was added, stirred, and remove a supernatant. The obtained residue was dissolved in chloroform, and the obtained residue was concentrated to obtain 0.44 parts of the salt represented by the formula (II-4) as oil.

MS (ESI(+) Spectrum): $M^+$ 263.1

MS (ESI(−) Spectrum): $M^-$ 547.2

Synthesis Example 2

Synthesis of a Salt Represented by the Formula (II-5)

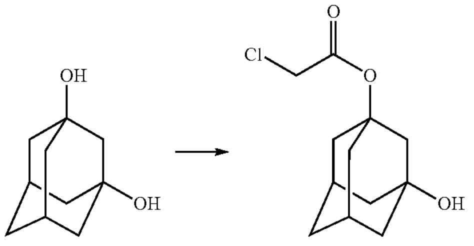

(II-5-a)

250 parts of 1,3-adamenranediol and 2000 parts of tetrahydrofuran were charged, and stirred at room temperature, 142 parts of pyridine was added thereto, and raise temperature to 40° C. A mixture solution of 254 parts of chloroacetyl chloride and 500 parts of tetrahydrofuran was added in the form of drops thereto over 80 minutes. The resultant was stirred for 8 hour at 40° C., and cooled to 5° C. To the obtained reacted solution was added 100 parts of ion-exchanged water (5° C.), the obtained solution was stirred, and separated to collect an aqueous layer. To the obtained aqueous layer, 600 parts of ethyl acetate was added, the obtained solution was separated to collect an organic layer. To the obtained organic layer, 600.0 parts of 10% potassium carbonate (5° C.) was added to wash, and obtained solution was separated to obtain an organic layer. To the obtained organic layer, 600.0 parts of ion-exchanged water was further added to wash with water, and separated to obtain an organic layer. This washing with water operation was repeated three times. The obtained organic layer was concentrated to obtain a concentrate. The concentrate was column-fractionated under the condition below, whereby giving 75 parts of the compound (II-5-a).

Developing medium: silica gel 60, 200 mesh (Merck & Co., Inc.)

Developing solvent: n-heptane/ethyl acetate=1/1 (bulk ratio)

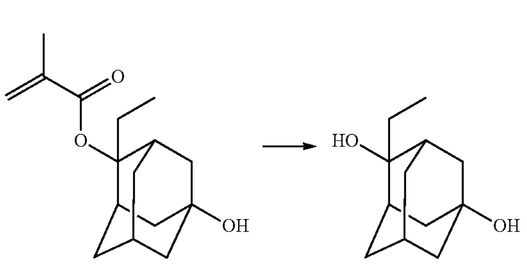

(II-5-b) (II-5-c)

26.44 parts of the salt represented by the formula (II-5-b) (trade name: HADM, Idemitsu Kosan Co., Ltd.) and 80.00 parts of dioxane were charged, and stirred at 23° C., a solution in which 4.40 parts of sodium hydroxide was dissolved in 80.00 parts of ion-exchanged water was added thereto in the form of drops thereto over 30 minutes. The resultant was stirred for 36 hour at 90° C. The obtained reacted mass was cooled, 400.00 parts of ion-exchanged water, 500.0 parts of ethyl acetate and 200.0 parts of sodium hydroxide were added to the obtained mass, stirred, and separated to obtain an organic layer. To the obtained organic layer, 400.0 parts of 3N sodium hydroxide was added, stirred, and separated to obtain an organic layer. To the obtained organic layer, 400.0 parts of ion-exchanged water was added, stirred, and separated to obtain an organic layer. This washing with water operation was repeated three times. The obtained organic layer was concentrated to obtain a concentrate. The concentrate was column-fractionated under the condition below, whereby giving 7.89 parts of the compound (II-5-c).

Developing medium: silica gel 60, 200 mesh (Merck & Co., Inc.)

Developing solvent: n-heptane/ethyl acetate=1/1 (bulk ratio)

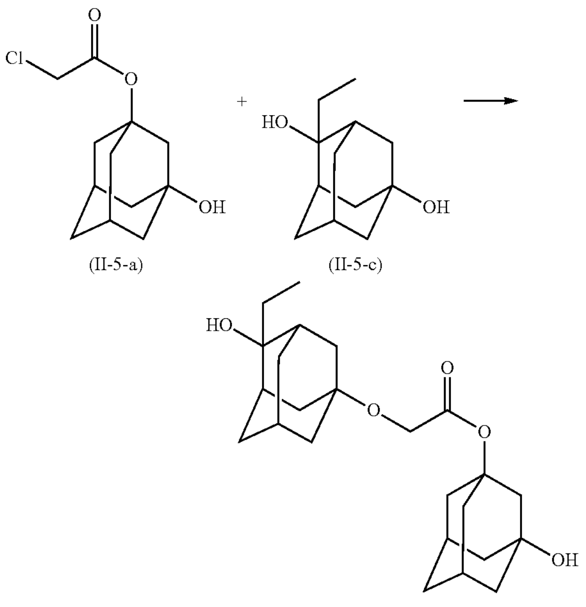

(II-5-a) (II-5-c)

(II-5-d)

4.88 parts of a compound represented by the formula (II-5-a) and 25.00 parts of N,N'-dimethylformamide were charged, and stirred for 30 minutes at 23° C. 1.66 parts of potassium carbonate and 0.84 parts of potassium iodide were added thereto, and the obtained mixture was stirred for 1 hour at 50° C. The obtained mixture was cooled to 40° C., a solution in which 3.93 parts of a compound represented by the formula (II-5-c) was dissolved in 25.00 parts of N,N'-dimethylformamide was added in the form of drops thereto over 1 hour, and the mixture was stirred for 5 hours at 75° C. The obtained mixture was cooled to 23° C., 60.00 parts of chloroform and 60.00 parts of 1N hydrochloride were added thereto, stirred, and separated to obtain an organic layer. The obtained organic layer was washed with 60.00 parts of ion-exchanged water until an aqueous layer was neutralized. The obtained organic layer was concentrated to obtain a concentrate. The concentrate was column-fractionated under the condition below, whereby giving 2.54 parts of the compound (II-5-d).

Developing medium: silica gel 60, 200 mesh (Merck & Co., Inc.)

Developing solvent: ethyl acetate.

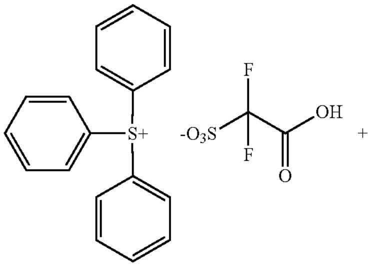

(II-5-e)

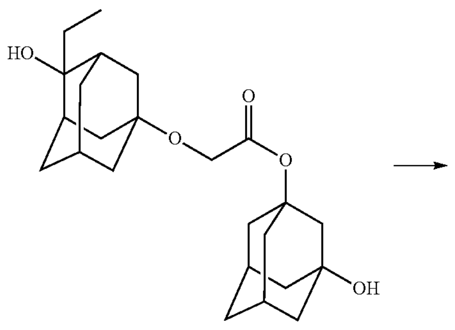

(II-5-d)

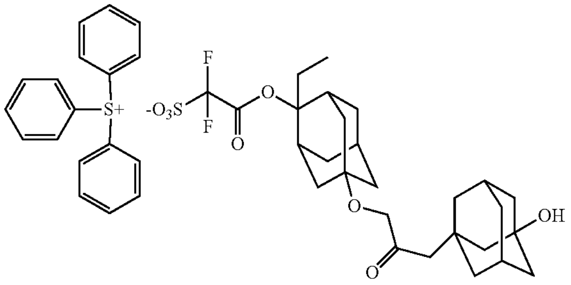

(II-5)

A salt represented by the formula (II-5-e) was synthesized by the method described in Example 1 of JP2008-127367A. 2.19 parts of the salt represented by the formula (II-5-e), 50.00 parts of the monochlorobenzene and 2.43 parts of the compound represented by the formula (II-5-d) were charged, and stirred for 30 minutes at 23° C. 0.20 parts of sulfuric acid and 10.00 parts of molecular sieve (Trade name: molecular sieve 4A, Wako Pure Chemical Industries, Ltd.) were added thereto, and the obtained mixture was stirred for 3 hours at 130° C. to reflux-dehydrate. The obtained reactant was concentrated, and to the obtained reactant, 100 parts of chloroform and 50 parts of ion-exchanged water were added, stirred, and separated to obtain an organic layer. The obtained organic layer was washed with water for three times. To the obtained organic layer, 1.00 part of activated carbon was added, and the mixture was stirred for 30 minutes at 23° C., and filtrated. The filtrate was concentrated to obtain a concentrate, to this concentrate, 20 parts of acetonitrile was mixed to dissolve, and concentrated. To the obtained residue, 20 parts of ethyl acetate was added, stirred, and remove a supernatant. To the obtained residue, 20 parts of tert-butyl methyl ether was added, stirred, and remove a supernatant. The obtained residue was dissolved in chloroform, and the obtained residue was concentrated to obtain 0.62 parts of the salt represented by the formula (II-5) as oil.

MS (ESI(+) Spectrum): $M^+$ 263.1

MS (ESI(−) Spectrum): $M^-$ 561.2

Synthesis Example 3

Synthesis of a Salt Represented by the Formula (II-201)

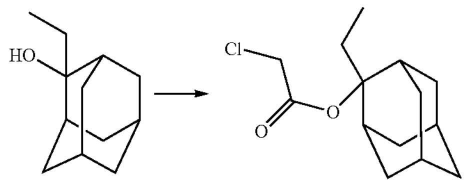

(II-201-a)

27.11 parts of 2-ethyl-2-adamentanol and 200.00 parts of tetrahydrofuran were charged, and stirred at room temperature. After confirm to dissolve 2-ethyl-2-adamentanol, 14.27 parts of pyridine was added thereto, and raise temperature to 40° C. A mixture solution of 25.47 parts of chloroacetyl chloride and 50 parts of tetrahydrofuran was added in the form of drops thereto over 1 hour. The resultant was stirred for 8 hour at 40° C., and cooled to 5° C. To the obtained reacted solution was added 100 parts of ion-exchanged water (5° C.), the obtained solution was stirred, and separated to collect an aqueous layer. To the obtained aqueous layer was added 65.00 parts of ethyl acetate, the obtained solution was separated to collect an organic layer. To the obtained organic layer, 65.00 parts of 10% potassium carbonate (5° C.) was added to wash, and obtained solution was separated to obtain an organic layer. To the obtained organic layer, 65.00 parts of ion-exchanged water was further added to wash with water, and separated to obtain an organic layer. This washing with water operation was repeated three times. The obtained organic layer was concentrated to obtain a concentrate. To the concentrate, 50.00 parts of n-heptane was added, stirred, filtrated and dried, whereby giving 18.98 parts of the compound (II-201-a).

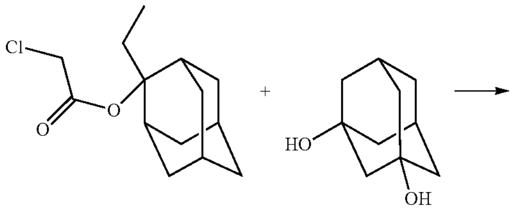

(II-201-a)

-continued

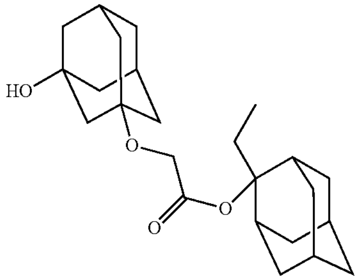

(II-201-b)

5.12 parts of a compound represented by the formula (II-201-a) and 25.00 parts of N,N'-dimethylformamide were charged, and stirred for 30 minutes at 23° C. 1.66 parts of potassium carbonate and 0.84 parts of potassium iodide were added the obtained mixture, and the obtained mixture was stirred for 1 hour at 50° C. The obtained mixture was cooled to 40° C., a solution in which 3.31 parts of 1,3-adamantanediol was dissolved in 25.00 parts of N,N'-dimethylformamide was added in the form of drops thereto over 1 hour, and the mixture was stirred for 5 hours at 75° C. The obtained mixture was cooled to 23° C., 60.00 parts of chloroform and 60.00 parts of 1N hydrochloride were added thereto, stirred, and separated to obtain an organic layer. The obtained organic layer was washed with 60.00 parts of ion-exchanged water until an aqueous layer was neutralized. The obtained organic layer was concentrated to obtain a concentrate. The concentrate was column-fractionated under the condition below, whereby giving 2.69 parts of the compound (II-201-b).

Developing medium: silica gel 60, 200 mesh (Merck & Co., Inc.)

Developing solvent: ethyl acetate.

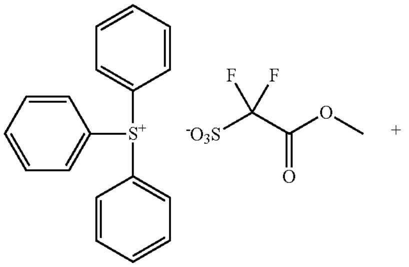

(II-201-c)

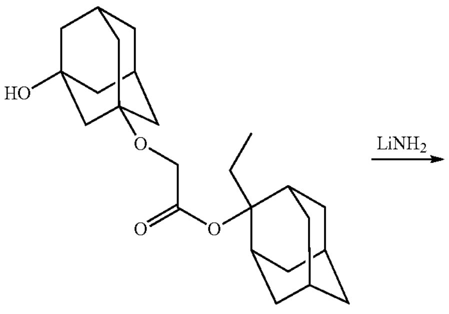

(II-201-b)

-continued

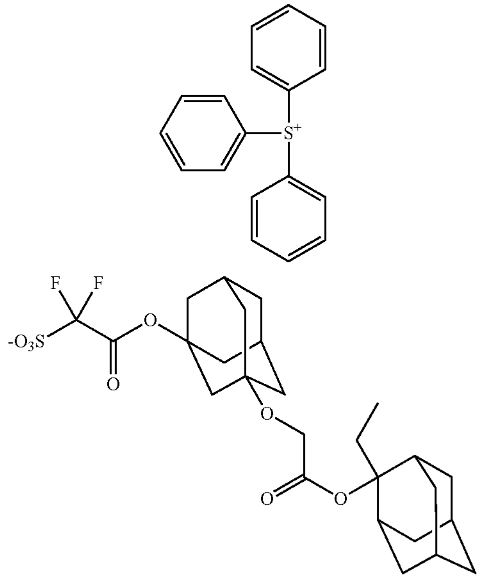

(II-201)

A salt represented by the formula (II-201-c) was synthesized by the method described in JP2008-13551A. 2.26 parts of the salt represented by the formula (II-201-c), 15.00 parts of the chloroform and 2.33 parts of the compound represented by the formula (II-201-b), 2.50 parts of molecular sieve (Trade name: molecular sieve 4A, Wako Pure Chemical Industries, Ltd.) and 0.07 parts of lithium amide were charged, reflux-dehydrated for 24 hours at 80° C., and filtrated to obtain a filtrate. The obtained filtrate was mixed with 0.14 parts of oxalic acid and 5.00 parts of ion-exchanged water, stirred, and separated to obtain an organic layer. The obtained organic layer was washed with water for six times. To the obtained organic layer, 1.00 part of activated carbon was added, and the mixture was stirred for 30 minutes at 23° C., and filtrated. The filtrate was concentrated to obtain a concentrate, to this concentrate, 5.00 parts of acetonitrile was mixed to dissolve, and concentrated. To the obtained residue, 10 parts of ethyl acetate was added, stirred, and remove a supernatant. To the obtained residue, 10 parts of tert-butyl methyl ether was added, stirred, and remove a supernatant. The obtained residue was dissolved in chloroform, and the obtained residue was concentrated. The obtained concentrate was column-fractionated under the condition below, whereby giving 0.11 parts of the salt represented by the formula (II-201).

Developing medium: silica gel 60, 200 mesh (Merck & Co., Inc.)

Developing solvent: chloroform/methanol=5/1.

MS (ESI(+) Spectrum): $M^+$ 263.1

MS (ESI(−) Spectrum): $M^-$ 545.2

Synthesis Example 4

Synthesis of a Salt Represented by the Formula (II-213)

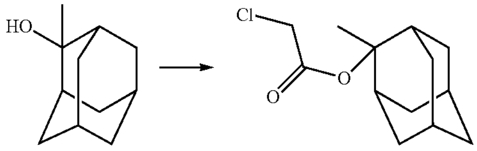

(II-213-a)

25.00 parts of 2-methyl-2-adamentanol and 200.00 parts of tetrahydrofuran were charged, and stirred at room temperature. After confirm to dissolve 2-ethyl-2-adamentanol, 14.27 parts of pyridine was added thereto, and raise temperature to 40° C. A mixture solution of 25.47 parts of chloroacetyl chloride and 50 parts of tetrahydrofuran was added in the form of drops thereto over 1 hour. The resultant was stirred for 8 hour at 40° C., and cooled to 5° C. To the obtained reacted solution was added 100 parts of ion-exchanged water (5° C.), the obtained solution was stirred, and separated to collect an aqueous layer. To the obtained aqueous layer was added 65.00 parts of ethyl acetate, the obtained solution was separated to collect an organic layer. To the obtained organic layer, 65.00 parts of 10% potassium carbonate (5° C.) was added to wash, and obtained solution was separated to obtain an organic layer. To the obtained organic layer, 65.00 parts of ion-exchanged water was further added to wash with water, and separated to obtain an organic layer. This washing with water operation was repeated three times. The obtained organic layer was concentrated to obtain a concentrate. To the concentrate, 40.00 parts of n-heptane was added, stirred, filtrated and dried, whereby giving 17.62 parts of the compound (II-213-a).

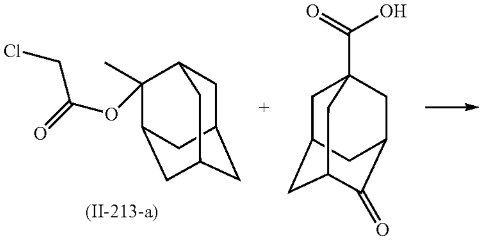

(II-213-a)

(II-213-b)

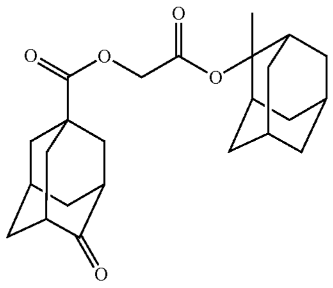

(II-213-c)

15.00 parts of a compound represented by the formula (II-213-b) and 75.00 parts of N,N'-dimethylformamide were charged, and stirred for 30 minutes at 23° C. 6.40 parts of potassium carbonate and 1.92 parts of potassium iodide were added the obtained mixture, and the obtained mixture was stirred for 1 hour at 50° C. The obtained mixture, a solution in which 16.87 parts of a compound represented by the formula (II-213-a) was dissolved in 33.74 parts of N,N'-dimethylformamide was added in the form of drops thereto over 1 hour, and the mixture was stirred for 5 hours at 50° C. The obtained mixture was cooled to 23° C., 300 parts of ethyl acetate and 150 parts of ion-exchanged water were added thereto, stirred, and separated to obtain an organic layer. The obtained organic layer was washed with 150 parts of ion-exchanged water until an aqueous layer was neutralized. The obtained organic layer was concentrated to obtain a concentrate. 150 parts of n-heptane was added to the obtained concentrate, stirred, filtrated and fried, whereby giving 22.67 parts of a compound (II-213-c).

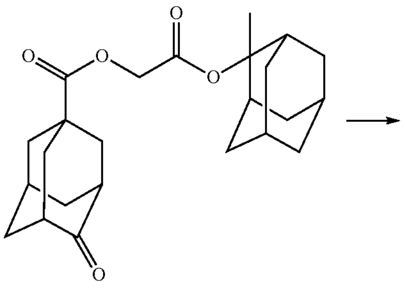

(II-213-c)

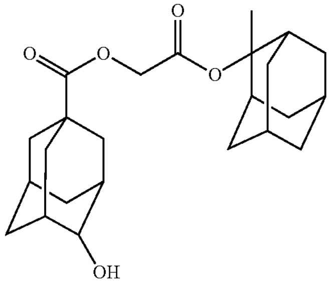

(II-213-d)

15.00 parts of the compound (II-213-c) and 75 parts of acetonitrile were charged, stirred for 30 minutes at 23° C., and the mixture was cooled to 5° C. To the obtained mixture, 0.71 parts of sodium borohydride and 10.63 parts of ion-exchanged water was added, stirred for 3 hours at 5° C. To the obtained mixture, 50 past of ion-exchanged water and 100 parts of ethyl acetate were added, stirred, and separated to collect an organic layer. The obtained organic layer was washed with 50.00 parts of ion-exchanged water, and repeated until an aqueous layer was neutralized. The obtained organic layer was concentrated to obtain a concentrate. The concentrate was column-fractionated under the condition below, whereby giving 12.43 parts of the compound (II-213-d).

Developing medium: silica gel 60, 200 mesh (Merck & Co., Inc.)

Developing solvent: ethyl acetate.

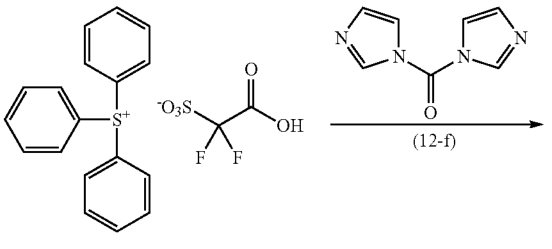

(II-213-e)

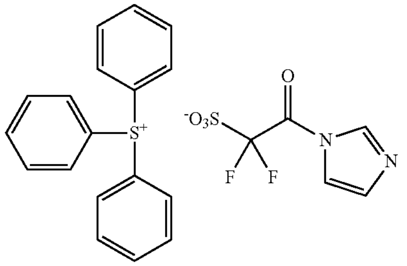

(II-213-g)

A salt represented by the formula (II-213-e) was synthesized by the method described in JP2008-127367A.

10.00 parts of the salt represented by the formula (II-213-e) and 60 parts of the acetonitrile were charged, and stirred for 30 minutes at 40° C., to this, 4.44 parts of the compound represented by the formula (II-2134) were charged, and stirred for 1 hour at 50° C., whereby giving a solution containing a compound represented by the formula (II-213-g).

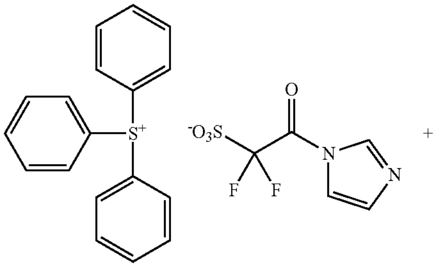

(II-213-g)

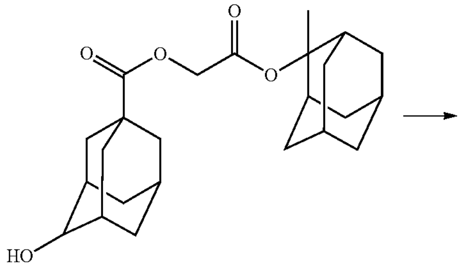

(II-213-d)

-continued

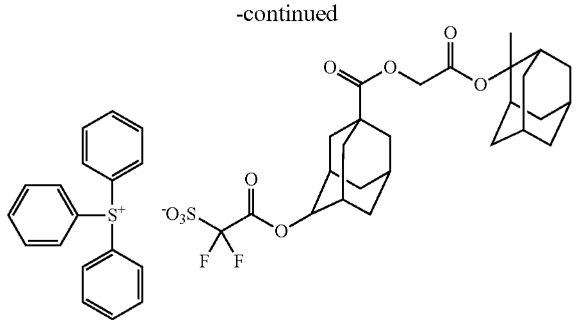

(II-213)

To the obtained solution containing the compound represented by the formula (II-213-g), 9.19 parts of the compound represented by the formula (II-213-d) was charged, and stirred for 1 hour at 23° C. To the obtained reaction mass, 100 parts of chloroform and 50 parts of ion-exchanged water were charged, stirred, and separated to obtain an organic layer. The obtained organic layer was washed with water for 5 times. To the obtained organic layer, 1.00 part of activated carbon was added, and the mixture was stirred for 30 minutes at 23° C., and filtrated. The filtrate was concentrated to obtain a concentrate, to this concentrate, 50 parts of acetonitrile was mixed to dissolve, and concentrated. To the obtained residue, 50 parts of ethyl acetate was added, stirred, and remove a supernatant. To the obtained residue, 50 parts of tert-butyl methyl ether was added, stirred, and remove a supernatant. The obtained residue was dissolved in chloroform, and the obtained residue was concentrated. The obtained concentrate was column-fractionated under the condition below, whereby giving 16.84 parts of the salt represented by the formula (II-213).

Developing medium: silica gel 60, 200 mesh (Merck & Co., Inc.)

Developing solvent: chloroform/methanol=5/1.

MS (ESI(+) Spectrum): $M^+$ 263.1

MS (ESI(−) Spectrum): $M^-$ 559.2

Synthesis Example 5

Synthesis of a Salt Represented by the Formula (II-225)

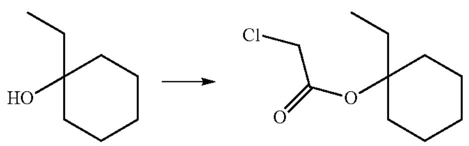

(II-225-a)

19.28 parts of 1-ethylcyclohexanol and 150 parts of tetrahydrofuran were charged, and stirred at room temperature. After confirm to dissolve 1-ethylcyclohexanol, 14.27 parts of pyridine was added thereto, and raise temperature to 40° C. A mixture solution of 25.47 parts of chloroacetyl chloride and 50 parts of tetrahydrofuran was added in the form of drops thereto over 1 hour. The resultant was stirred for 8 hour at 40° C., and cooled to 5° C. To the obtained reacted solution was added 100 parts of ion-exchanged water (5° C.), the obtained solution was stirred, and separated to collect an aqueous layer.

To the obtained aqueous layer was added 80 parts of ethyl acetate, the obtained solution was separated to collect an organic layer. To the obtained organic layer, 80 parts of 10% potassium carbonate (5° C.) was added to wash, and obtained solution was separated to obtain an organic layer. To the obtained organic layer, 80 parts of ion-exchanged water was further added to wash with water, and separated to obtain an organic layer. This washing with water operation was repeated three times. The obtained organic layer was concentrated to obtain a concentrate. The obtained concentrate was column-fractionated under the condition below, whereby giving 14.23 parts of the compound represented by the formula (II-225-a).

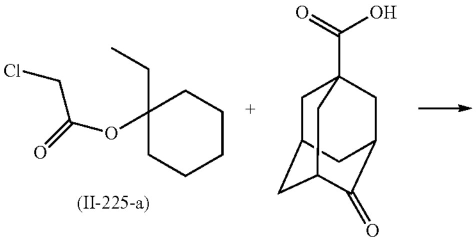

(II-225-a)

(II-225-b)

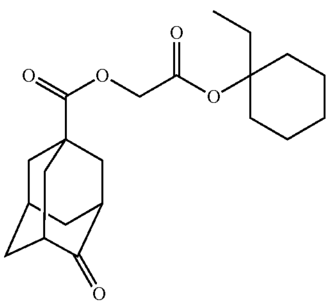

(II-225-c)

15.00 parts of a compound represented by the formula (II-225-b) and 75.00 parts of N,N'-dimethylformamide were charged, and stirred for 30 minutes at 23° C. 6.40 parts of potassium carbonate and 1.92 parts of potassium iodide were added the obtained mixture, and the obtained mixture was stirred for 1 hour at 50° C. To the obtained mixture, a solution in which 14.23 parts of the compound represented by the formula (II-225-a) was dissolved in 30.00 parts of N,N'-dimethylformamide was added in the form of drops thereto over 1 hour, and the mixture was stirred for 5 hours at 50° C. The obtained mixture was cooled to 23° C., 300 parts of ethyl acetate and 150 parts of ion-exchanged water were added thereto, stirred, and separated to obtain an organic layer. The obtained organic layer was washed with 150 parts of ion-exchanged water until an aqueous layer was neutralized. The obtained organic layer was concentrated to obtain a concentrate. 150 parts of n-heptane was added to the obtained concentrate, stirred, filtrated and fried, whereby giving 19.98 parts of a compound (II-225-c).

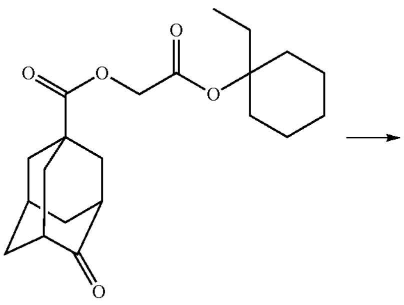

(II-225-c)

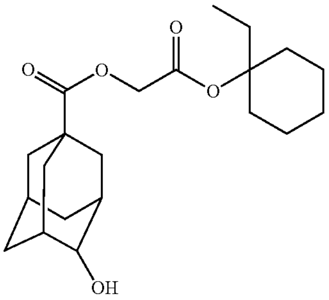

(II-225-d)

13.57 parts of the compound (II-225-c) and 70 parts of acetonitrile were charged, stirred for 30 minutes at 23° C., and the mixture was cooled to 5° C. To the obtained mixture, 0.71 parts of sodium borohydride and 10.63 parts of ion-exchanged water was added, stirred for 3 hours at 5° C. To the obtained mixture, 50 past of ion-exchanged water and 100 parts of ethyl acetate were added, stirred, and separated to collect an organic layer. The obtained organic layer was washed with 50.00 parts of ion-exchanged water, and repeated until an aqueous layer was neutralized. The obtained organic layer was concentrated to obtain a concentrate. The concentrate was column-fractionated under the condition below, whereby giving 10.79 parts of the compound (II-225-d).

Developing medium: silica gel 60, 200 mesh (Merck & Co., Inc.)

Developing solvent: ethyl acetate.

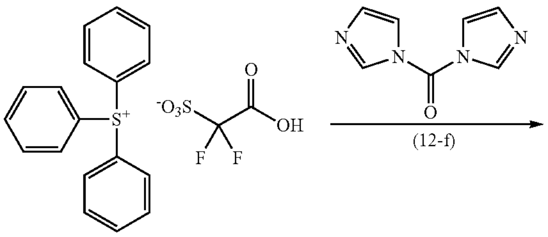

(II-225-e)

-continued

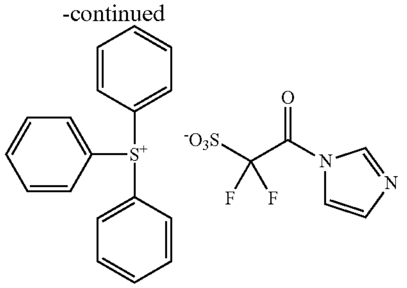

(II-225-g)

10.00 parts of the salt represented by the formula (II-225-e), 60 parts of the acetonitrile were charged, and stirred for 30 minutes at 40° C., 4.44 parts of the compound represented by the formula (II-225-f) was added thereto, and stirred for 1 hour at 50° C., whereby giving a solution containing a compound represented by the formula (II-225-g).

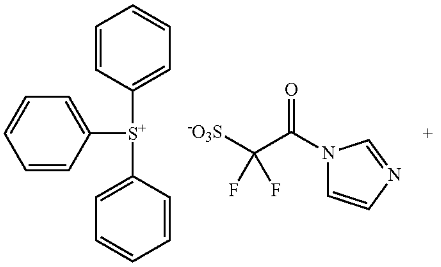

(II-225-g)

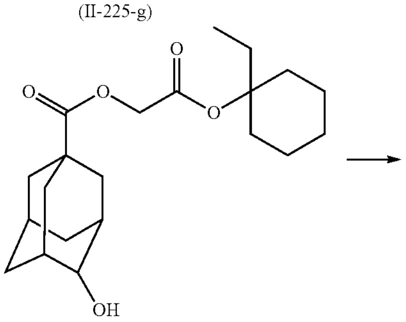

(II-225-d)

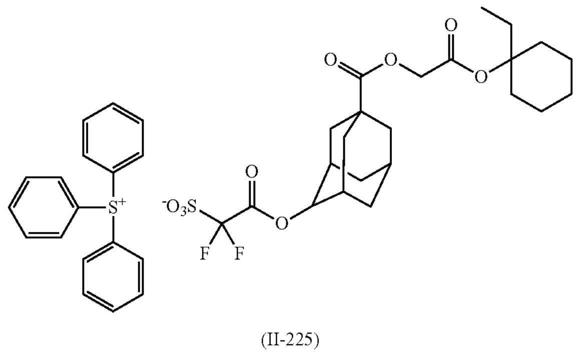

(II-225)

To the obtained solution containing the compound represented by the formula (II-225-g), 8.32 parts of the compound represented by the formula (II-225-d) was charged, and stirred for 1 hour at 23° C. To the obtained reaction mass, 100 parts of chloroform and 50 parts of ion-exchanged water were charged, stirred, and separated to obtain an organic layer. The obtained organic layer was washed with water for 5 times. To the obtained organic layer, 1.00 part of activated carbon was added, and the mixture was stirred for 30 minutes at 23° C., and filtrated. The filtrate was concentrated to obtain a concentrate, to this concentrate, 50 parts of acetonitrile was mixed to dissolve, and concentrated. To the obtained residue, 50 parts of ethyl acetate was added, stirred, and remove a supernatant. To the obtained residue, 50 parts of tert-butyl methyl ether was added, stirred, and remove a supernatant. The obtained residue was dissolved in chloroform, and the obtained residue was concentrated. The obtained concentrate was column-fractionated under the condition below, whereby giving 14.88 parts of the salt represented by the formula (II-225).

MS (ESI(+) Spectrum): $M^+$ 263.1

MS (ESI(−) Spectrum): $M^-$ 521.2

Synthesis Example 6

Synthesis of a Salt Represented by the Formula (II-183)

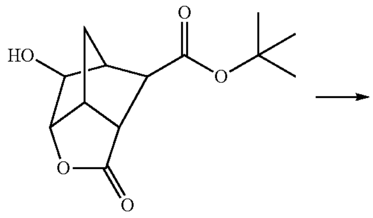

(II-183-a)

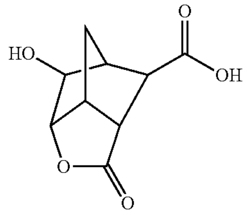

(II-183-b)

25.43 parts of the compound (II-183-a) (Trade name: NLA-tBu, Kuraray Co. Ltd.), 100 parts of tetrahydrofuran and 1.14 parts of trifluoroacetate were charged, stirred for 2 hours at 50° C. 0.42 parts of potassium was added thereto, and stirred for 10 hours at 50° C. To the obtained mixture, 30 past of ion-exchanged water and 60 parts of ethyl acetate were added, stirred and separated to collect an organic layer. To the obtained organic layer, 30 past of ion-exchanged water was added to wash with water, and separated to collect an organic layer. This washing with water operation was repeated three times. The obtained organic layer was concentrated to obtain a concentrate. The concentrate was column-fractionated under the condition below, whereby giving 18.9 parts of the compound (II-183-b).

Developing medium: silica gel 60, 200 mesh (Merck & Co., Inc.)

Developing solvent: n-heptane/ethyl acetate=10/1 (bulk ratio)

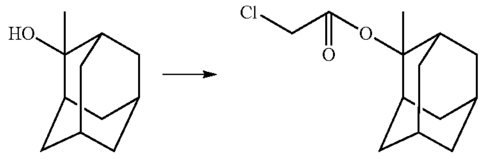

(II-183-c)

250 parts of 2-methyl-2-adamentanol and 2000 parts of tetrahydrofuran were charged, and stirred at room temperature. After confirm to dissolve 2-ethyl-2-adamentanol, 142.73 parts of pyridine was added thereto, and raise temperature to 40° C. A mixture solution of 254.74 parts of chloroacetyl chloride and 509 parts of tetrahydrofuran was added in the form of drops thereto over 80 minutes. The resultant was stirred for 8 hour at 40° C., and cooled to 5° C. To the obtained reacted solution was added 1052 parts of ion-exchanged water (5° C.), the obtained solution was stirred, and separated to collect an aqueous layer. To the obtained aqueous layer was added 631 parts of ethyl acetate, the obtained solution was separated to collect an organic layer. To the obtained organic layer, 631 parts of 10% potassium carbonate (5° C.) was added to wash, and obtained solution was separated to obtain an organic layer. To the obtained organic layer, 631 parts of ion-exchanged water was further added to wash with water, and separated to obtain an organic layer. This washing with water operation was repeated three times. The obtained organic layer was concentrated to obtain a concentrate. To the concentrate, 500 parts of n-heptane was added, stirred, filtrated and dried, whereby giving 195 parts of the compound (II-183-c).

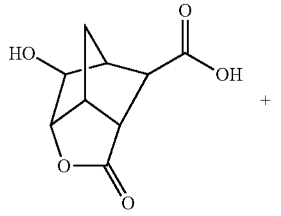

(II-183-b)

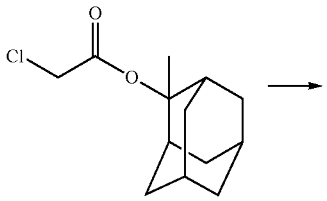

(II-183-c)

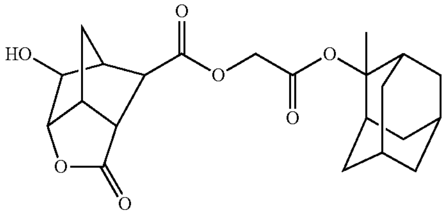

(II-183-d)

10.20 parts of a compound represented by the formula (II-183-b) and 102.05 parts of N,N'-dimethylformamide were charged, and stirred at room temperature to dissolve the compound represented by the formula (II-183-b). 3.56 parts of potassium carbonate and 0.89 parts of potassium iodide were added to the obtained mixture, the obtained mixture was elevated temperature to 50° C., stirred for 1 hour, and elevated temperature to 100° C. The obtained mixture, a solution in which 12.50 parts of a compound represented by the formula (II-183-c) was dissolved in 37.50 parts of N,N'-dimethylformamide was added in the form of drops thereto over 1 hour, and the mixture was stirred for 3 hours at 100° C. The obtained mixture was cooled to room temperature, 333.40 parts of ethyl acetate and 166.70 parts of ion-exchanged water were added thereto, stirred, and separated to obtain an organic layer. 83.35 parts of 5% potassium carbonate was added thereto, and separated to collect an organic layer. To the obtained organic layer, 166.70 past of ion-exchanged water was added to wash with water, and separated to collect an organic layer. This washing with water operation was repeated five times. To obtained organic layer, 1 part of magnesium sulfate was added stirred, and filtrate to obtain an organic layer. The obtained organic layer was concentrated to obtain a concentrate. 55.5 parts of n-heptane was added to the obtained concentrate, stirred for 1 hour at room temperature, filtrated and dried, whereby giving 16.80 parts of a compound (II-183-d).

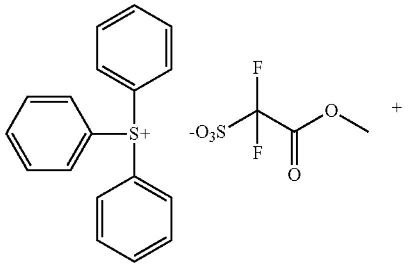

(II-183-e)

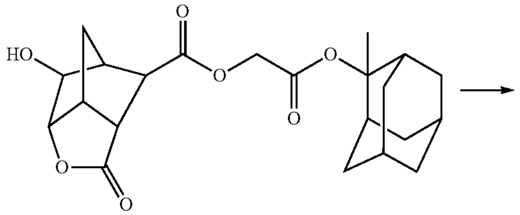

(II-183-d)

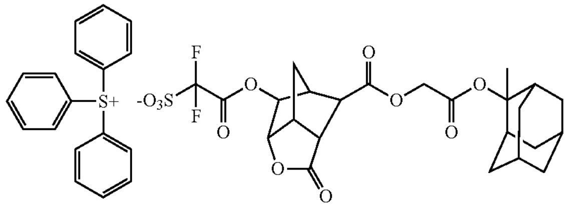

(II-183)

A salt represented by the formula (II-183-e) was synthesized by the method described in JP2008-13551A. 4.52 parts of the salt represented by the formula (II-183-e), 30.00 parts of the chloroform, 4.44 parts of the compound represented by the formula (II-183-d), 5.00 parts of molecular sieve (Trade name: molecular sieve 4A, Wako Pure Chemical Industries, Ltd.) and 0.14 parts of lithium amide were charged, heated to reflux for 5 hours at 80° C., and filtrated. To the obtained filtrate, 0.28 parts of oxalic acid and 7.50 parts of ion-exchanged water were added, stirred, and separated to obtain an organic layer. The obtained organic layer was washed with water for six times. To the obtained organic layer, 1 part of activated carbon was added, and the mixture was stirred for 30 minutes at 23° C., and filtrated. The filtrate was concentrated to obtain a concentrate, to this concentrate, 7.00 parts of acetonitrile was mixed to dissolve, and concentrated. To the obtained residue, 10 parts of ethyl acetate was added, stirred, and remove a supernatant. To the obtained residue, 10 parts of tert-butyl methyl ether was added, stirred, and remove a supernatant. The obtained residue was dissolved in chloroform, and the obtained residue was concentrated to obtain 0.89 parts of the salt represented by the formula (II-183) as oil.

MS (ESI(+) Spectrum): $M^+$ 263.1

MS (ESI(−) Spectrum): $M^-$ 561.1

Synthesis Example 7

Synthesis of a Salt Represented by the Formula (II-167)

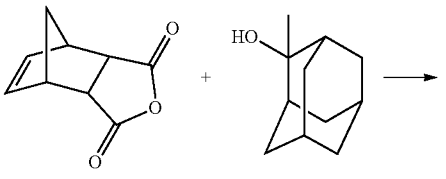

(II-167-a)

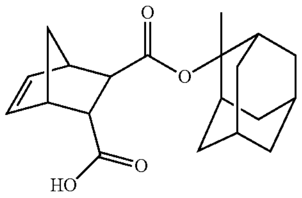

(II-167-b)

16.42 parts of the compound (II-167-a) (5-norbornene-2, 3-dicariboxylic acid anhydride, Wako Pure Chemical Industries, Ltd.) and 53.29 parts of tetrahydrofuran were charged, stirred at 23° C. to dissolved. To the obtained mixture, 2.44 parts of amino pyridine was added at 23° C., and stirred. To the obtained mixture, 2.44 parts of dimethylamino pyridine was added at 23° C., and stirred for 30 minutes at 50° C. To the obtained mixture, a mixture of 16.63 parts of 2-methyl-2-adamantanol and 53.29 parts of tetrahydrofuran was added in the form of drops over 1 hour, and stirred for 10 hours at 50° C. To the obtained mixture, 30 past of ion-exchanged water and 60 parts of ethyl acetate were added to wash, and separated to collect an organic layer. To the obtained organic layer, 30 past of ion-exchanged was added to wash, and separated to collect an organic layer. This washing with water operation was repeated three times. The obtained organic layer was concentrated to obtain a concentrate. The concentrate was column-fractionated under the condition below, whereby giving 25.2 parts of the compound (II-167-b).

Developing medium: silica gel 60, 200 mesh (Merck & Co., Inc.)

Developing solvent: n-heptane/ethyl acetate=20/1 (bulk ratio)

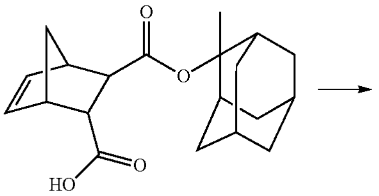

(II-167-b)

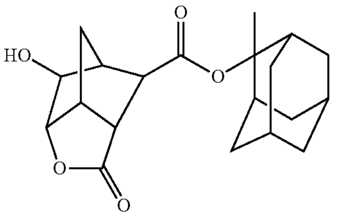

(II-167-c)

16.50 parts of the compound represented by the formula (II-167-b) and 200.00 parts of chloroform were charged, and stirred at 23° C. to dissolve the compound represented by the formula (II-167-b). 17.30 parts of m-chloroperbenzoic acid was added thereto at 23° C., and stirred for 6 hours at 23° C. To the obtained mixture, 60 parts of ethyl acetate and 30 parts of ion-exchanged water were added to wash, and separated to obtain an organic layer. To the obtained organic layer, 30 pasts of ion-exchanged water was added to wash with water, and separated to collect an organic layer. This washing with water operation was repeated three times. The obtained organic layer was concentrated to obtain a concentrate. The concentrate was column-fractionated under the condition below, whereby giving 14.7 parts of the compound (II-167-c).

Developing medium: silica gel 60, 200 mesh (Merck & Co., Inc.)

Developing solvent: n-heptane/ethyl acetate=20/1 (bulk ratio)

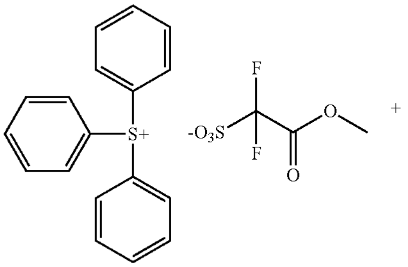

(II-167-d)

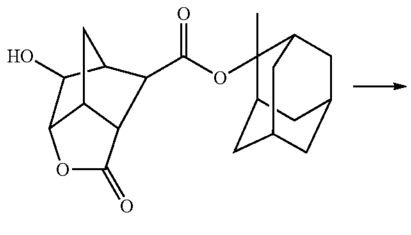

(II-167-c)

-continued

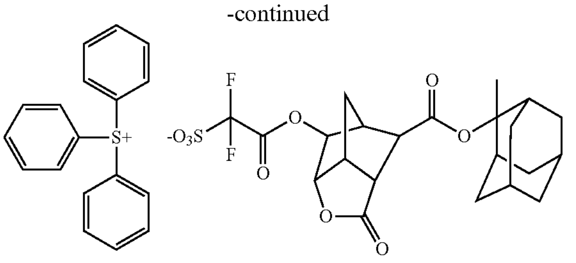

(II-167)

The salt represented by the formula (II-167-d) was synthesized by the method described in JP2008-13551A. 4.52 parts of the salt represented by the formula (II-167-d), 30.00 parts of the chloroform, 3.81 parts of the compound represented by the formula (II-167-c), 5.00 parts of molecular sieve (Trade name: molecular sieve 4A, Wako Pure Chemical Industries, Ltd.) and 0.14 parts of lithium amide were charged, heated to reflux for 5 hours at 80° C., and filtrated. To the obtained filtrate, 0.28 parts of oxalic acid and 7.50 parts of ion-exchanged water were added, stirred, and separated to obtain an organic layer. The obtained organic layer was washed with water for six times. To the obtained organic layer, 1 part of activated carbon was added, and the mixture was stirred for 30 minutes at 23° C., and filtrated. The filtrate was concentrated to obtain a concentrate, to this concentrate, 7.00 parts of acetonitrile was mixed to dissolve, and concentrated. To the obtained residue, 10 parts of ethyl acetate was added, stirred, and remove a supernatant. To the obtained residue, 10 parts of tert-butyl methyl ether was added, stirred, and remove a supernatant. The obtained residue was dissolved in chloroform, and the obtained residue was concentrated to obtain 1.12 parts of the salt represented by the formula (II-167) as oil.

MS (ESI(+) Spectrum): $M^+$ 263.1

MS (ESI(−) Spectrum): $M^-$ 503.1

Synthesis Example 8

Synthesis of a Salt Represented by the Formula (II-9)

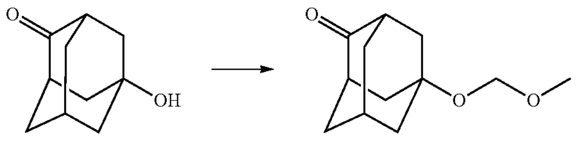

(II-9-a) (II-9-b)

Into a flask provided with a thermometer and a stirrer, 5.78 parts of sodium hydride and 15.00 parts of tetrahydrofuran were charged, and stirred for 30 minutes at 0° C. To the obtained mixture, a mixed solution of 11.00 parts of a compound represented by the formula (II-9-a) and 40.00 parts of tetrahydrofuran was added at 0° C. over 2 hours, and stirred for 1 hour at 0° C. To the obtained mixture, 8.50 parts of methoxymethylchloride was added at 0° C. over 40 minutes, and stirred for 2 hours at 0° C. To the obtained mixture, 55.00 past of ion-exchanged water and 220.00 parts of ethyl acetate were added, and separated to collect an organic layer. To the obtained organic layer, 55.00 past of ion-exchanged was added, and separated to collect an organic layer, whereby giving 14.03 parts of a compound represented by the formula (II-9-b).

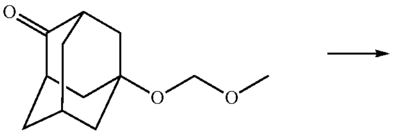

(II-9-b)

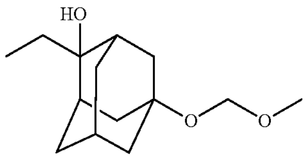

(II-9-c)

Into a flask provided with a thermometer and a stirrer, 6.00 parts of tetrahydrofuran, 1.67 parts of lithium chloride and 0.41 parts of zinc chloride were charged, and stirred at room temperature for 30 minutes. To the obtained mixture, 40.76 ml of ethyl magnesium chloride was added at 23° C. over 1 hour, cooled to 0° C., and to the obtained mixture, a solution of 6.00 parts of a compound represented by the formula (II-9-b) and 12.00 parts of tetrahydrofuran was added over 1 hour, and stirred at 0° C. for 30 minutes. To the obtained mixture, 1.60 parts of acetic acid was added, and stirred for 30 minutes. The obtained mixture was concentrated to obtain a concentrate. To the concentrate, 36.00 parts of ethyl acetate and 12.00 parts of saturated ammonium chloride solution were added, and separated to obtain an organic layer. To the obtained organic layer, 12.00 pasts of ion-exchanged water was added, and separated to collect an organic layer. This washing with water operation was repeated three times. To obtained organic layer, 1 part of magnesium sulfate was added, stirred, and filtrate to obtain an organic layer. The obtained organic layer was concentrated to obtain a concentrate. The concentrate was column-fractionated under the condition below, whereby giving 5.00 parts of the compound (II-9-c).

Developing medium: silica gel 60, 200 mesh (Merck & Co., Inc.)

Developing solvent: n-heptane/ethyl acetate=1/1 (bulk ratio)

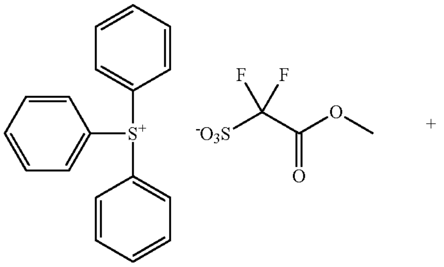

(II-9-d)

-continued

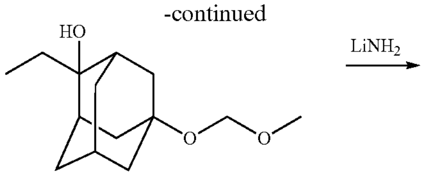

(II-9-c)

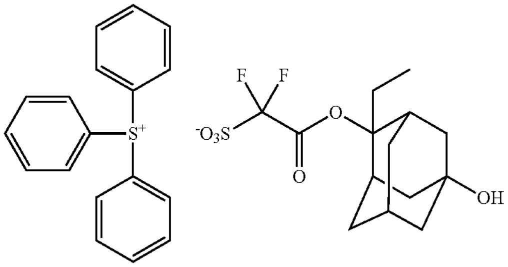

(II-9)

The salt represented by the formula (II-9-d) was synthesized by the method described in JP2008-13551A. 5.00 parts of the salt represented by the formula (II-9-d), 30.00 parts of the chloroform, 3.12 parts of the compound represented by the formula (II-9-c), 7.00 parts of molecular sieve (Trade name: molecular sieve 4A, Wako Pure Chemical Industries, Ltd.) and 0.14 parts of lithium amide were charged, heated to reflux for 2 hours at 80° C., and filtrated. To the obtained filtrate, 0.28 parts of oxalic acid and 7.50 parts of ion-exchanged water were added, stirred, and separated to obtain an organic layer. To the obtained organic layer, 0.10 parts of hydrochloride and 9.06 parts of ion-exchanged water were added, and the mixture was stirred for 1 hour at 50° C., and separated to obtain an organic layer. To the obtained organic layer, 10 parts of ion-exchanged water were added, and the mixture was stirred, and separated to obtain an organic layer. The obtained organic layer was washed with water for six times. To the obtained organic layer, 1 part of activated carbon was added, and the mixture was stirred for 30 minutes at 23° C., and filtrated. The filtrate was concentrated to obtain a concentrate, to this concentrate, 5.00 parts of acetonitrile was mixed to dissolve, and concentrated. To the obtained residue, 10 parts of ethyl acetate was added, stirred, and remove a supernatant. To the obtained residue, 10 parts of tert-butyl methyl ether was added, stirred, and remove a supernatant. The obtained residue was dissolved in chloroform, and the obtained residue was concentrated to obtain 0.18 parts of the salt represented by the formula (II-9).

MS (ESI(+) Spectrum): $M^+$ 263.1

MS (ESI(−) Spectrum): $M^-$ 353.1

Synthesis Example 9

Synthesis of a Salt Represented by the Formula (II-1)

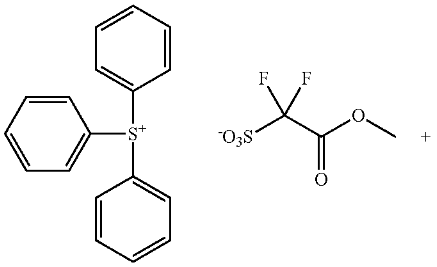

(II-1-a)

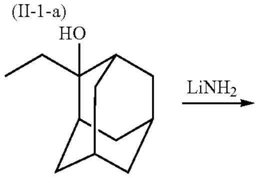

(II-1-b)

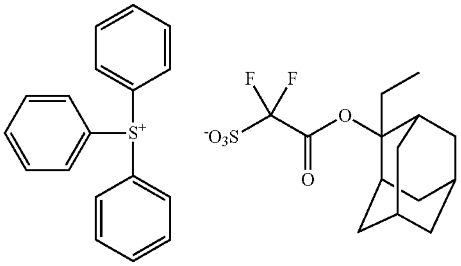

(II-1)

A salt represented by the formula (II-1-a) was synthesized by the method described in JP2008-13551A. 5.00 parts of the salt represented by the formula (II-1-a), 30.00 parts of the chloroform, 2.31 parts of the compound represented by the formula (II-1-b), 7.00 parts of molecular sieve (Trade name: molecular sieve 4A, Wako Pure Chemical Industries, Ltd.) and 0.14 parts of lithium amide were charged, heated to reflux for 2 hours at 80° C., and filtrated. To the obtained filtrate, 0.28 parts of oxalic acid and 7.50 parts of ion-exchanged water were added, stirred, and separated to obtain an organic layer. To the obtained organic layer, 10 parts of ion-exchanged water were added, and the mixture was stirred, and separated to obtain an organic layer. The obtained organic layer was washed with water for six times. To the obtained organic layer, 1 part of activated carbon was added, and the mixture was stirred for 30 minutes at 23° C., and filtrated. The filtrate was concentrated to obtain a concentrate, to this concentrate, 5.00 parts of acetonitrile was mixed to dissolve, and concentrated. To the obtained concentrate, 10 parts of ethyl acetate was added, stirred, and remove a supernatant. To the obtained residue, 10 parts of tert-butyl methyl ether was added, stirred, and remove a supernatant. The obtained residue was dissolved in chloroform, and the obtained residue was concentrated to obtain 0.24 parts of the salt represented by the formula (II-1).

MS (ESI(+) Spectrum): $M^+$ 263.1

MS (ESI(−) Spectrum): $M^-$ 337.1

Synthesis Example 10

Synthesis of Compound Represented by the Formula (K)

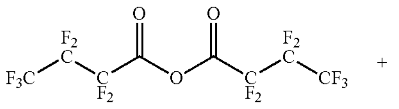

(K-1)

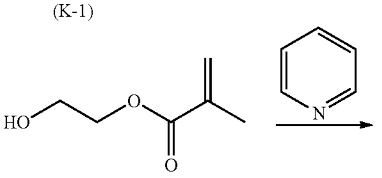

(K-2)

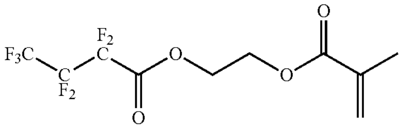

(K)

10.00 parts of a compound (K-2), 40.00 parts of tetrahydrofuran and 7.29 parts of pyridine were mixed, and stirred for 30 minutes at 23° C. The obtained mixture was cooled to 0° C. To this mixture was added 33.08 parts of a compound (K-1) over 1 hour while maintaining at the same temperature. The temperature of the mixture was then elevated to about 23° C., and the mixture was stirred for 3 hour at the same temperature. To the obtained reactant, 361.51 parts of ethyl acetate and 20.19 parts of 5% of hydrochloric acid solution was added to obtain a mixture, the mixture was stirred for 30 minutes at 23° C. The obtained solution was allowed to stand, and then separated to recover an organic layer. To the recovered organic layer, 81.42 parts of a saturated sodium hydrogen carbonate was added, and the obtained solution was stirred for 30 minutes at 23° C., allowed to stand, and then separated to recover the organic layer. To the recovered organic layer was added 90.38 parts of ion-exchanged water, and the obtained solution was stirred for 30 minutes at 23° C., allowed to stand, and then separated to wash the organic layer with water. These washing operations were repeated for 5 times. The obtained organic layer was concentrated, resulting in 23.40 parts of the compound (K).

MS (mass spectroscopy): 326.0 (molecular peak)

Synthesis Example 11

Synthesis of Compound Represented by the Formula (H)

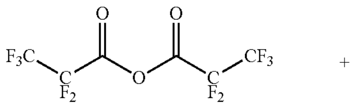

(H-1)

-continued

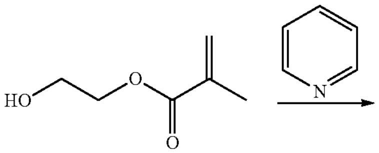

(H-2)

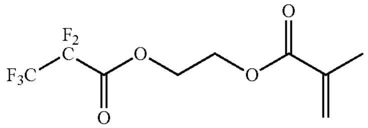

(H)

88.00 parts of a compound (H-2), 616.00 parts of methyl isobutyl ketone and 60.98 parts of pyridine were mixed, and stirred for 30 minutes at 23° C. The obtained mixture was cooled to 0° C. To this mixture was added 199.17 parts of a compound (H-1) over 1 hour while maintaining at the same temperature. The temperature of the mixture was then elevated to about 10° C., and the mixture was stirred for 1 hour at the same temperature. Thus obtained reactant was added to 1446.22 parts of n-heptane and 703.41 parts of 2% of hydrochloric acid solution to obtain a mixture, the mixture was stirred for 30 minutes at 23° C. The obtained solution was allowed to stand, and then separated to recover an organic layer. To the recovered organic layer, 337.64 parts of 2% of hydrochloric acid solution was added to obtain a mixture, and the mixture was stirred for 30 minutes at 23° C. The obtained solution was allowed to stand, and then separated to recover an organic layer. To the recovered organic layer, 361.56 parts of ion-exchanged water was added, and the obtained solution was stirred for 30 minutes at 23° C., allowed to stand, and then separated to wash the organic layer with water. To the obtained organic layer, 443.92 parts of 10% of potassium carbonate was added, and the obtained solution was stirred for 30 minutes at 23° C., allowed to stand, and then separated to recover the organic layer. These washing operations were repeated for 2 times. To the obtained organic layer, 361.56 parts of ion-exchanged water was added, and the obtained solution was stirred for 30 minutes at 23° C., allowed to stand, and then separated to wash the organic layer with water. These washing operations were repeated for 5 times. The obtained organic layer was concentrated, resulting in 163.65 parts of the compound (H).

MS (mass spectroscopy): 276.0 (molecular ion peak)

Synthesis Example 12

Synthesis of Compound Represented by the Formula (L)

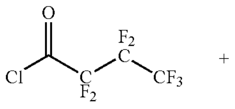

(L-1)

-continued

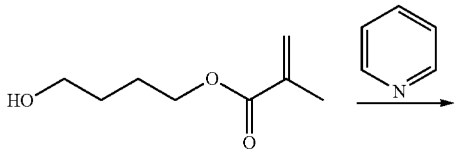

(L-2)

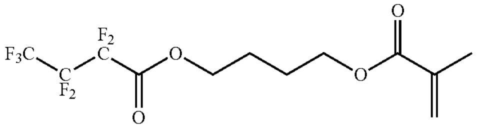

(L)

30.00 parts of a compound (L-2), 210.00 parts of methyl isobutyl ketone and 18.00 parts of pyridine were mixed, and stirred for 30 minutes at 23° C. The obtained mixture was cooled to 0° C. To this mixture was added 48.50 parts of a compound (L-1) over 1 hour while maintaining at the same temperature. The temperature of the mixture was then elevated to about 5° C., and the mixture was stirred for 1 hour at the same temperature. To the obtained reactant, 630 parts of ethyl acetate, 99.68 parts of 5% of hydrochloric acid solution and 126 parts of ion-exchanged water was added to obtain a mixture, the mixture was stirred for 30 minutes at 23° C. The obtained solution was allowed to stand, and then separated to recover an organic layer. To the recovered organic layer, 86.50 parts of 10% of potassium carbonate solution was added to obtain a mixture, and the mixture was stirred for 30 minutes at 23° C. The obtained solution was allowed to stand, and then separated to recover an organic layer. These washing operations were repeated for two times. To the recovered organic layer, 157.50 parts of ion-exchanged water was added, and the obtained solution was stirred for 30 minutes at 23° C., allowed to stand, and then separated to wash the organic layer with water. These washing operations were repeated for five times. The obtained organic layer was concentrated, resulting in 27.61 parts of the compound (L).

MS (mass spectroscopy): 354.1 (molecular ion peak)

Synthesis Example 13

Synthesis of Compound Represented by the Formula (M)

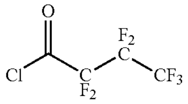

(M-1)

+

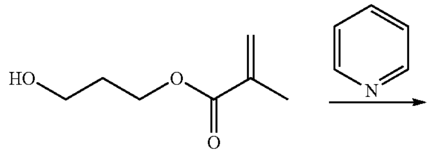

(M-2)

-continued

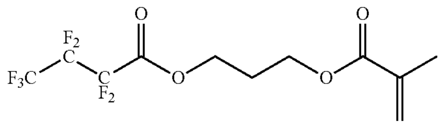

(M)

27.34 parts of a compound (M-2), 190.00 parts of methyl isobutyl ketone and 18.00 parts of pyridine were mixed, and stirred for 30 minutes at 23° C. The obtained mixture was cooled to 0° C. To this mixture was added 48.50 parts of a compound (M-1) over 1 hour while maintaining at the same temperature. The temperature of the mixture was then elevated to about 5° C., and the mixture was stirred for 1 hour at the same temperature. Thus obtained reactant was added to 570 parts of ethyl acetate, 99.68 parts of 5% of hydrochloric acid solution and 126 parts of ion-exchanged water to obtain a mixture, the mixture was stirred for 30 minutes at 23° C. The obtained solution was allowed to stand, and then separated to recover an organic layer. To the recovered organic layer, 86.50 parts of 10% of potassium carbonate solution was added to obtain a mixture, and the mixture was stirred for 30 minutes at 23° C. The obtained solution was allowed to stand, and then separated to recover an organic layer. These washing operations were repeated for two times. To the recovered organic layer, 150 parts of ion-exchanged water was added, and the obtained solution was stirred for 30 minutes at 23° C., allowed to stand, and then separated to wash the organic layer with water. These washing operations were repeated for five times. The obtained organic layer was concentrated, resulting in 23.89 parts of the compound (M).

MS (mass spectroscopy): 340.1 (molecular ion peak)

Synthetic Example of the Resin

The monomers used the synthesis of the resin are shown below.

(A)

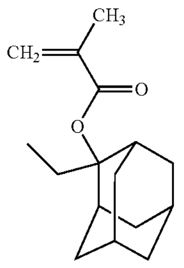

(B)

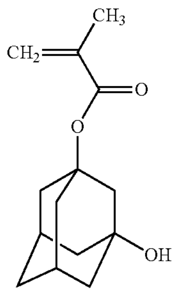

-continued
(C)
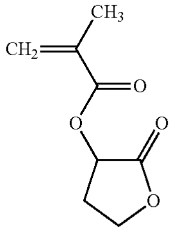
(D)
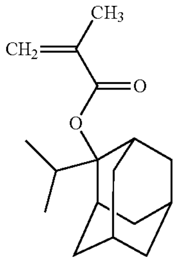
(E)
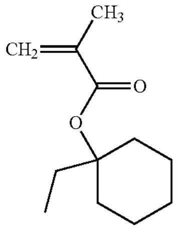
(F)
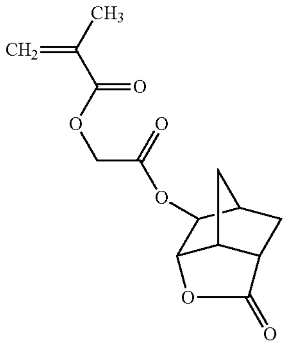
(G)
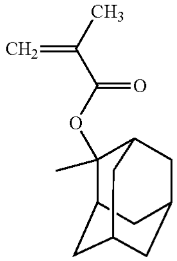
-continued
(H)
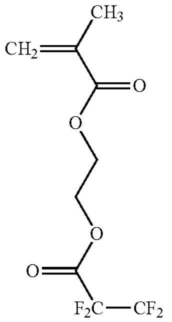
(I)
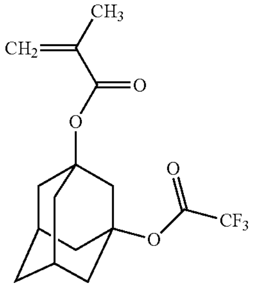
(J)
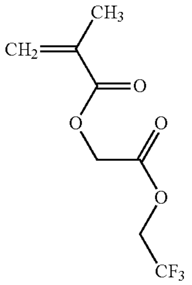
(K)
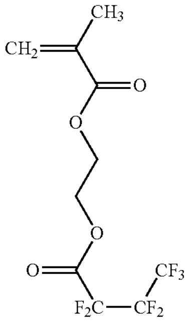
(L)
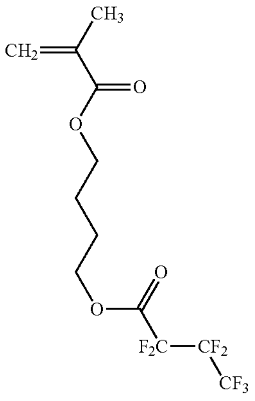

-continued (M)

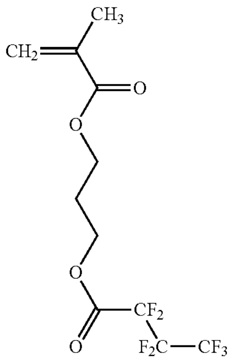

(N)

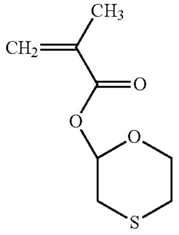

Synthetic Example 14

Synthesis of Resin A1-1

Monomer (H) was used, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 77% yield of copolymer having a weight average molecular weight of about 18000. This copolymer, which had the structural units of the following formula, was referred to Resin A1-1.

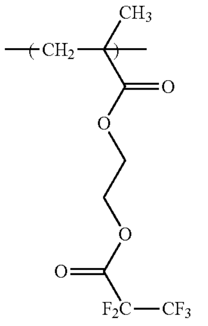

Synthetic Example 15

Synthesis of Resin A1-2

Monomer (K) and monomer (I) were mixed together with a mole ratio of Monomer (K):monomer (I)=90:10, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 72° C. After that, the obtained reacted mixture was poured into a large amount of n-heptane to precipitate a resin. The obtained resin was filtrated, resulting in a 70% yield of copolymer having a weight average molecular weight of about 13000. This copolymer, which had the structural units of the following formula, was referred to Resin A1-2.

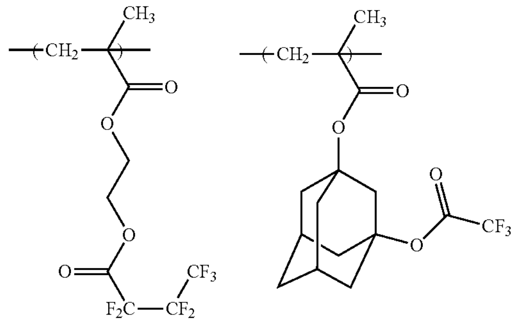

Synthetic Example 16

Synthesis of Resin A1-3

Monomer (L) was used, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 73% yield of copolymer having a weight average molecular weight of about 19000. This copolymer, which had the structural units of the following formula, was referred to Resin A1-3.

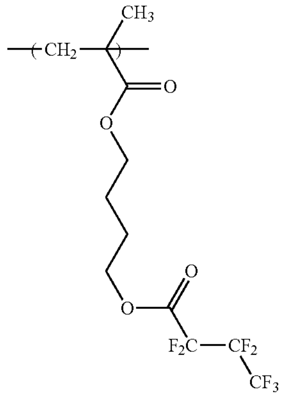

Synthetic Example 17

Synthesis of Resin A1-4

Monomer (M) was used, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 76% yield of copolymer having a weight average molecular weight of about 18000. This copolymer, which had the structural units of the following formula, was referred to Resin A1-4.

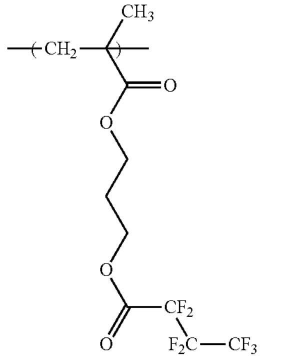

Synthetic Example 18

Synthesis of Resin A2-1

Monomer (D), monomer (E), monomer (B), monomer (C) and monomer (F) were mixed together with a mole ratio of monomer (D):monomer (E):monomer (B):monomer (C): monomer (F)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 73° C. After that, the obtained reacted mixture was poured into a mixture of a large amount of methanol and water (methanol: water=4:1, weight ratio) to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 65% yield of copolymer having a weight average molecular weight of about 8100. This copolymer, which had the structural units of the following formula, was referred to Resin A2-1.

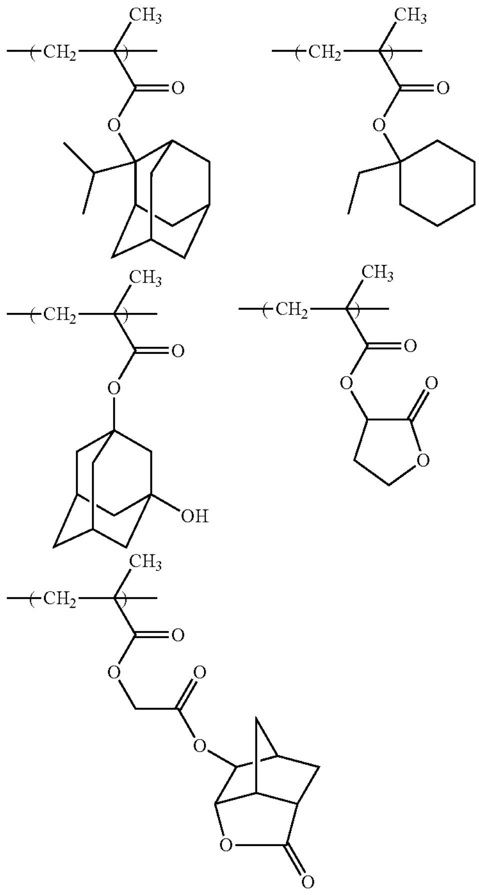

Synthetic Example 19

Synthesis of Resin A2-2

Monomer (A), monomer (E), monomer (B), monomer (C) and monomer (F) were mixed together with a mole ratio of monomer (A):monomer (E):monomer (B):monomer (C): monomer (F)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 73°

C. After that, the obtained reacted mixture was poured into a mixture of a large amount of methanol and water (methanol: water=4:1, weight ratio) to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated three times, resulting in a 68% yield of copolymer having a weight average molecular weight of about 7800. This copolymer, which had the structural units of the following formula, was referred to Resin A2-2.

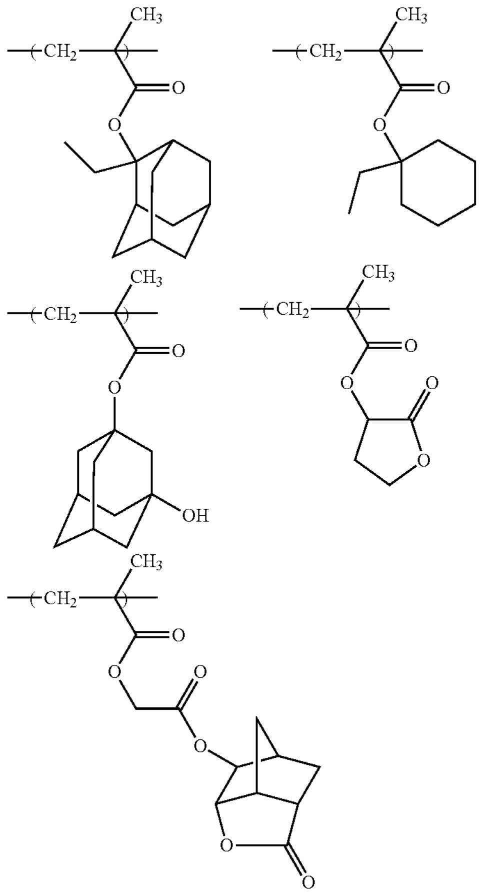

Synthetic Example 20

Synthesis of Resin A2-3

Monomer (A), monomer (B) and monomer (C) were mixed together with a mole ratio of monomer (A):monomer (B): monomer (C)=50:25:25, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 8 hours at 80° C. After that, the obtained reacted mixture was poured into a mixture of a large amount of methanol and water (methanol: water=4:1, weight ratio) to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated three times, resulting in a 60% yield of copolymer having a weight average molecular weight of about 9200. This copolymer, which had the structural units of the following formula, was referred to Resin A2-3.

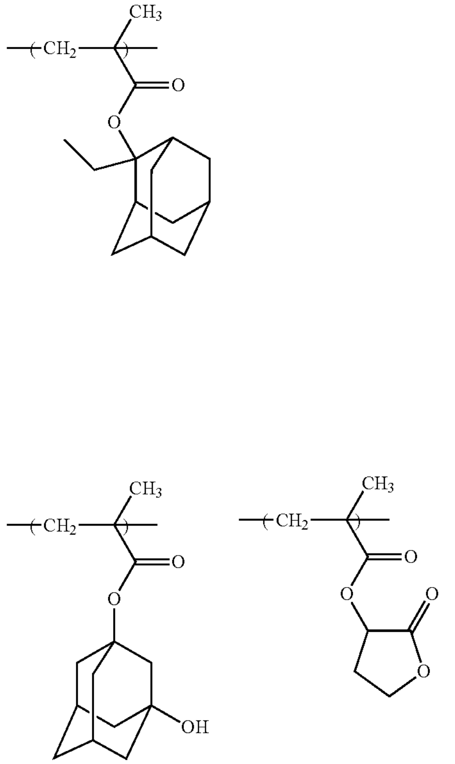

Synthetic Example 21

Synthesis of Resin A2-4

Monomer (A), monomer (E), monomer (B), monomer (F) and monomer (C) were mixed together with a mole ratio of monomer (A):monomer (E):monomer (B):monomer (F): monomer (C)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 78% yield of copolymer having a weight average molecular weight of about 7200. This copolymer, which had the structural units of the following formula, was referred to Resin A2-4.

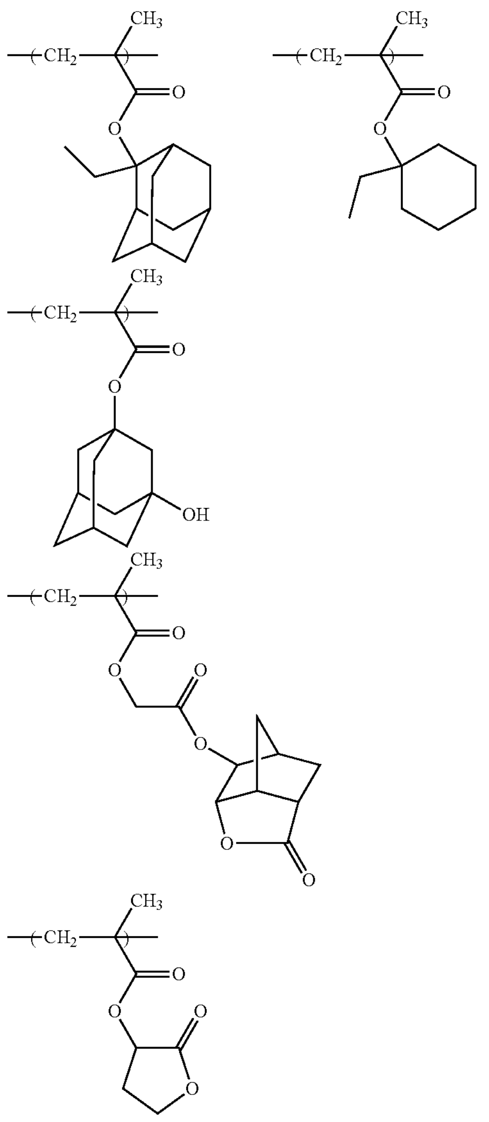

Synthetic Example 22

Synthesis of Resin A2-5

Monomer (A), monomer (N), monomer (B), monomer (F) and monomer (C) were mixed together with a mole ratio of monomer (A):monomer (N):monomer (B):monomer (F): monomer (C)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 78% yield of copolymer having a weight average molecular weight of about 7200. This copolymer, which had the structural units of the following formula, was referred to Resin A2-5.

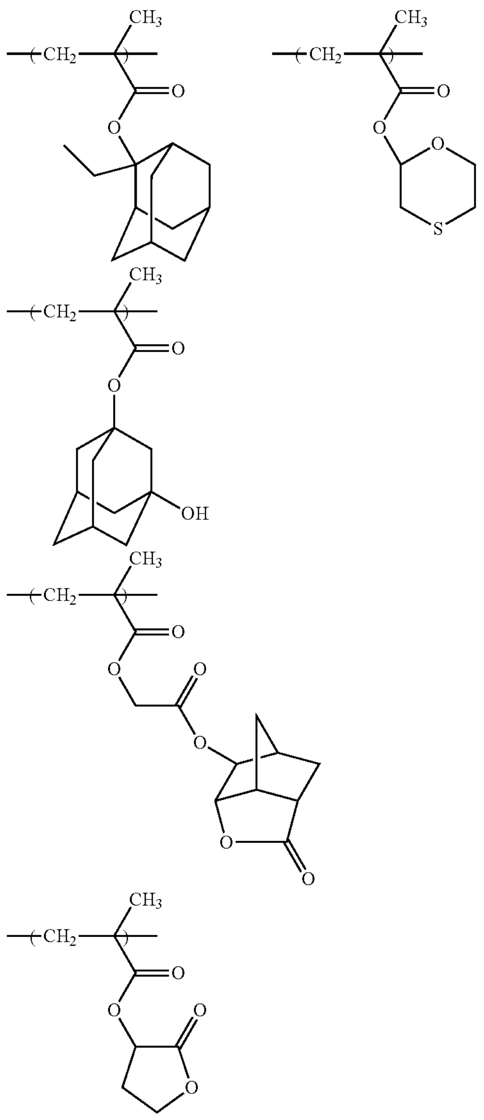

Synthetic Example 23

Synthesis of Resin X1

Monomer (G), monomer (C) and monomer (B) were mixed together with a mole ratio of monomer (G):monomer (C): monomer (B)=35:45:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated 2 times, resulting in a 75% yield of copolymer having a weight average molecular weight of about 7000. This copolymer, which had the structural units of the following formula, was referred to Resin X1. The mole ratio of each structural unit is structural unit (G):structural unit (C):structural unit (B)=34.7:45.4:19.9.

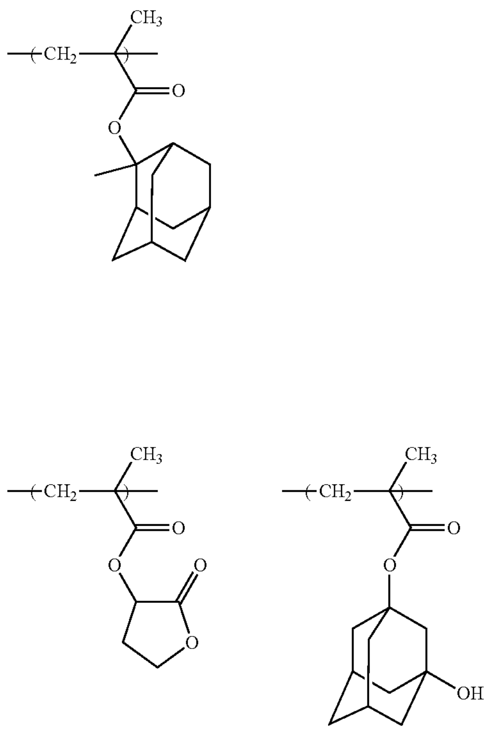

Synthetic Example 24

Synthesis of Resin X2

Monomer (J) and monomer (G) were mixed together with a mole ratio of monomer (J):monomer (G)=80:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.5 mol % and 1.5 mol % respectively with respect to the entire amount of monomers, and the resultant mixture was heated for about 5 hours at 70° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, resulting in a 70% yield of copolymer having a weight average molecular weight of about 28000. This copolymer, which had the structural units of the following formula, was referred to Resin X2. The mole ratio of each structural unit is structural unit (J):structural unit (G)=80.2:19.8.

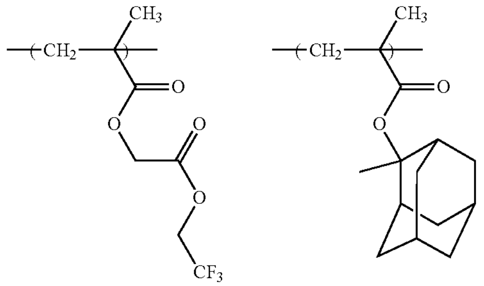

(Preparing Resist Composition)

Resist compositions were prepared by mixing and dissolving each of the components shown in Table 1, and then filtrating through a fluororesin filter having 0.2 μm pore diameter.

TABLE 8

| Ex. | Resin | Acid Generator | Basic Compound | (Unit: parts) BP/PEB (° C./° C.) |
|---|---|---|---|---|
| 1 | A1-1/A2-1 = 0.7/10 | II-33 = 1.4 | C1 = 0.07 | 95/85 |
| 2 | A1-1/A2-2 = 0.7/10 | II-33 = 1.4 | C1 = 0.07 | 110/105 |
| 3 | A1-2/A2-1 = 0.3/10 | II-33 = 1.4 | C1 = 0.07 | 95/85 |
| 4 | A1-2/A2-2 = 0.3/10 | II-33 = 1.4 | C1 = 0.07 | 110/105 |
| 5 | A1-1/A2-1 = 0.7/10 | II-9 = 1.4 | C1 = 0.07 | 95/85 |
| 6 | A1-1/A2-1 = 0.7/10 | II-1 = 1.4 | C1 = 0.07 | 95/85 |
| 7 | A1-1/A2-1 = 0.7/10 | II-4 = 1.4 | C1 = 0.07 | 95/85 |
| 8 | A1-1/A2-1 = 0.7/10 | II-5 = 1.4 | C1 = 0.07 | 95/85 |
| 9 | A1-1/A2-1 = 0.7/10 | II-33/Y1 = 0.7/0.7 | C1 = 0.07 | 95/85 |
| 10 | A1-1/A2-3 = 0.7/10 | II-33 = 1.4 | C1 = 0.07 | 110/105 |
| 11 | A1-1/A2-4 = 0.7/10 | II-33 = 1.4 | C1 = 0.07 | 110/105 |
| 12 | A1-1/A2-5 = 0.7/10 | II-33 = 1.4 | C1 = 0.07 | 110/105 |
| 13 | A1-3/A2-5 = 0.7/10 | II-33 = 1.4 | C1 = 0.07 | 110/105 |
| 14 | A1-4/A2-5 = 0.7/10 | II-33 = 1.4 | C1 = 0.07 | 110/105 |
| 15 | A1-1/A2-5 = 0.7/10 | II-9 = 1.4 | C1 = 0.07 | 110/105 |
| 16 | A1-1/A2-5 = 0.7/10 | II-1 = 1.4 | C1 = 0.07 | 110/105 |
| 17 | A1-1/A2-5 = 0.7/10 | II-4 = 1.4 | C1 = 0.07 | 110/105 |
| 18 | A1-1/A2-5 = 0.7/10 | II-5 = 1.4 | C1 = 0.07 | 110/105 |
| 19 | A1-1/A2-5 = 0.7/10 | II-201 = 1.4 | C1 = 0.07 | 110/105 |
| 20 | A1-1/A2-5 = 0.7/10 | II-203 = 1.4 | C1 = 0.07 | 110/105 |
| 21 | A1-1/A2-5 = 0.7/10 | II-215 = 1.4 | C1 = 0.07 | 110/105 |
| 22 | A1-1/A2-5 = 0.7/10 | II-183 = 1.4 | C1 = 0.07 | 110/105 |
| 23 | A1-1/A2-5 = 0.7/10 | II-167 = 1.4 | C1 = 0.07 | 110/105 |
| | | Comparative Ex. | | |
| 1 | X2/X1 = 0.3/10 | Y2/Y3 = 1.0/0.1 | C1 = 0.07 | 110/105 |

<Resin>

Resin prepared by the Synthetic Examples

<Acid Generator>

II-33: this was prepared by a method according to the method described in the Examples of JP2008-69146A

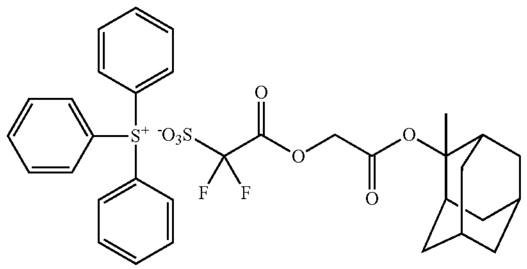

50 mg of this acid generator (II-33) was dissolved in 0.7935 g of bidimethyl sulfoxide, 0.0216 g of 20% bihydrochloric acid was added thereto, and stirred for 1 hour at 100° C. After that, decomposed substance of the acid generator (II-33) was analyzed by $^1$H-NMR. As a result, peaks belonging a carboxy group and vinyl proton was observed.

II-9:

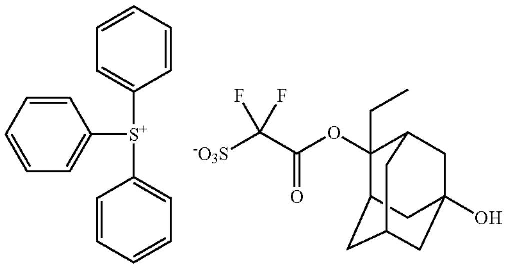

50 mg of this acid generator (II-9) was dissolved in 0.7942 g of bidimethyl sulfoxide, 0.0221 g of 20% bihydrochloric acid was added thereto, and stirred for 1 hour at 100° C. After that, decomposed substance of the acid generator (II-9) was analyzed by $^1$H-NMR. As a result, peaks belonging a carboxy group and vinyl proton was observed.

II-1:

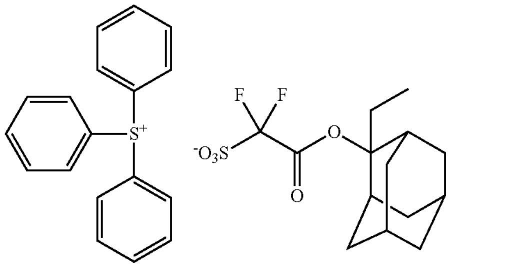

50 mg of this acid generator (II-9) was dissolved in 0.7921 g of bidimethyl sulfoxide, 0.0208 g of 20% bihydrochloric acid was added thereto, and stirred for 1 hour at 100° C. After that, decomposed substance of the acid generator (II-9) was analyzed by $^1$H-NMR. As a result, peaks belonging a carboxy group and vinyl proton was observed.

II-4:

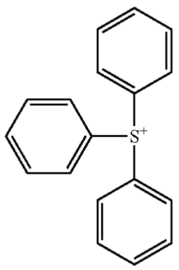

-continued

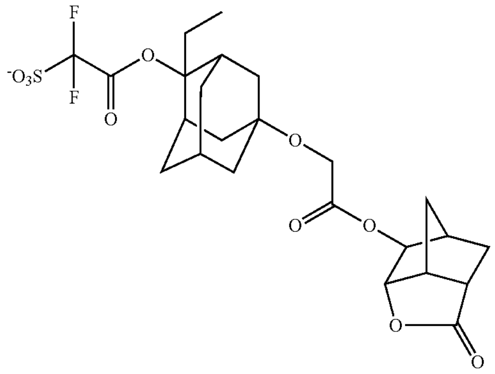

50 mg of this acid generator (II-4) was dissolved in 0.7948 g of bidimethyl sulfoxide, 0.0212 g of 20% bihydrochloric acid was added thereto, and stirred for 1 hour at 100° C. After that, decomposed substance of the acid generator (II-4) was analyzed by $^1$H-NMR. As a result, peaks belonging a carboxy group and vinyl proton was observed.

II-5:

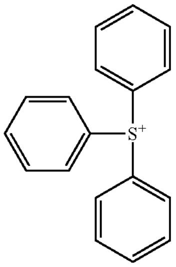

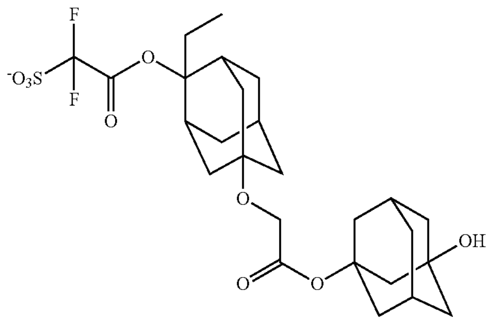

50 mg of this acid generator (II-5) was dissolved in 0.7958 g of bidimethyl sulfoxide, 0.0216 g of 20% bihydrochloric acid was added thereto, and stirred for 1 hour at 100° C. After that, decomposed substance of the acid generator (II-5) was analyzed by $^1$H-NMR. As a result, peaks belonging a carboxy group and vinyl proton was observed.

II-201:

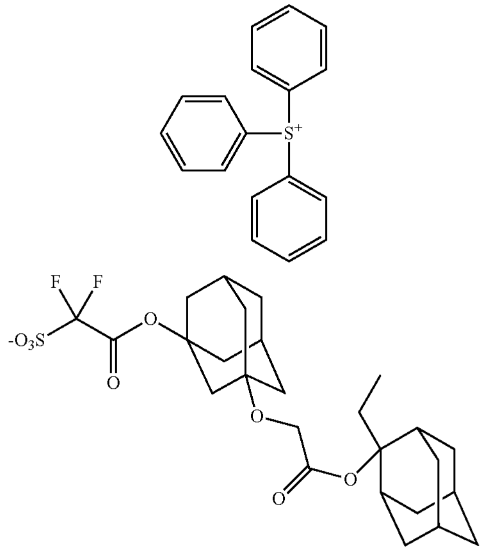

50 mg of this acid generator (II-201) was dissolved in 0.7942 g of bidimethyl sulfoxide, 0.0221 g of 20% bihydrochloric acid was added thereto, and stirred for 1 hour at 100° C. After that, decomposed substance of the acid generator (II-201) was analyzed by $^1$H-NMR. As a result, peaks belonging a carboxy group and vinyl proton was observed.

II-203:

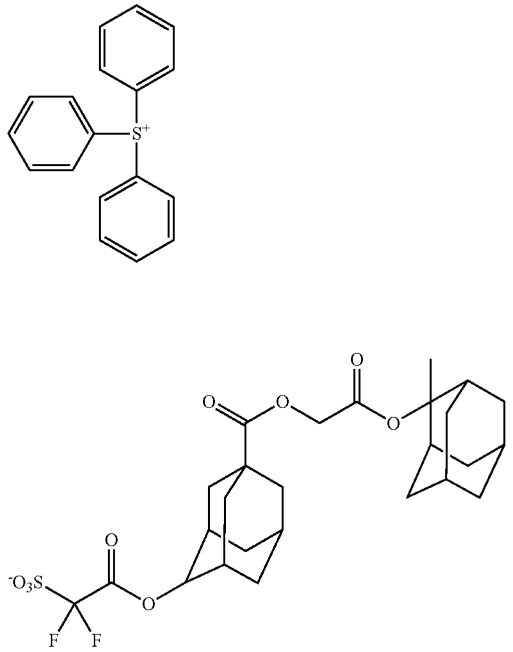

50 mg of this acid generator (II-203) was dissolved in 0.7946 g of bidimethyl sulfoxide, 0.0219 g of 20% bihydrochloric acid was added thereto, and stirred for 1 hour at 100° C. After that, decomposed substance of the acid generator (II-203) was analyzed by $^1$H-NMR. As a result, peaks belonging a carboxy group and vinyl proton was observed.

II-215:

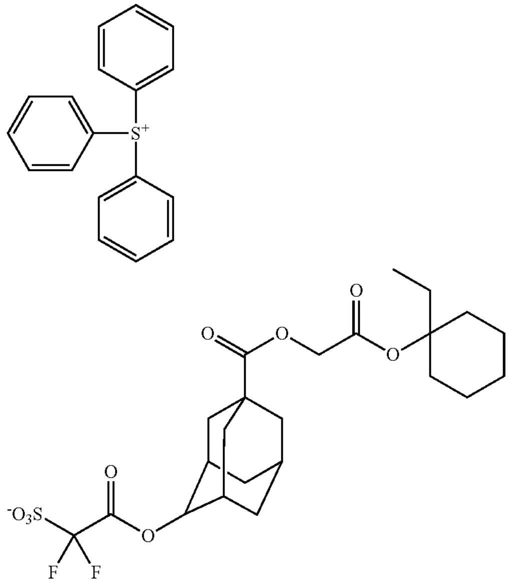

50 mg of this acid generator (II-215) was dissolved in 0.7977 g of bidimethyl sulfoxide, 0.0207 g of 20% bihydrochloric acid was added thereto, and stirred for 1 hour at 100° C. After that, decomposed substance of the acid generator (II-215) was analyzed by $^1$H-NMR. As a result, peaks belonging a carboxy group and vinyl proton was observed.

II-183:

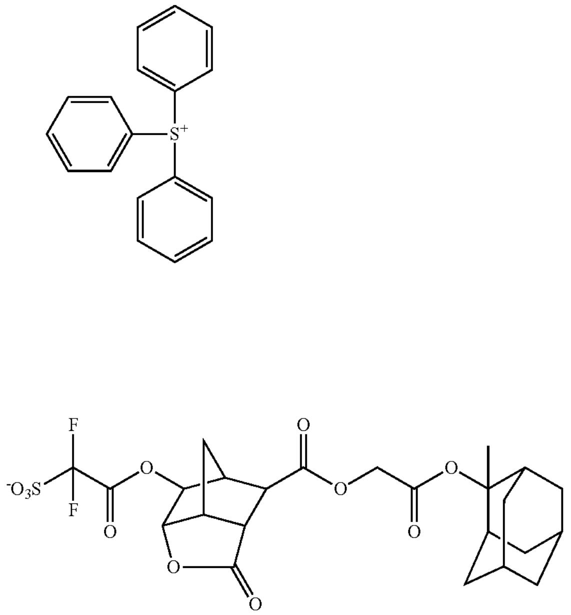

50 mg of this acid generator (II-183) was dissolved in 0.7921 g of bidimethyl sulfoxide, 0.0204 g of 20% bihydrochloric acid was added thereto, and stirred for 1 hour at 100° C. After that, decomposed substance of the acid generator (II-183) was analyzed by $^1$H-NMR. As a result, peaks belonging a carboxy group and vinyl proton was observed.

II-167:

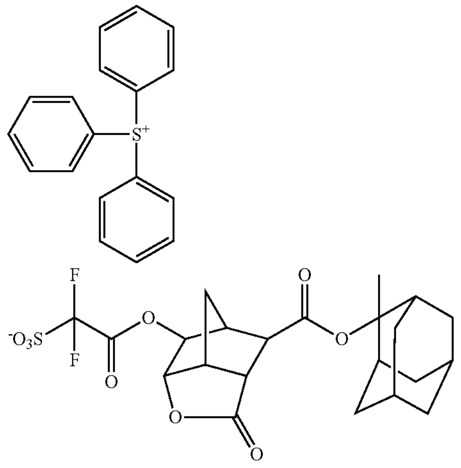

50 mg of this acid generator (II-167) was dissolved in 0.7933 g of bidimethyl sulfoxide, 0.0208 g of 20% bihydrochloric acid was added thereto, and stirred for 1 hour at 100° C. After that, decomposed substance of the acid generator (II-167) was analyzed by $^1$H-NMR. As a result, peaks belonging a carboxy group and vinyl proton was observed.

Y1: this was prepared by a method according to the method described in the Examples of JP2010-152341A

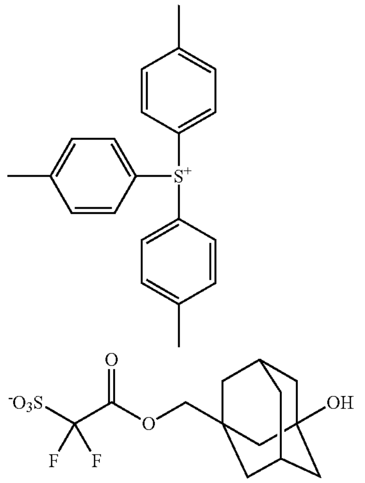

Y2: this was prepared by a method according to the method described in the Examples of WO2008/99869A and JP2010-26478A

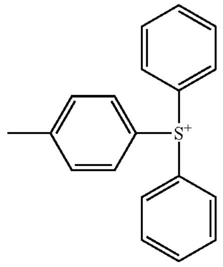

-continued

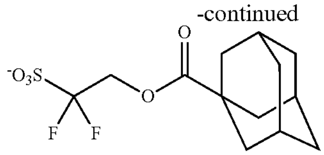

Y3: this was prepared by a method according to the method described in the Examples of JP2005-221721A

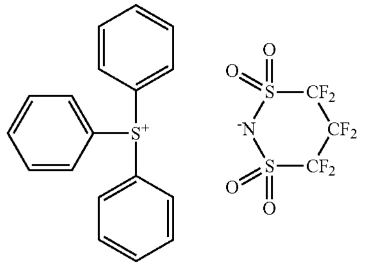

<Basic Compound: Qencher>

C1: 2,6-diisopropylaniline (obtained from Tokyo Chemical Industry Co., LTD)

<Solvent of Resist Composition>

| | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

(Producing Resist Pattern)

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 8.

Line and space patterns were then exposed through stepwise changes in exposure quantity using an ArF excimer stepper for immersion lithography ("XT: 1900Gi" by ASML Ltd.: NA=1.35, 3/4 Annular, X-Y deflection), on the wafers on which the resist film had thus been formed.

The exposure was followed by 60 seconds of post-exposure baking at the temperatures given in the "PEB" column in Table 8.

This was followed by 60 sec of puddle development with 2.38 wt % tetramethylammonium hydroxide aqueous solution.

Effective sensitivity was represented as the exposure amount at which a 50 nm line and space pattern resolved to 1:1 with the each resist film.

(Evaluation of Resolution)

A resist pattern exposed by effective sensitivity was observed with a scanning electron microscope.

a "○○" was given when the resist pattern was resolved with 43 nm line width, a "○" was given when the resist pattern was resolved with 45 nm line width, a "x" was given when the resist pattern did not have much resolution, was resolved but top of the resist pattern was a rounded shape, or a skirt was observed or patter collapse.

Table 9 illustrates the results thereof. The parenthetical number means resolution values.

(Line Edge Roughness (LER) Evaluation)

When the wall surface of the resist pattern following the lithography process was observed using a scanning electron microscope, a "○○" was given if the irregularity in the resist pattern side wall have a roughness width of 4 nm or less, a "○" was given when the roughness width was more than 4 nm and 4.5 nm or less, and an "x" was given when the roughness width was more than 4.5 nm.

Table 9 illustrates the results thereof. The parenthetical number means roughness width values.

(Evaluation of Defects)

The above resist compositions were applied on each of the 12-inch-silicon wafers by spin coating so that the thickness of the resulting film became 150 nm after drying.

The obtained wafers were then pre-baked for 60 seconds on a direct hot plate at the temperatures given in the "PB" column in Table 3 to obtain a composition layer.

The thus obtained wafers with the produced composition layers were rinsed with water for 60 seconds using a developing apparatus (ACT-12, Tokyo electron Co. Ltd.).

Thereafter, the number of defects was counted using a defect inspection apparatus (KLA-2360, KLA-Tencor Co. Ltd.)

Table 9 illustrates the results thereof.

TABLE 9

| | Resolution | LER | Defects |
|---|---|---|---|
| 1 | ○○(42) | ○○(3.28) | 180 |
| 2 | ○○(42) | ○○(3.51) | 210 |
| 3 | ○○(43) | ○○(3.78) | 230 |
| 4 | ○○(43) | ○○(3.96) | 260 |
| 5 | ○○(42) | ○○(3.36) | 220 |
| 6 | ○○(42) | ○○(3.48) | 240 |
| 7 | ○○(42) | ○○(3.26) | 190 |
| 8 | ○○(42) | ○○(3.28) | 230 |
| 9 | ○○(42) | ○○(3.24) | 190 |
| 10 | ○(45) | ○(4.22) | 280 |
| 11 | ○○(42) | ○○(3.33) | 180 |
| 12 | ○○(42) | ○○(3.28) | 160 |
| 13 | ○○(44) | ○○(3.42) | 140 |
| 14 | ○○(43) | ○○(3.35) | 150 |
| 15 | ○○(42) | ○○(3.31) | 140 |
| 16 | ○○(42) | ○○(3.38) | 160 |
| 17 | ○○(42) | ○○(3.24) | 130 |
| 18 | ○○(42) | ○○(3.25) | 150 |
| 19 | ○○(43) | ○○(3.36) | 210 |
| 20 | ○○(43) | ○○(3.35) | 220 |
| 21 | ○○(43) | ○○(3.41) | 250 |
| 22 | ○○(43) | ○○(3.29) | 260 |
| 23 | ○○(43) | ○○(3.24) | 230 |
| Comp. Ex. 1 | x(48) | x(4.78) | 720 |

According to the resist composition of the present invention, it is possible to achieve satisfactory excellent line edge roughness (LER) and resolution and less defects in the obtained resist pattern. Therefore, the present resist composition can be used for semiconductor microfabrication.

What is claimed is:

1. A resist composition comprising (A1) a resin having a structural unit represented by the formula (I), (A2) a resin being insoluble or poorly soluble in alkali aqueous solution, but becoming soluble in an alkali aqueous solution by the action of an acid and (B) an acid generator having an acid-labile group;

(I)

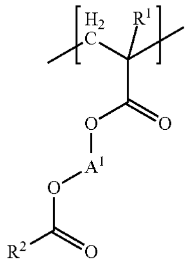

wherein $R^1$ represents a hydrogen atom or a methyl group;

$A^1$ represents a $C_1$ to $C_6$ alkanediyl group;

$R^2$ represents a $C_1$ to $C_{10}$ hydrocarbon group having a fluorine atom.

2. The resist composition according to claim 1, wherein the acid generator (B) is an acid generator represented by the formula (II-0);

(II-0)

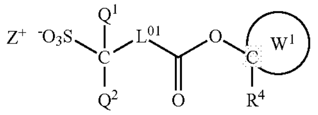

wherein $Q^1$ and $Q^2$ independently represent a fluorine atom or a $C_1$ to $C_6$ perfluoroalkyl group;

$L^{01}$ represents a single bond or an optionally substituted $C_1$ to $C_{20}$ divalent hydrocarbon group, and one or more —$CH_2$— contained in the divalent hydrocarbon group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

3. The resist composition according to claim 1, wherein the acid generator (B) is an acid generator represented by the formula (II);

(II)

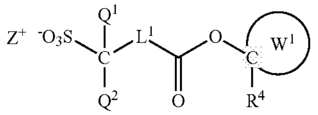

wherein $Q^1$ and $Q^2$ independently represent a fluorine atom or a $C_1$ to $C_6$ perfluoroalkyl group;

$L^1$ represents a single bond or a $C_1$ to $C_{10}$ alkanediyl group, and one or more —$CH_2$— contained in the alkanediyl group may be replaced by —O— or —CO—;

$R^4$ represents a $C_1$ to $C_{12}$ hydrocarbon group;

ring $W^1$ represents an optionally substituted $C_3$ to $C_{18}$ hydrocarbon ring;

$Z^+$ represents an organic cation.

4. The resist composition according to claim 1, wherein $R^2$ in the formula (I) is a $C_1$ to $C_6$ fluorinated alkyl group.

5. The resist composition according to claim 1, wherein $A^1$ in the formula (I) is a $C_2$ to $C_4$ alkanediyl group.

6. The resist composition according to claim 3, wherein $L^1$ in the formula (II) is a single bond or *—CO—O-$L^{11}$, wherein $L^{11}$ represents a $C_1$ to $C_6$ alkanediyl group, * represents a bond to —$CQ^1Q^2$-.

7. The resist composition according to claim 1, which further comprises a solvent.

8. A method for producing resist pattern comprising steps of;

(1) applying the resist composition of claim 1 onto a substrate;

(2) drying the applied composition to form a composition layer;

(3) exposing the composition layer;

(4) heating the exposed composition layer, and (5) developing the heated composition layer.

* * * * *